(12) United States Patent
Ju et al.

(10) Patent No.: US 11,817,504 B2
(45) Date of Patent: Nov. 14, 2023

(54) ISOLATION STRUCTURES AND METHODS OF FORMING THE SAME IN FIELD-EFFECT TRANSISTORS

(71) Applicant: Taiwan Semiconductor Manufacturing Company, Ltd., Hsin-Chu (TW)

(72) Inventors: Shi Ning Ju, Hsinchu (TW); Kuo-Cheng Chiang, Hsinchu County (TW); Guan-Lin Chen, Hsinchu County (TW); Chih-Hao Wang, Hsinchu County (TW); Kuan-Lun Cheng, Hsin-Chu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 247 days.

(21) Appl. No.: 17/464,517

(22) Filed: Sep. 1, 2021

(65) Prior Publication Data

US 2022/0238717 A1    Jul. 28, 2022

Related U.S. Application Data

(60) Provisional application No. 63/141,545, filed on Jan. 26, 2021.

(51) Int. Cl.
*H01L 29/66* (2006.01)
*H01L 27/092* (2006.01)
(Continued)

(52) U.S. Cl.
CPC .... *H01L 29/7856* (2013.01); *H01L 21/76229* (2013.01); *H01L 27/092* (2013.01);
(Continued)

(58) Field of Classification Search
CPC .......... H01L 29/7856; H01L 21/76229; H01L 27/092; H01L 29/0673; H01L 29/42392;
(Continued)

(56) References Cited

U.S. PATENT DOCUMENTS 11,462,612 B2 * 10/2022 Cheng ................. H01L 29/0673
2021/0296315 A1 * 9/2021 Lilak ................. H01L 29/66439
(Continued)

FOREIGN PATENT DOCUMENTS

WO        2021009579 A1    1/2021

*Primary Examiner* — Earl N Taylor
(74) *Attorney, Agent, or Firm* — HAYNES AND BOONE, LLP

(57) ABSTRACT

A semiconductor structure includes a stack of semiconductor layers disposed over a substrate, a metal gate structure disposed over and interleaved with the stack of semiconductor layers, the metal gate structure including a gate electrode disposed over a gate dielectric layer, a first isolation structure disposed adjacent to a first sidewall of the stack of semiconductor layers, where the gate dielectric layer fills space between the first isolation structure and the first sidewall of the stack of semiconductor layers, and a second isolation structure disposed adjacent to a second sidewall of the stack of semiconductor layers, where the gate electrode fills the space between the second isolation structure and the second sidewall of the stack of semiconductor layers.

20 Claims, 52 Drawing Sheets

(51) Int. Cl.
  *H01L 29/423*  (2006.01)
  *H01L 29/06*   (2006.01)
  *H01L 29/775*  (2006.01)
  *H01L 29/786*  (2006.01)
  *H01L 21/762*  (2006.01)
  *B82Y 10/00*   (2011.01)
  *H01L 29/49*   (2006.01)
  *H01L 29/78*   (2006.01)

(52) U.S. Cl.
  CPC .... *H01L 29/0673* (2013.01); *H01L 29/42392* (2013.01); *H01L 29/4966* (2013.01); *H01L 29/6681* (2013.01); *H01L 29/66439* (2013.01); *H01L 29/775* (2013.01); *H01L 29/78696* (2013.01); *B82Y 10/00* (2013.01)

(58) Field of Classification Search
  CPC ........... H01L 29/4966; H01L 29/66439; H01L 29/6681; H01L 29/775; H01L 29/78696; B82Y 10/00
  See application file for complete search history.

(56) References Cited

U.S. PATENT DOCUMENTS

| | | | |
|---|---|---|---|
| 2021/0305412 A1* | 9/2021 | Chan | H01L 29/0649 |
| 2021/0384299 A1* | 12/2021 | Ma | H01L 29/66439 |
| 2021/0407999 A1* | 12/2021 | Huang | H01L 27/0688 |
| 2022/0037519 A1* | 2/2022 | Hsu | H01L 29/66439 |
| 2022/0093647 A1* | 3/2022 | Sung | H01L 29/66439 |
| 2022/0102520 A1* | 3/2022 | Shiliang | H01L 29/401 |

* cited by examiner

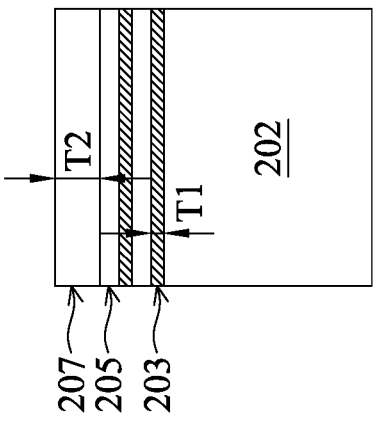
FIG. 3A
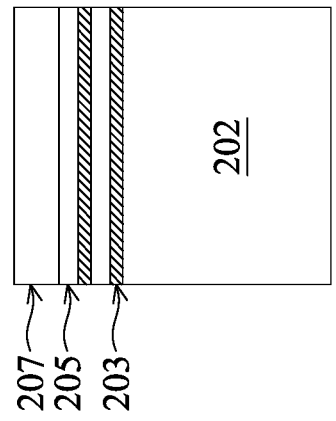
FIG. 3C
FIG. 3B

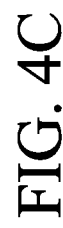
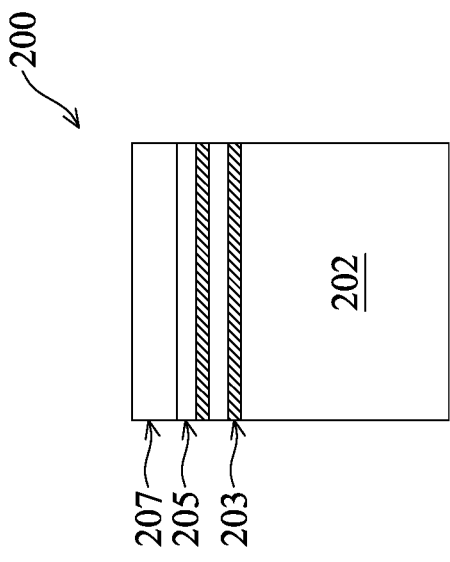
FIG. 4A
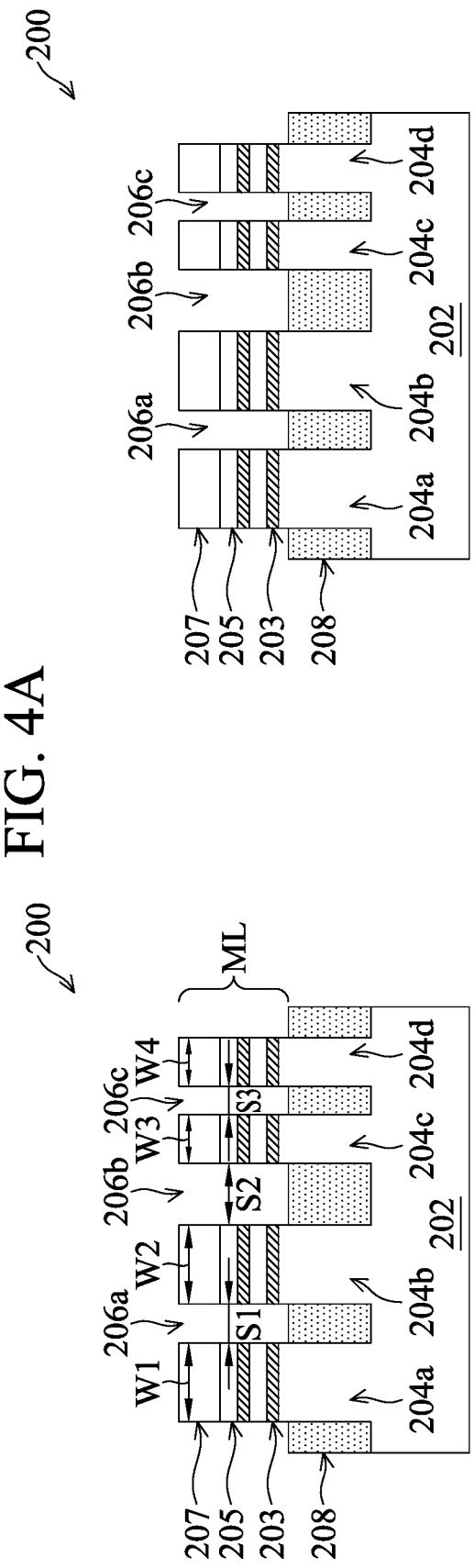
FIG. 4C
FIG. 4B

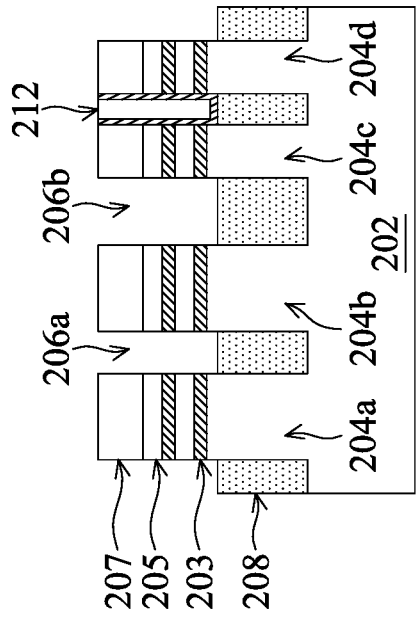
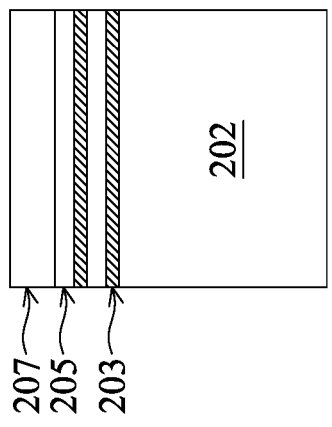
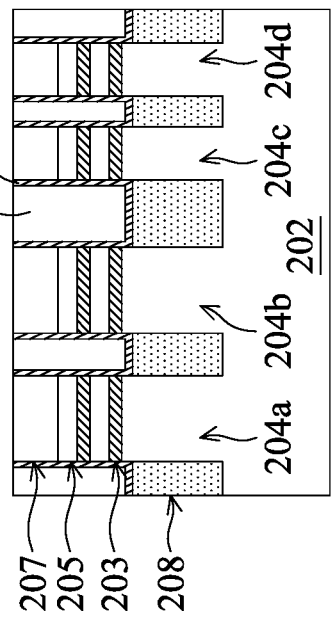
FIG. 5A
FIG. 5B
FIG. 5C

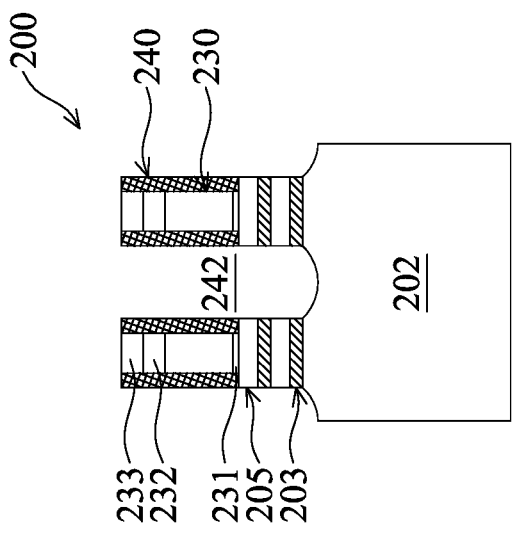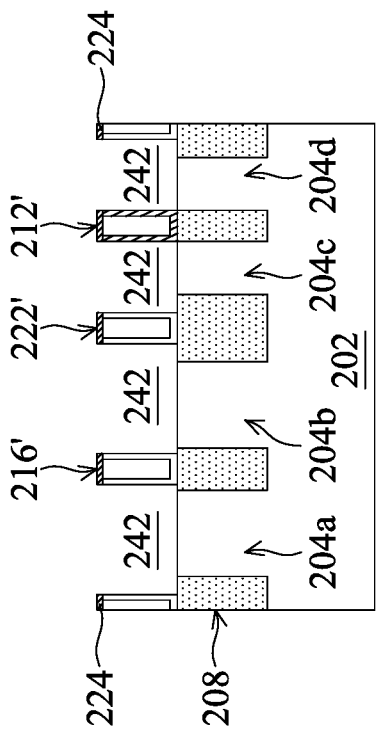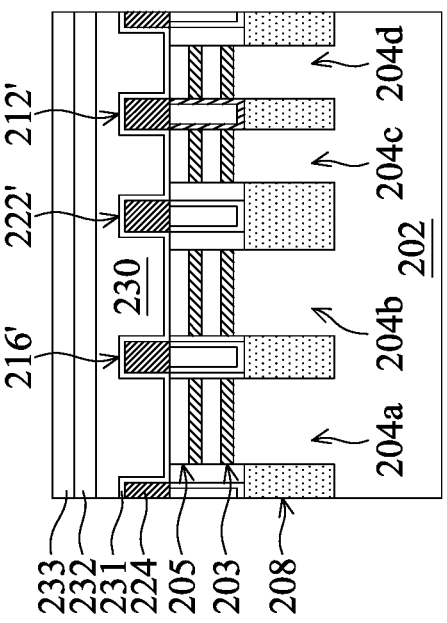
FIG. 16A
FIG. 16C
FIG. 16B

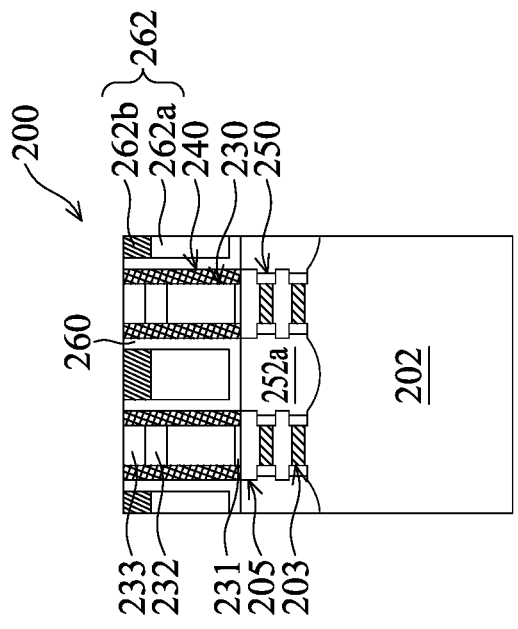
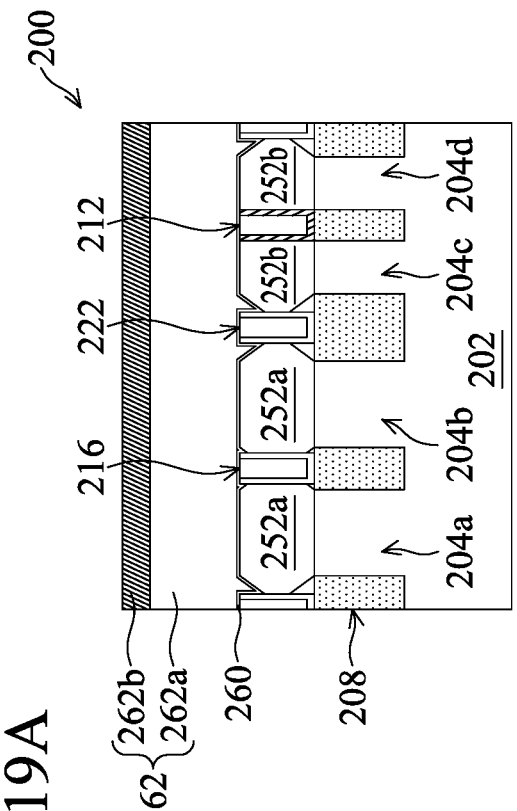
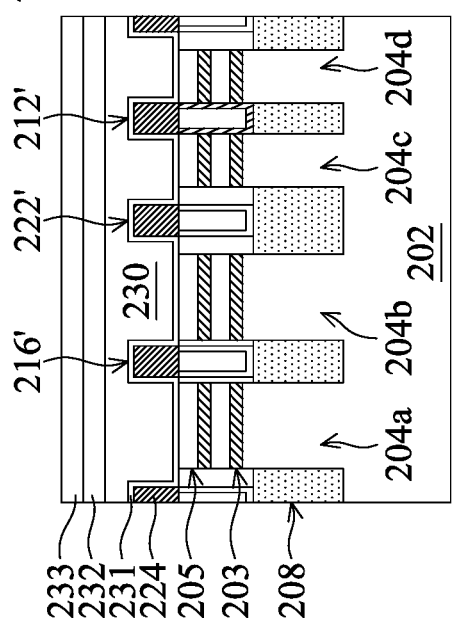
FIG. 19A
FIG. 19B
FIG. 19C

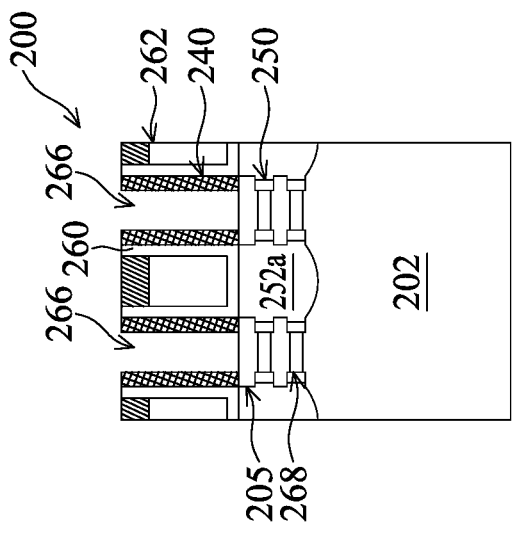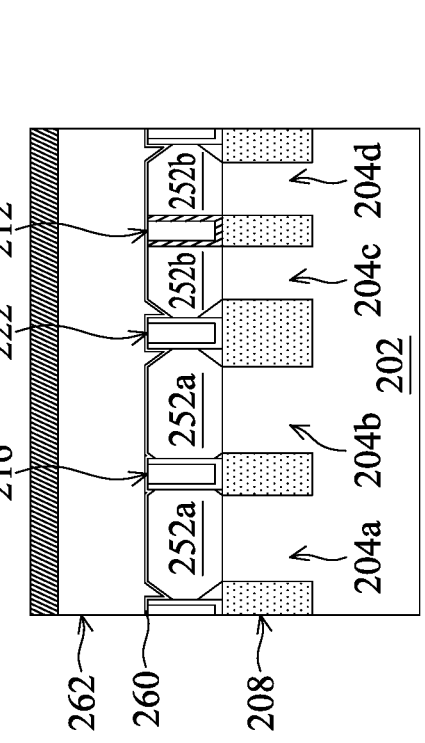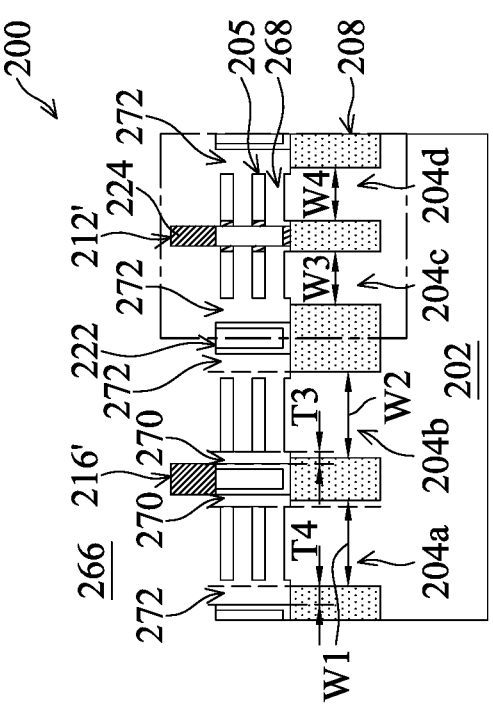
FIG. 24A
FIG. 24B
FIG. 24C

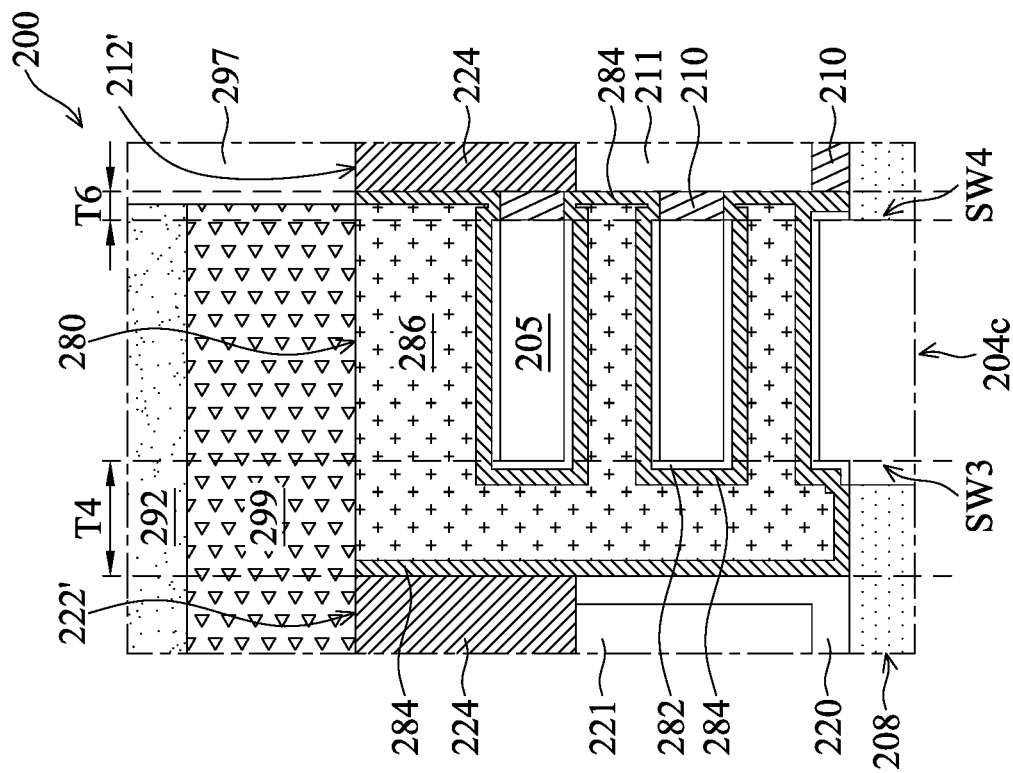
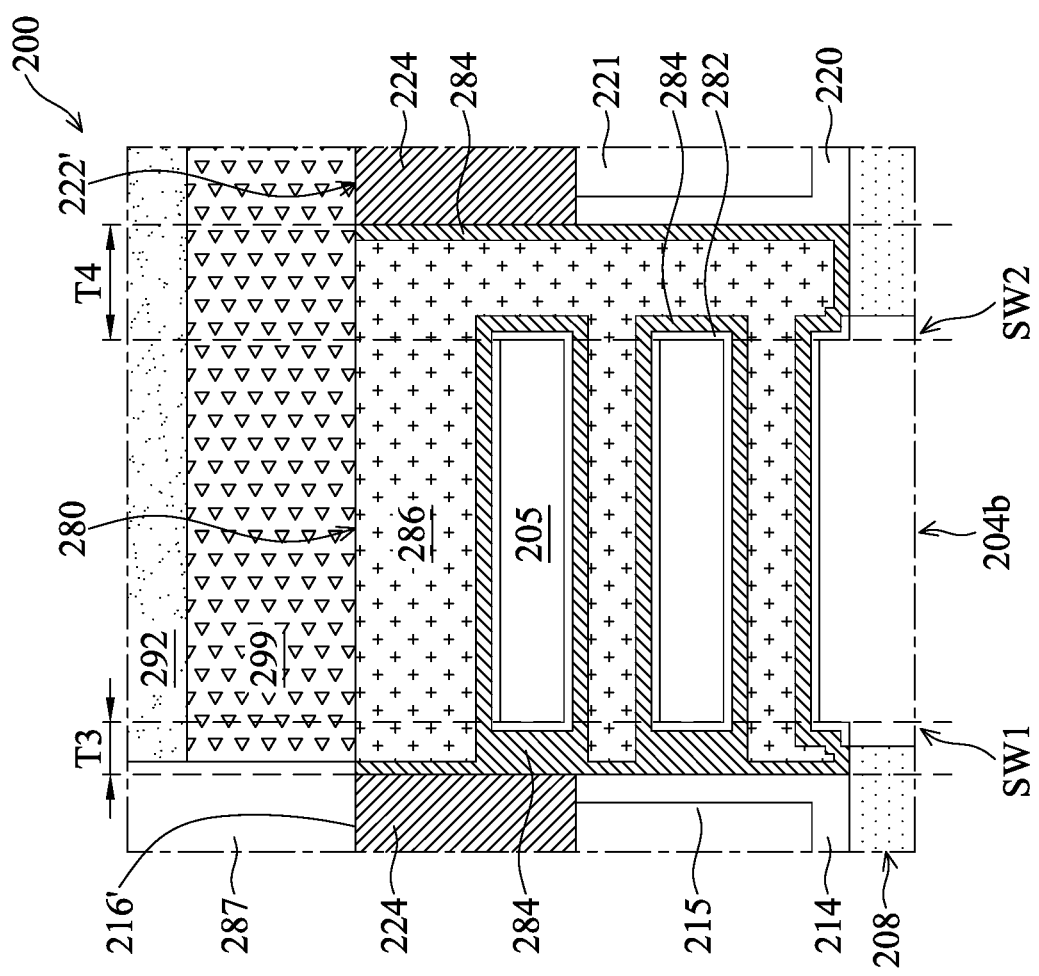
FIG. 38E
FIG. 38F

ND METHODS
ISOLATION STRUCTURES AND METHODS OF FORMING THE SAME IN FIELD-EFFECT TRANSISTORS

CROSS-REFERENCE TO RELATED APPLICATIONS

This is a non-provisional application claiming priority to U.S. Provisional Patent Application Ser. No. 63/141,545, filed on Jan. 26, 2021 and entitled "Isolation Structures and Methods of Forming the Same in Field-Effect Transistors," the entire disclosure of which is incorporated herein by reference.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

Multi-gate transistors, such as gate-all-around (GAA) field-effect transistors (FETs), have been incorporated into various memory and core devices to reduce IC chip footprint while maintaining reasonable processing margins. While methods of forming GAA FETs have generally been adequate, they have not been entirely satisfactory in all aspects. For example, the process of removing sacrificial non-channel layers between channel layers in a GAA FET's multi-layer stack may be limited due to insufficient exposure of the stack's sidewalls to an etchant applied during the process. Incomplete removal may negatively impact the subsequent formation of a metal gate stack between the channel layers. Thus, for at least this reason, improvements in methods of forming metal gate structures with suitable threshold voltage in GAA FETs are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 25D, 26A, 27A, 29A, 30A, 31A, 32A, 33A, 34A, 35A, 36A, and 37A are cross-sectional views of the semiconductor device shown in FIGS. 2A and 2B taken along line AA' at intermediate stages of the example method of FIGS. 1A, 1B, and 1C according to various embodiments of the present disclosure.

FIGS. 3B, 4B, 5B, 6B, 7B, 8B, 9B, 10B, 11B, 12B, 13B, 13D, 14B, 15B, 16B, 17B, 18B, 19B, 20B, 21B, 22B, 23B, 24B, 24D, 25B, 25E, 26B, 27B, 28A, 28B, 28C, 28D, 29B, 30B, 30D, 31B, 31D, 32B, 33B, 34B, 35B, 36B, 37B, 38A, 38B, 38C, 38D, 38E, and 38F are cross-sectional views of the semiconductor device shown in FIGS. 2A and 2B taken along line BB' at intermediate stages of the example method of FIGS. 1A, 1B, and 1C according to various embodiments of the present disclosure.

FIGS. 3C, 4C, 5C, 6C, 7C, 8C, 9C, 10C, 11C, 12C, 13C, 14C, 15C, 16C, 17C, 18C, 18D, 19C, 20C, 21C, 22C, 23C, 24C, 25C, 26C, 27C, 29C, 30C, 31C, 32C, 33C, 34C, 35C, 36C, and 37C are cross-sectional views of the semiconductor device shown in FIGS. 2A and 2B taken along line CC' at intermediate stages of the example method of FIGS. 1A, 1B, and 1C according to various embodiments of the present disclosure.

DETAILED DESCRIPTION

Figure 1A:
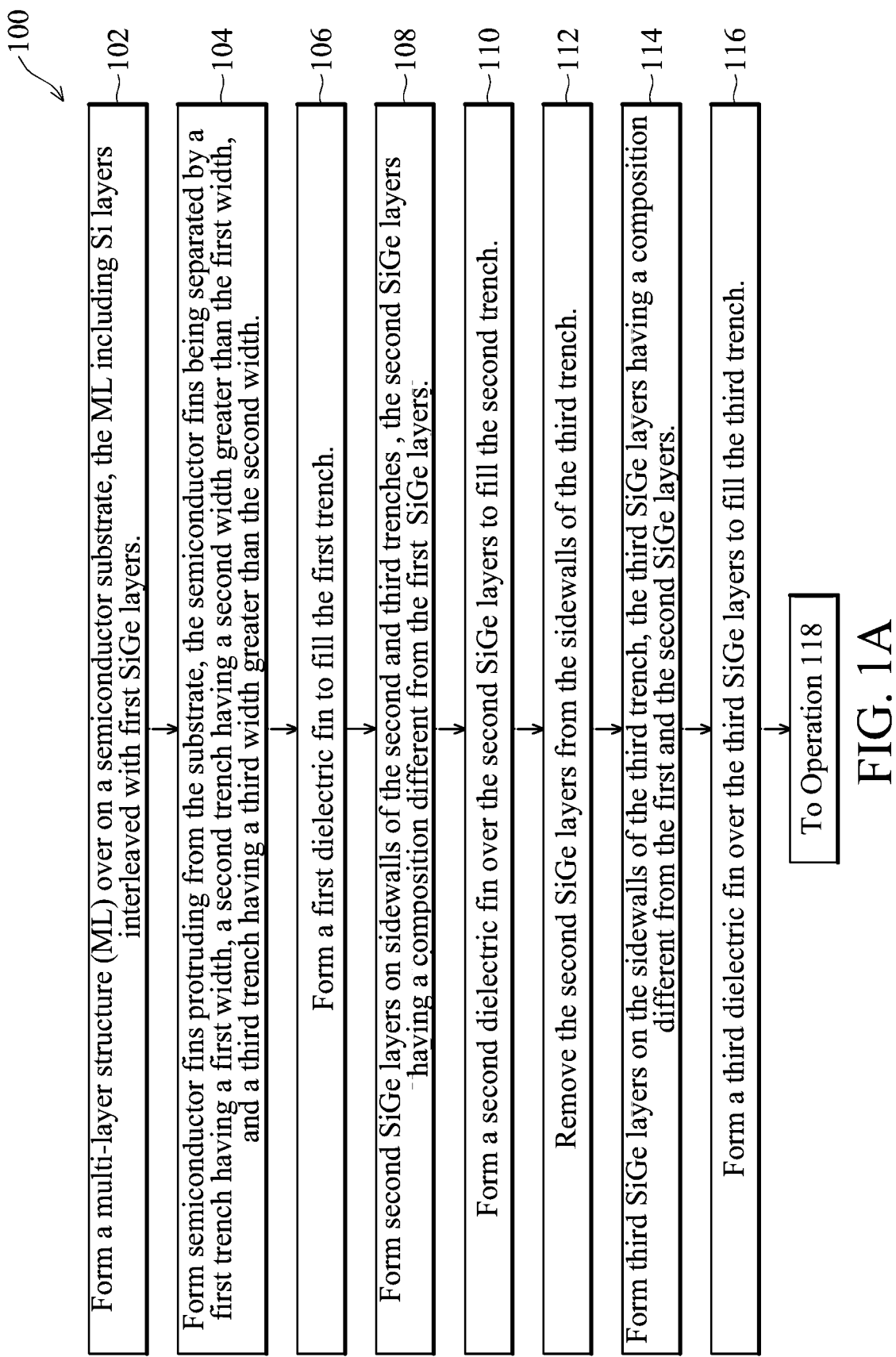
FIGS. 1A, 1B, and 1C collectively illustrate a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally directed to structures of and methods of forming multi-gate field-effect transistors (FETs), such as gate-all-around (GAA) FETs. The GAA FETs provided herein may be nanosheet-based FETs, nanowire-based FETs, and/or nanorod-based FETs.

A GAA FET may generally include a stack of channel layers disposed over an active region, source/drain (S/D) features formed over or in the active region, and metal gate stacks interleaved between the stack of channel layers and interposed between the S/D features. Generally, isolation features may be provided between stacks of channel layers and offer insulation between adjacent metal gate stacks that are formed over and interleaved with the channel layers. In many instances, these isolation features may be formed over or as a portion of a dielectric fin disposed between the stacks of channel layers, thereby affording opportunities to reduce cell height and help the GAA FET to scale down to smaller technology node. Such dielectric fins (and the isolation features formed thereover) may be physically connected to an adjacent stack of channel layers. While methods of forming such isolation features have generally been adequate, they are not entirely satisfactory in all aspects. For example, each stack of channel layers in contact with the dielectric fin may have limited access to the etching process applied to remove the non-channel layers from each stack. For stacks having relatively larger widths, such limited exposure lead to incomplete removal of the non-channel layers. For at least this reason, improvements are desired.

Figure 1B:
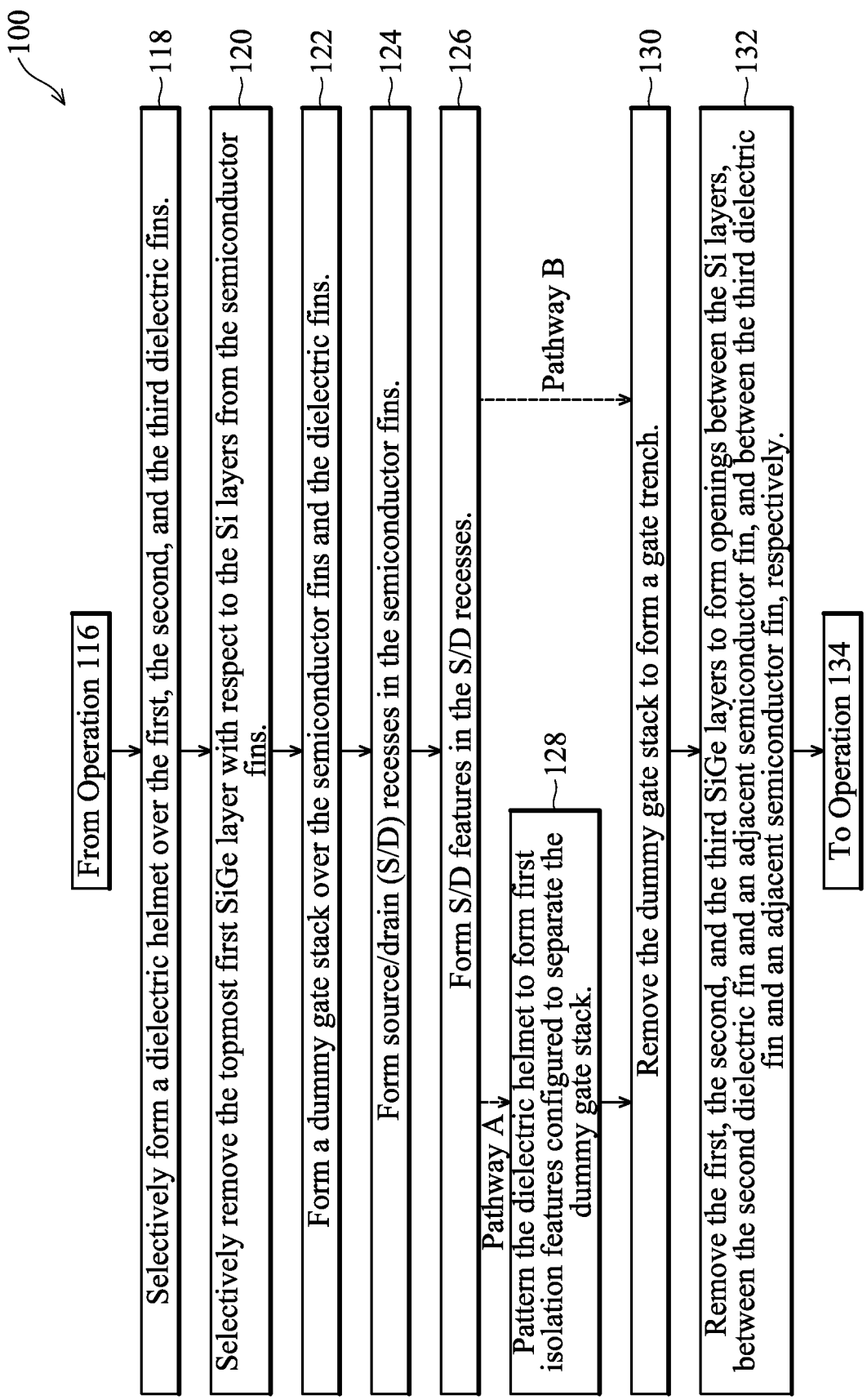
Figure 1C:
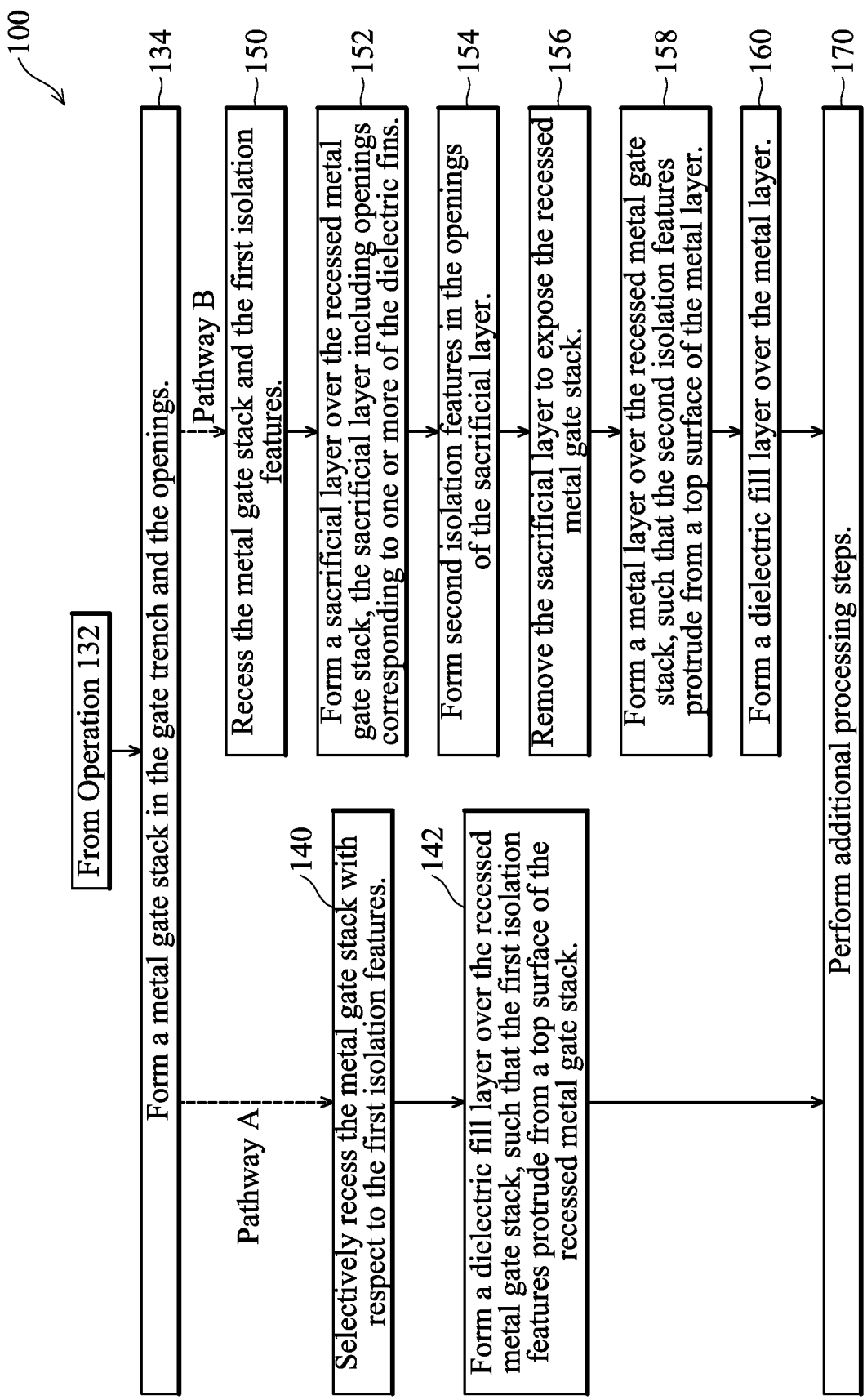
Figures 2A, 2B:
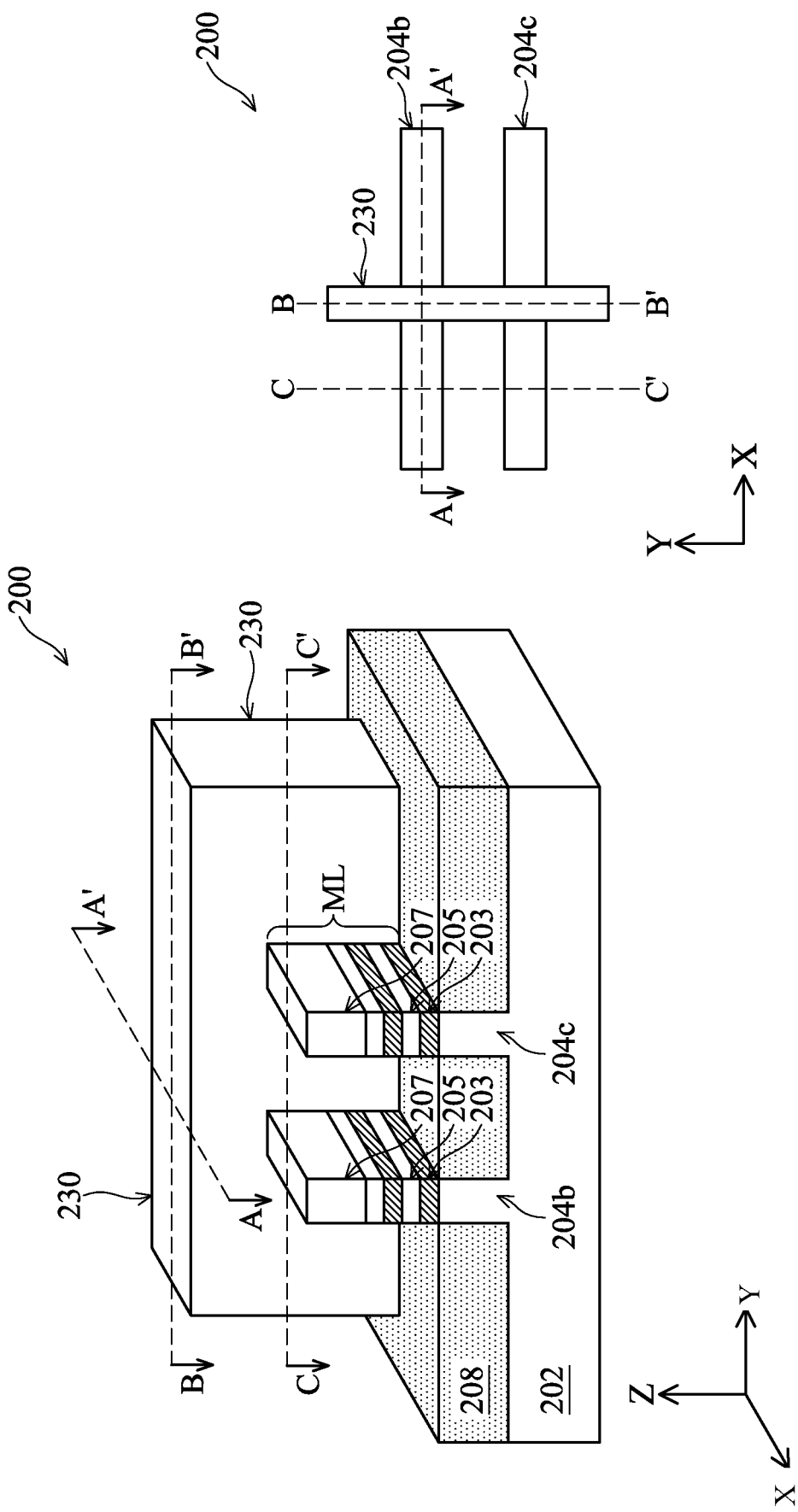
FIG. 2A is a three-dimensional perspective view of an example semiconductor device according to various embodiments of the present disclosure.
FIG. 2B is a planar top view of the semiconductor device shown in FIG. 2A according to various embodiments of the present disclosure.
Figure 20A:
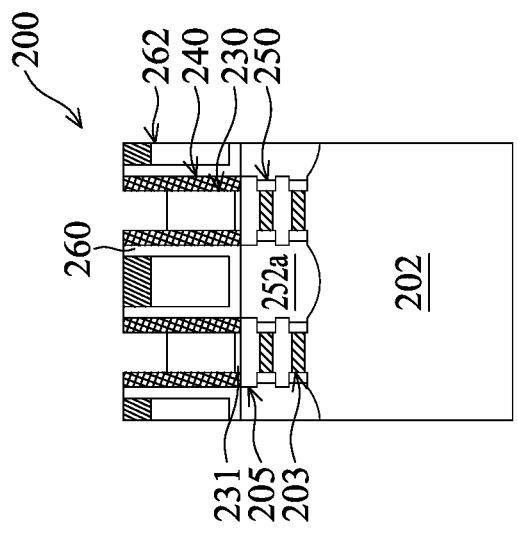
Figure 20C:
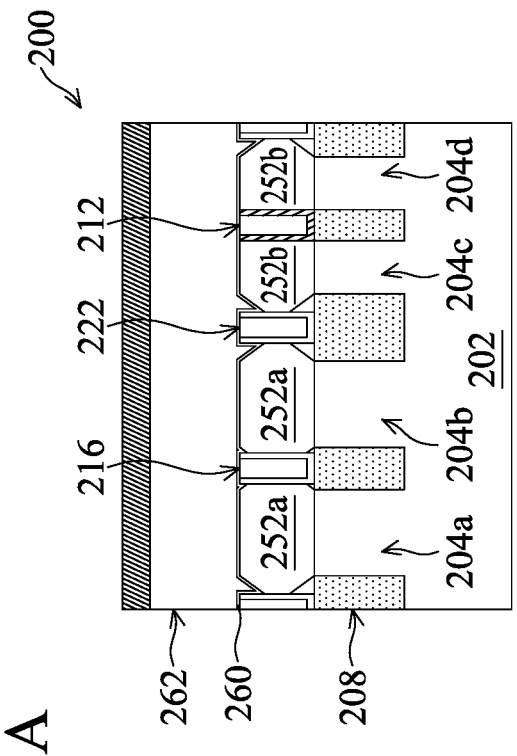
Figure 20B:
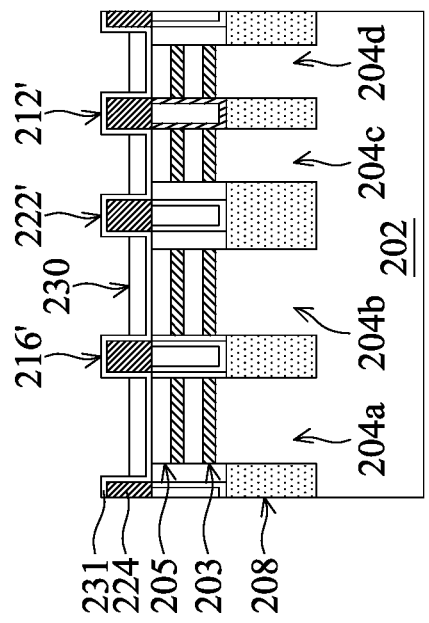
Figure 20D:
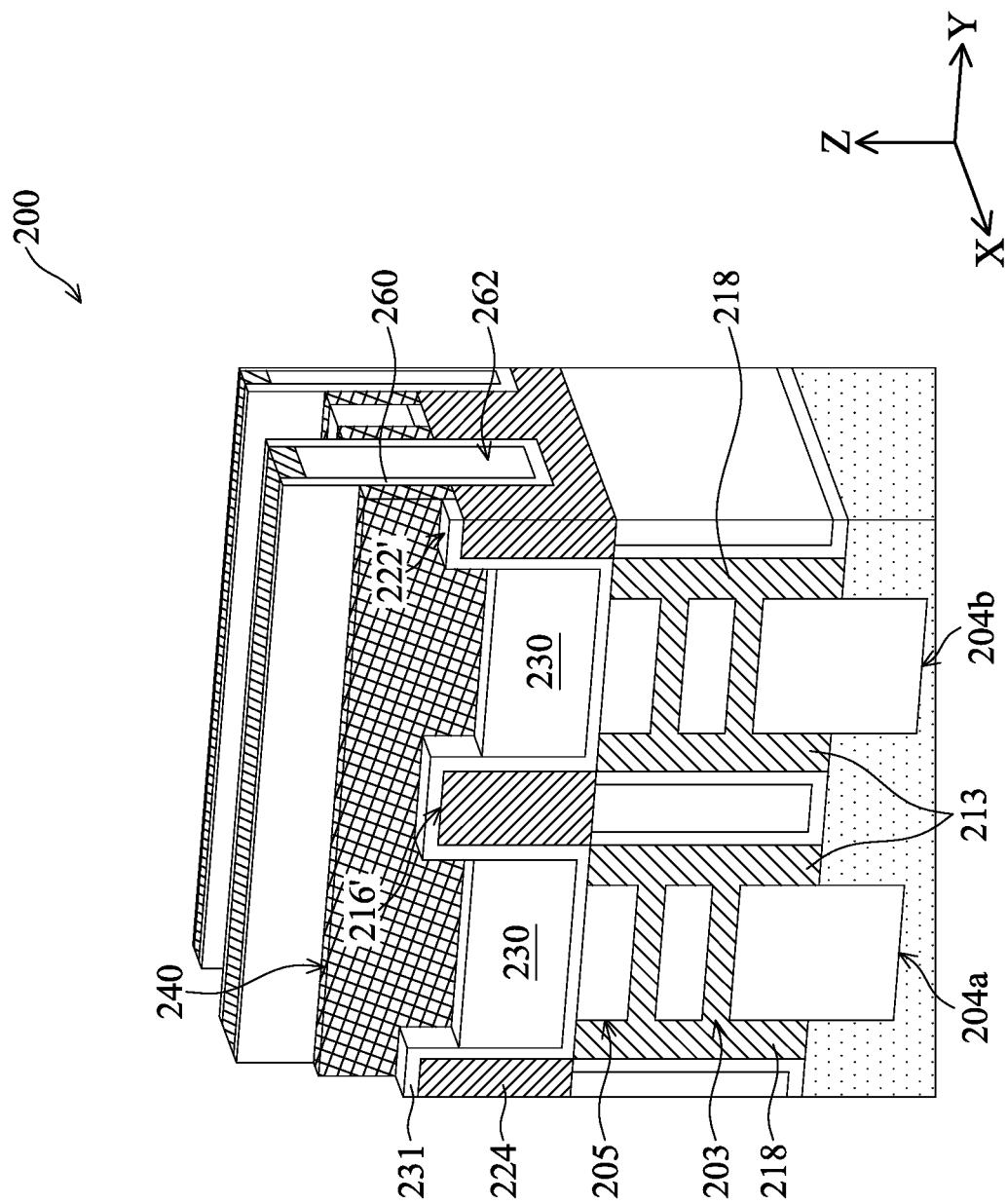
FIGS. 20D, 21D, and 22D are three-dimensional perspective views of the semiconductor device shown in FIGS. 20A-20C, 21A-21C, and 22A-22C, respectively, at intermediate stages of the example method of FIGS. 1A, 1B, and 1C according to various embodiments of the present disclosure.
Figure 21A:
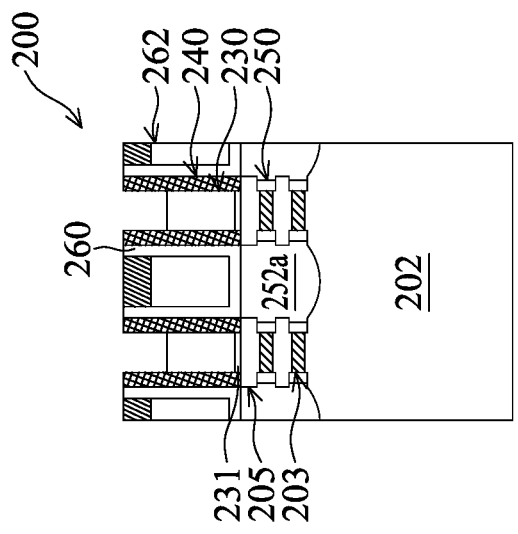
Figure 21C:
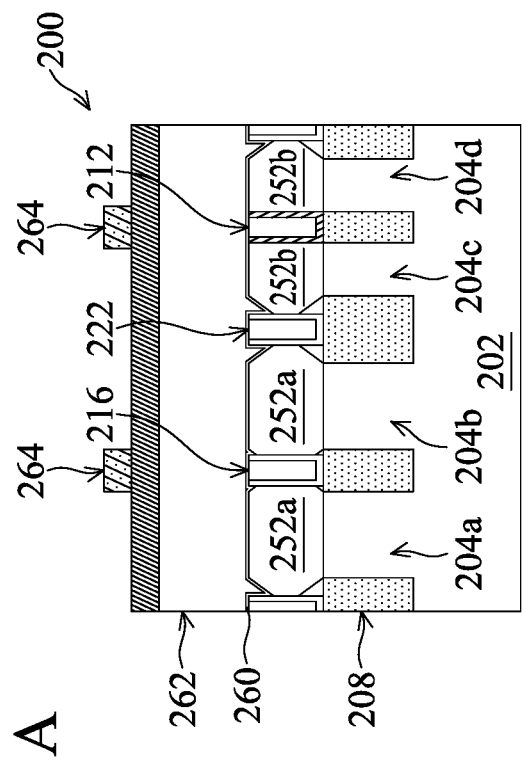
Figure 21B:
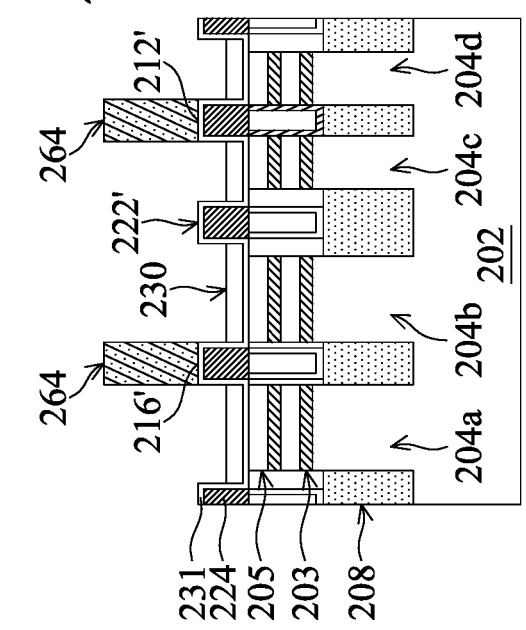
Figure 21D:
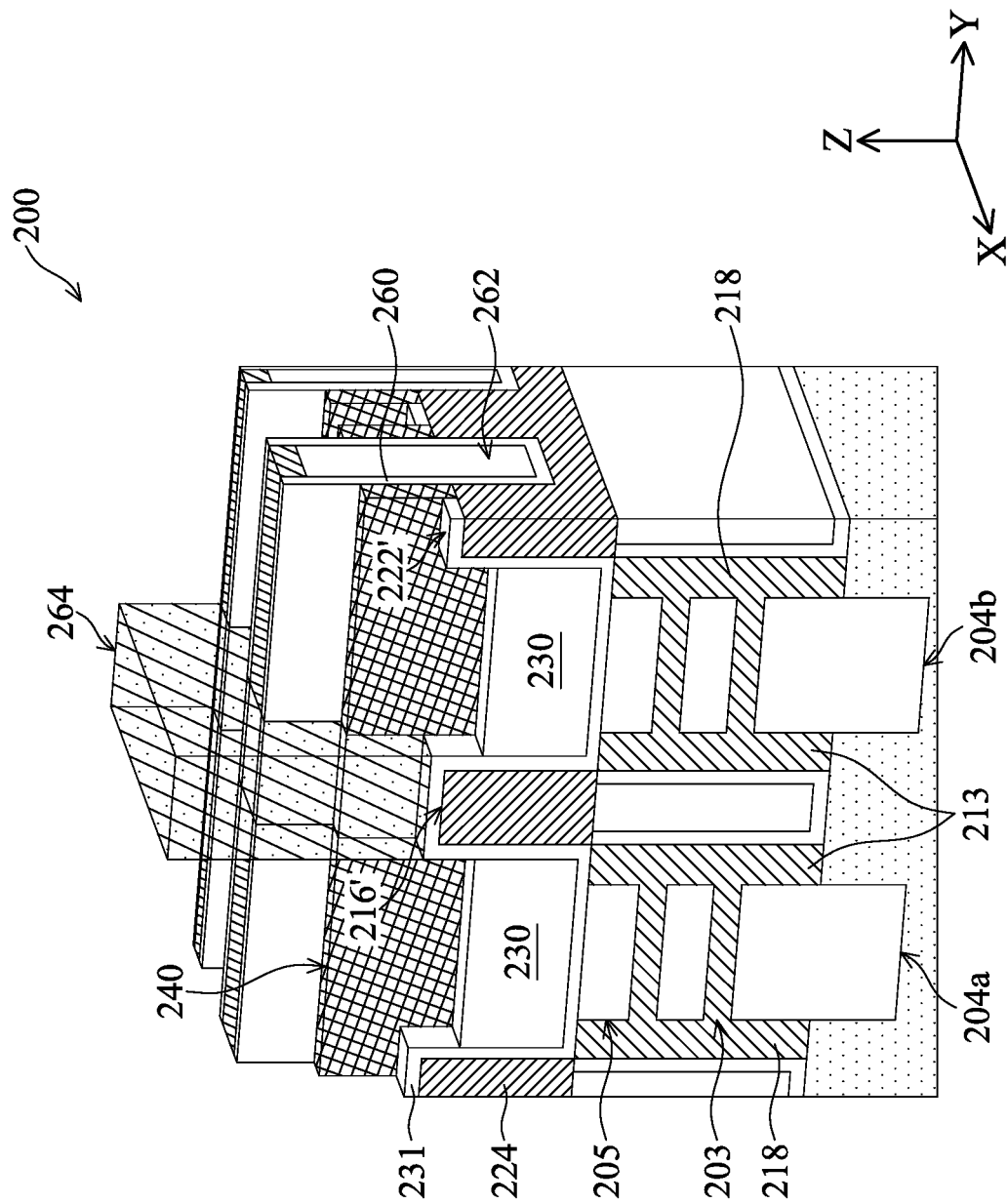
Figure 22A:
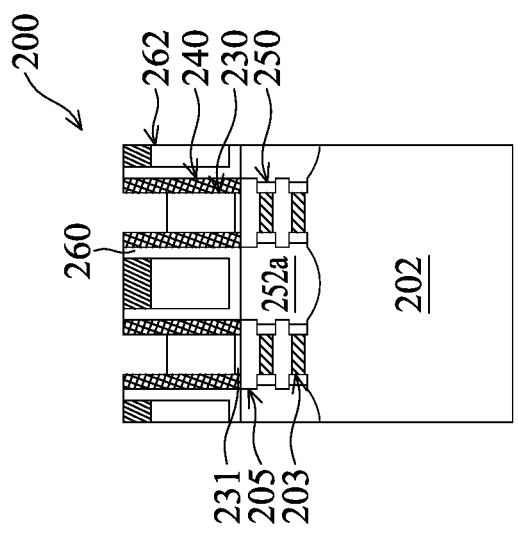
Figure 22C:
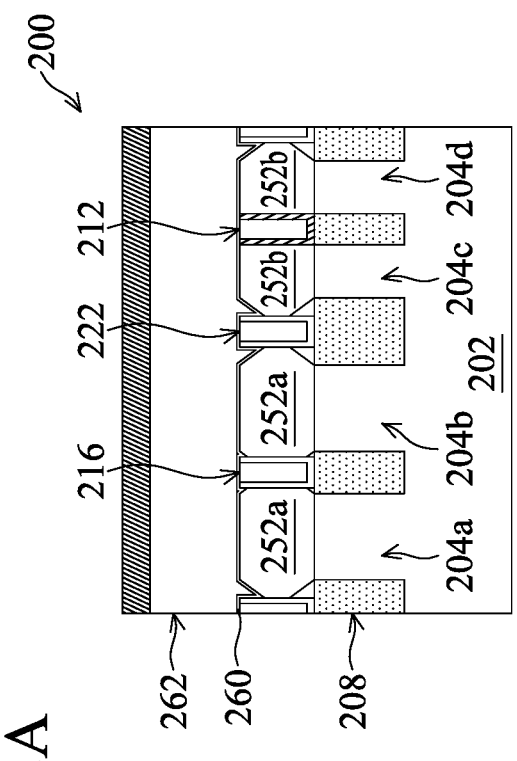
Figure 22B:
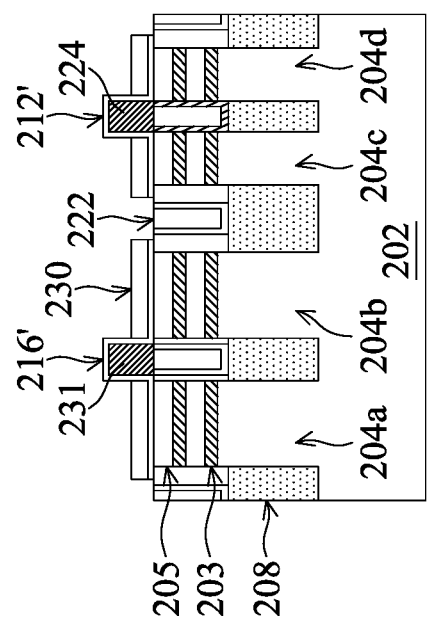
Figure 22D:
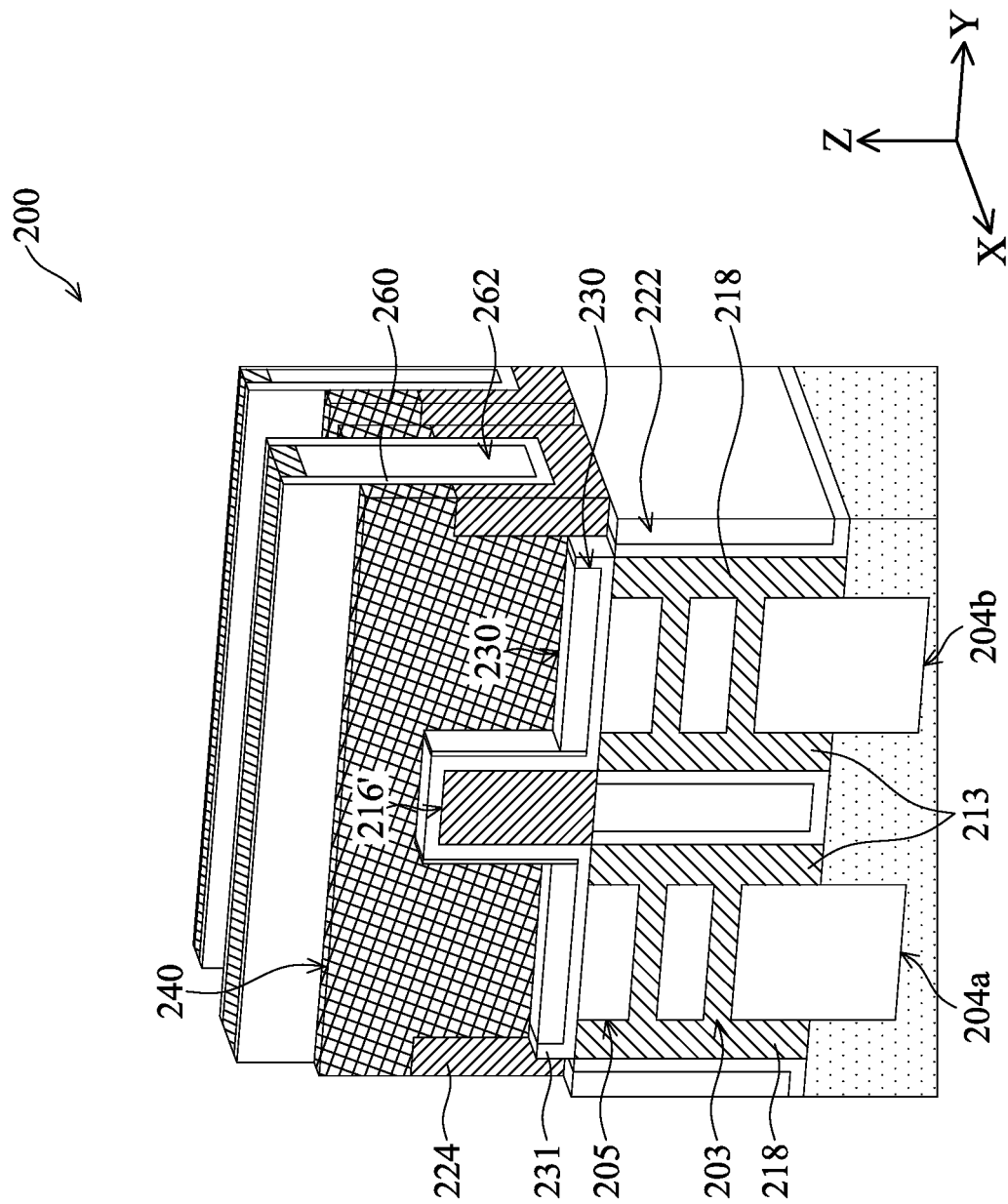
Figure 23A:
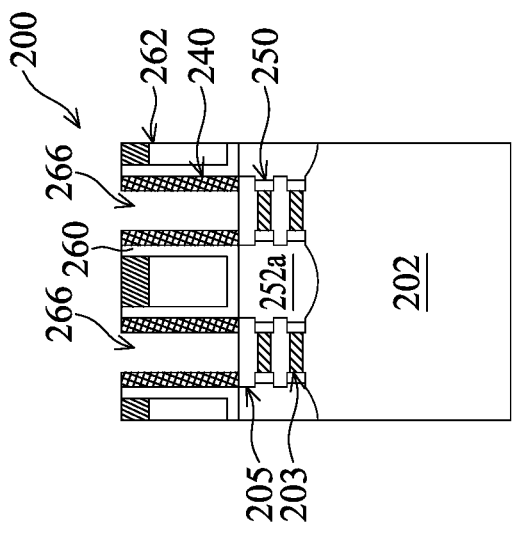
Figure 23C:
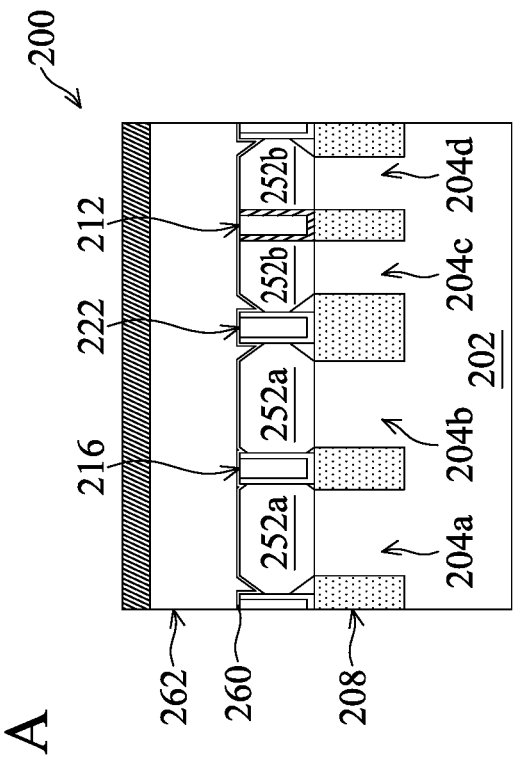
Figure 23B:
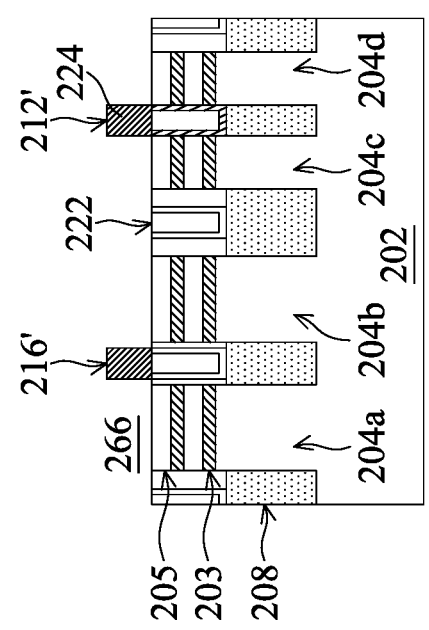

Referring now to FIGS. 1A-1C, flowchart of method 100 of forming a semiconductor device (hereafter referred to as the device) 200 are illustrated according to various aspects of the present disclosure. Method 100 is merely an example and is not intended to limit the present disclosure beyond what is explicitly recited in the claims. Additional operations can be provided before, during, and after method 100, and some operations described can be replaced, eliminated, or moved around for additional embodiments of the method. Method 100 is described below in conjunction with FIGS. 2A-38F, where FIG. 2A is a three-dimensional perspective view, FIG. 2B is a planar top view, and FIGS. 3A-38F are cross-sectional views taken through various regions of the device 200 as depicted in FIGS. 2A and 2B at intermediate steps of method 100. Specifically, FIGS. 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 25D, 26A, 27A, 29A, 30A, 31A, 32A, 33A, 34A, 35A, 36A, and 37A are cross-sectional views along line AA' of the device 200, FIGS. 3B, 4B, 5B, 6B, 7B, 8B, 9B, 10B, 11B, 12B, 13B, 13D, 14B, 15B, 16B, 17B, 18B, 19B, 20B, 21B, 22B, 23B, 24B, 24D, 25B, 25E, 26B, 27B, 28A, 28B, 28C, 28D, 29B, 30B, 30D, 31B, 31D, 32B33B, 34B, 35B, 36B, 37B, 38A, 38B, 38C, 38D, 38E, and 38F are cross-sectional views along line BB' of the device 200, FIGS. 3C, 4C, 5C, 6C, 7C, 8C, 9C, 10C, 11C, 12C, 13C, 14C, 15C, 16C, 17C, 18C, 18D, 19C, 20C, 21C, 22C, 23C, 24C, 25C, 26C, and 27C are cross-sectional views along line CC' of the device 200, and FIGS. 20D, 21D, and 22D are three-dimensional perspective views of the semiconductor device shown in FIGS. 20A-20C, 21A-21C, and 22A-22C, respectively.

The device 200 may be an intermediate device fabricated during processing of an IC, or a portion thereof, that may comprise static random-access memory (SRAM) and/or other logic circuits, passive components such as resistors, capacitors, and inductors, and active components such as GAA FETs, FinFETs, MOSFETs, CMOSFETs, bipolar transistors, high voltage transistors, high frequency transistors, and/or other transistors. The present disclosure is not limited to any particular number of devices or device regions, or to any particular device configurations. Additional features can be added to the device 200, and some of the features described below can be replaced, modified, or eliminated in other embodiments of the device 200.

Referring to FIGS. 1A, 2A, 2B, and 3A-3C, method 100 at operation 102 provides a semiconductor substrate (hereafter referred to as "the substrate") 202 and subsequently forms a multi-layered structure (ML) thereover. The substrate 202 may include an elemental (i.e., having a single element) semiconductor, such as silicon (Si), germanium (Ge), or other suitable materials; a compound semiconductor, such as silicon carbide, gallium arsenic, gallium phosphide, indium phosphide, indium arsenide, indium antimonide, other suitable materials, or combinations thereof; an alloy semiconductor, such as SiGe, GaAsP, AlInAs, AlGaAs, GaInAs, GaInP, GaInAsP, other suitable materials, or combinations thereof. The substrate 202 may be a single-layer material having a uniform composition. Alternatively, the substrate 202 may include multiple material layers having similar or different compositions suitable for manufacturing the device 200.

In some examples where the substrate 202 includes FETs, various doped regions may be disposed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or in a raised structure. Doped regions may be formed by implantation of dopant atoms, in-situ doped epitaxial growth, and/or other suitable techniques. Of course, these examples are for illustrative purposes only and are not intended to be limiting.

In the present embodiments, the ML includes alternating silicon germanium (SiGe) layers and silicon (Si) layers arranged in a vertical stack along the Z axis and is configured to provide channel regions suitable for forming GAA FETs. In the present embodiments, the ML includes alternating SiGe layers 203 stacked with Si layers 205, where the topmost layer of the ML is a SiGe layer 207. In the present embodiments, each Si layer 205 includes elemental Si and is substantially free of Ge, while the each SiGe layer 203 and the SiGe layer 207 include both Si and Ge. In some embodiments, the SiGe layer 207 is configured as a sacrificial hard mask to protect the underlying ML from subsequent fabrication process(es). In the present embodiments, the Si layers 205 are configured as channel layers for forming the GAA FETs, while the SiGe layers 203 are configured as non-channel layers subsequently removed during a sheet (or wire) release process to form multiple openings between the channel layers. Thereafter, a metal gate structure is formed in the openings to complete fabrication of the respective FET. In the present embodiments, the SiGe layer 207 differs from the SiGe layer 203 in the amount of Ge included, such that the SiGe layer 207 may be selectively removed with respect to the SiGe layers 203. In some embodiments, a thickness T1 of the SiGe layer 203 is less than a thickness T2 of the SiGe layer 207. In some examples, the ML may include three to ten pairs of the SiGe layers 203 and the Si layers 205.

In the present embodiments, forming the ML includes alternatingly growing a SiGe layer (i.e., the SiGe layer 203 or the SiGe layer 207) and a Si layer (i.e., the Si layer 205) in a series of epitaxy growth processes implementing chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable selective epitaxial growth (SEG) processes, or combinations thereof. The epitaxy process may use a gaseous and/or liquid precursor that interacts with the composition of the underlying substrate. For example, the substrate 202, which includes Si, may interact with a Ge-containing precursor to form the SiGe layer 203. In some examples, the SiGe layer 203, the Si layers 205, and the SiGe layers 207 may be formed into nanosheets, nanowires, or nanorods.

Now referring to FIGS. 1A, 2A, 2B, and 4A-4C, method 100 at operation 104 forms semiconductor fins 204a, 204b, 204c, and 204d protruding from the substrate 202. In the depicted embodiments, the semiconductor fins 204a-204d are disposed adjacent and substantially parallel to each other, i.e., oriented lengthwise along the X axis and spaced from each other along the Y axis. In the present embodiments, some of the semiconductor fins 204a-204d are formed to different widths defined along the Y axis. In some embodiments, the device 200 includes at least two different semiconductors having different widths. For example, as depicted herein, the semiconductor fins 204a-204d are formed to widths W1, W2, W3, and W4, respectively, where the widths W1 and W2 are each greater than the widths W3 and W4. It is noted that the semiconductor fins 204a-204d with their various widths are merely examples for illustrating the present embodiments and by no means limit the structure of the device 200 as so. For example, the device 200 may include additional semiconductor fins having the same widths as or different widths from one or more of the semiconductor fins 204a-204d.

The semiconductor fins 204a-204d may be fabricated using suitable processes including photolithography and etch processes. The photolithography process may include forming a masking element having a hard mask layer (not depicted) over the ML, a photoresist layer (or resist; not depicted) over the hard mask layer, exposing the resist to a pattern, performing a post-exposure bake process to the resist, and developing the resist to form a patterned masking element (not depicted) exposing portions of the ML. The patterned masking element is then used for etching trenches 206a, 206b, and 206c into the ML and portions of the substrate 202, leaving the semiconductor fins 204a-204d protruding from the substrate 202. The patterned masking element is then removed from the device 200 by a suitable method, such as plasma ashing and/or resist stripping.

Numerous other embodiments of methods for forming the semiconductor fins 204a-204d may be suitable. For example, the semiconductor fins 204a-204d may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 204a-204d.

Still referring to FIGS. 1A, 2A, and 4A-4C, method 100 at operation 104 forms isolation structures 208 over the substrate 202 and separating bottom portions of the semiconductor fins 204a-204d. The isolation structures 208 may include silicon oxide, fluoride-doped silicate glass (FSG), a low-k (i.e., having a dielectric constant less than that of silicon oxide, which is about 3.9) dielectric material, other suitable materials, or combinations thereof. In the present embodiments, the isolation structures 208 include shallow trench isolation (STI) features. In some embodiments, the isolation structures 208 are formed by depositing a dielectric layer over the substrate 202, thereby filling the trenches 206a-206c between the semiconductor fins 204a-204d, and subsequently recessing the dielectric layer such that top surfaces of the isolation structures 208 are below top surfaces of the semiconductor fins 204a-204d, as depicted in FIGS. 4B and 4C. Other isolation structures such as deep trench isolation (DTI), field oxide, local oxidation of silicon (LOCOS), other suitable structures, or combinations thereof may also be implemented as the isolation structures 208. In some embodiments, the isolation structures 208 may include a multi-layer structure, for example, having one or more thermal oxide liner layers. The isolation structures 208 may be deposited by any suitable method, such as CVD, flowable CVD (FCVD), spin-on-glass (SOG), other suitable methods, or combinations thereof. In some embodiments, an anneal process is applied to cure the isolation structures 208.

In the present embodiments, the trenches 206a-206c are defined by widths S1, S2, and S3, respectively, which differ in magnitude. For example, in the depicted embodiments, the width S1 is greater than the width S3, and the width S2 is greater than the width S1. As depicted herein, the widths S1-S3 correspond to separation distances between the semiconductor fins 204a-204d. In the present embodiments, the trenches (e.g., the trenches 206a and 206b) defined by the semiconductor fins having relatively larger widths (e.g., the semiconductor fins 204a and 204b) have greater widths than the trenches (e.g., the trench 206c) defined by the semiconductor fins having relatively smaller widths (e.g., the semiconductor fins 204c and 204d). However, it is noted that the relative widths of the trenches 206a-206c are defined as mere examples and therefore do not limit the present embodiments as so.

In some existing implementations, dielectric fins are formed to fill trenches between the semiconductor fins (e.g., the semiconductor fins 204a-204d) and provide isolation features for separating (or truncating) a metal gate stack formed over the semiconductor fins. During the subsequent removal of the non-channel layers, portions of the dielectric fins remain physically connected to the semiconductor fins, thereby preventing one or both of sidewalls of each semiconductor fin from being exposed to the etchant and limiting the overall extent of removal of the non-channel layers. This effect may be exacerbated when the semiconductor fin has a relatively large width (e.g., the semiconductor fins 204a and 204b). The present embodiments provide a method of adjusting the spacing between each dielectric fin and an adjacent semiconductor fin, such that semiconductor fins with relatively large widths may be fully exposed along both sidewalls during the etching process, which in turn promotes more complete removal of the non-channel layers before forming the metal gate stack. As provided herein, the adjustment of such spacing may be implemented by including SiGe cladding layers (or the lack thereof) of varying thicknesses and compositions in the trenches between the semiconductor fins.

Referring to FIGS. 1A and 5A-6C, method 100 at operation 106 forms a dielectric fin 212 over the isolation structures 208, thereby filling at least one, but not all, of the trenches 206a-206c. In the present embodiments, the dielectric fin 212 is a multi-layer structure including a dielectric layer 211 disposed over a dielectric layer 210, where the dielectric layers 210 and 211 have different compositions. In some embodiments, the dielectric layers 210 and 211 each include silicon nitride (SiN), silicon carbide (SiC), silicon oxynitride (SiON), silicon oxycarbide (SiOC), silicon carbonitride (SiCN), silicon oxycarbonitride (SiOCN), silicon oxide (SiO and/or SiO$_2$), a low-k dielectric material, other suitable materials, or combinations thereof. In some embodiments, the dielectric layer 211 has a multi-layer structure. In this regard, the dielectric layer 211 may include an inner layer disposed over an outer layer, where the outer layer includes a dielectric material having a higher dielectric constant than the inner layer. For example, the dielectric layer 211 may include an inner silicon oxide-based layer disposed over an outer layer having one or more of silicon nitride, silicon carbide, silicon oxynitride, silicon oxycarbide, silicon carbonitride, and silicon oxycarbonitride. In further embodiments, the dielectric layer 211 includes a dielectric material having a dielectric constant less than that of dielectric material included in the dielectric layer 210. In this regard, an overall volume of the dielectric layer 211 is greater than that of the dielectric layer 210 to maintain the parasitic capacitance of the dielectric fin 212 at a desired level. In one such example, the dielectric layer 210 may include silicon nitride and the dielectric layer 211 may include silicon oxide. In some embodiments, the dielectric layer 210 is formed to about 1 nm to about 5 nm in thickness. In some embodiments, as will be discussed in detail below, the dielectric layer 210 is configured to extend a width of the channel layers (i.e., the width W3) of the semiconductor fins 204c and 204d, resulting in an extension of the subsequently-formed metal gate stack for improved gate control. However, if the dielectric layer 210 is too thick, e.g., thicker than about 5 nm, the parasitic capacitance would inadvertently be increased. In this regard, the thickness of about 1 nm to about 5 nm provides improved gate control without sacrificing parasitic capacitance.

Referring to FIGS. 5A-5C, forming the dielectric fin 212 includes depositing the dielectric layer 210 in each of the trenches (e.g., the trenches 206a-206c), depositing the dielectric layer 211 over the dielectric layer 210 to fill the trenches, and planarizing the dielectric layers 210 and 211 by a polishing method (e.g., chemical-mechanical polishing/planarization, or CMP) to expose the semiconductor fins 204a-204d. In some embodiments, the dielectric layer 210 is conformally deposited in the trenches by a suitable method, such as atomic layer deposition (ALD), CVD, other suitable methods, or combinations thereof. In some embodiments, the dielectric layer 211 is deposited by a suitable method, such as CVD, FCVD, ALD, SOG, other suitable methods, or combinations thereof. A curing or heat treatment may be performed after depositing the dielectric layer 211 to harden the dielectric material contained therein.

Figure 6A:
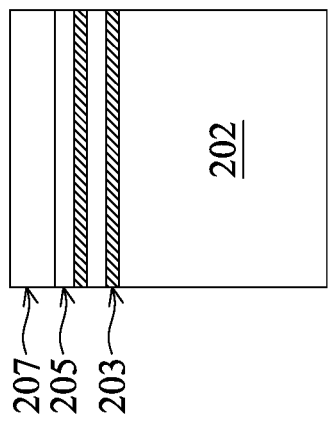
Figure 6C:
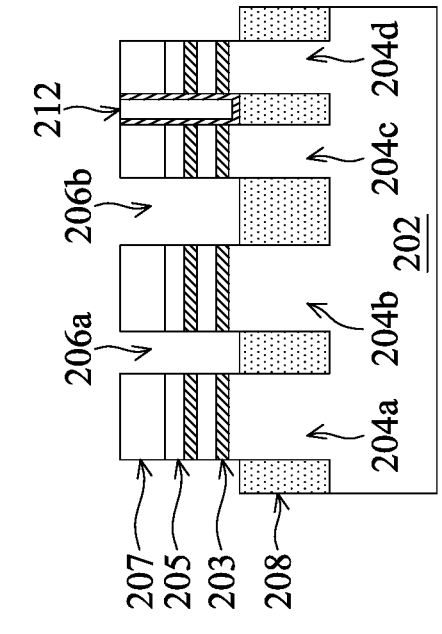
Figure 6B:
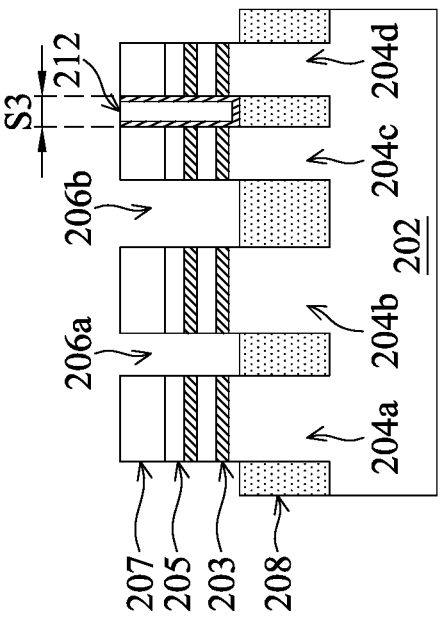

Referring to FIGS. 6A-6C, forming the dielectric fin 212 further includes etching back at least portions of the dielectric layers 210 and 211. The etching process may be a dry etching process, a wet etching process, a reactive ion etching (RIE) process, other suitable processes, or combinations thereof, and may utilize any etchant(s) suitable for removing the dielectric materials included in the dielectric layers 210 and 211. In the present embodiments, the etching process selectively removes portions of the dielectric layers 210 and 211 from the trenches having relatively larger widths (e.g., the trenches 206a and 206b), while portions of the dielectric layers 210 and 211 substantially remain in the trench or trenches having relatively smaller widths (e.g., the trench 206c) to form the dielectric fin 212. In the depicted embodiments, the dielectric fin 212 is defined by a width that is consistent with the separation distance S3. In some embodiments, such selective removal is the result of the relatively wider trenches being exposed to a greater amount of etchant (i.e., greater amount of etchant loading) than the relatively narrower trenches during the etching process.

Referring to FIGS. 1A, 7A-7C, method 100 at operation 108 forms SiGe cladding layers 213 along sidewalls of the exposed (i.e., not filled with the dielectric fin 212) trenches 206a and 206b. In the present embodiments, the amount of Ge in the SiGe cladding layers 213 is about 25% to 35%, which is different from the amount of Ge in the SiGe layers (i.e., the SiGe layers 203 and 207) of the ML to ensure that the SiGe cladding layers 213 can be selectively removed. In this regard, if the amount of Ge falls outside such range, the SiGe cladding layers 213 may not exhibit sufficient etching selectivity with respect to the SiGe layers 203 and 207, such that removing the SiGe cladding layers 213 may inadvertently removing portions of the SiGe layers 203 and/or the SiGe layer 207.

In the present embodiments, forming the SiGe cladding layers 213 includes conformally depositing a SiGe layer in the exposed trenches and over top surfaces of the semiconductor fins 204a-204d and subsequently etching back portions of the SiGe layer to form the SiGe cladding layers 213 along sidewalls of the exposed trenches. In some embodiments, conformally depositing the SiGe layer includes performing a suitable process, such as ALD, CVD, other processes, or combinations thereof, followed by a CMP process to planarize the SiGe layer. In the present embodiments, etching back the SiGe layer to form the SiGe cladding layers 213 includes performing an anisotropic etching process (e.g., a dry etching process) to selectively remove portions of the SiGe layer formed over the isolation structures 208 and leave behind the SiGe cladding layers 213 along the sidewalls of the exposed trenches.

In the present embodiments, the SiGe cladding layers 213 are formed to a thickness T3 of about 3 nm to about 7 nm. As provided herein, the presence of the SiGe cladding layers 213, portions of which are subsequently removed in a selective etching process, allows one or both sidewalls of the semiconductor fins 204a and 204b to be exposed during the sheet formation process, resulting in more complete removal of the SiGe layers 203. In further embodiments, the extent of such exposure is adjusted by the thickness T3 of the SiGe cladding layers 213, with a greater thickness T3 leading to a greater extent of exposure. Stated differently, the thickness T3 of the SiGe cladding layers 213 determines a spacing between each of the semiconductor fins 204a and 204b and a subsequently-formed dielectric fin therebetween (e.g., a dielectric fin 216). In this regard, if the thickness T3 of the SiGe cladding layers 213 is less than about 3 nm, the sidewalls of the semiconductor fins 204 and 204b may not be sufficiently exposed to an etchant implemented during the sheet formation process, thereby limiting the extent of the removal of the SiGe layers 203. In addition, as discussed in detail below, the thickness T3 of the SiGe cladding layers 213 also determines the dimension of a subsequently-formed gate isolation feature. For example, for a given width S1, a greater T3 would reduce the remaining space in the trench 206a, thereby reducing the width of the dielectric fin formed in the trench 206a, where the dielectric fin is configured as a portion of the gate isolation feature. In this regard, if the thickness T3 of the SiGe cladding layers 213 is greater than about 7 nm, the gate isolation feature formed over the dielectric fin may not be large enough to provide insulation between adjacent metal gate stacks.

In some embodiments, a cleaning process is performed before forming the SiGe cladding layers 213 to remove any excess material from the exposed trenches. In the present embodiments, the cleaning process produces an oxide (e.g., silicon oxide) layer (not depicted) along the sidewalls of the exposed trenches to promote bonding between the subsequently-formed SiGe cladding layers 213 and the semiconductor fins 204a-204d. In some embodiments, the oxide layer is thinner than the SiGe cladding layers 213 and may be about 0.5 nm to about 1 nm in thickness. Of course, the present embodiments are not limited to these dimensions.

Now referring to FIGS. 1A and 8A-9C, method 100 at operation 110 forms the dielectric fin 216 over the SiGe cladding layers 213, thereby filling the exposed trenches (e.g., the trenches 206a and 206b). In the present embodiments, the dielectric fin 216 is a multi-layer structure including a dielectric layer 215 disposed over a dielectric layer 214, where the dielectric layers 214 and 215 have different compositions. In some embodiments, the dielectric layers 214 and 215 each include silicon nitride, silicon carbide, silicon oxynitride, silicon oxycarbide, silicon carbonitride, silicon oxycarbonitride, silicon oxide, a low-k dielectric material, other suitable materials, or combinations thereof. In some embodiments, the dielectric layer 215 has a multi-layer structure. In this regard, the dielectric layer 215 may include an inner layer disposed over an outer layer, where the outer layer includes a dielectric material having a higher dielectric constant than the inner layer. For example, the dielectric layer 215 may include an inner layer having silicon oxide disposed over an outer layer having one or more of silicon nitride, silicon carbide, silicon oxynitride, silicon oxycarbide, silicon carbonitride, and silicon oxycarbonitride. In further embodiments, the dielectric layer 215 includes a dielectric material having a dielectric constant less than that of dielectric material included in the dielectric layer 214. For example, the dielectric layer 215 may include silicon oxide and the dielectric layer 214 may include silicon nitride.

In the present embodiments, the composition of the dielectric layer 214 is configured to be different from that of the dielectric layer 210, such that portions of the dielectric layer 210 can be selectively etched with respect to the dielectric layer 214. The dielectric layer 215 may be configured with a composition that is similar to or different from that the dielectric layer 211. The dielectric layers 214 and 215 may each be formed to any suitable thickness over the SiGe cladding layers 213 to ensure that the exposed trenches are filled. In some embodiments, a volume of the dielectric layer 215 is greater than that of the dielectric layer 214 to reduce the overall parasitic capacitance of the dielectric fin 212.

In the present embodiments, method 100 forms the dielectric fin 216 in a series of processes similar to those implemented for forming the dielectric fin 212. For example, referring to FIGS. 8A-8C, forming the dielectric fin 216 includes depositing the dielectric layer 214 over the SiGe cladding layers 213 in the exposed trenches (e.g., the trenches 206a and 206b), depositing the dielectric layer 215 over the dielectric layer 214 to fill the exposed trenches, and planarizing the dielectric layers 214 and 215 by a CMP process to expose the semiconductor fins 204a-204d. In some embodiments, the dielectric layer 214 is conformally deposited in the trenches by a suitable method, such as ALD, CVD, other suitable methods, or combinations thereof. In some embodiments, the dielectric layer 215 is deposited by a suitable method, such as CVD, FCVD, ALD, SOG, other suitable methods, or combinations thereof. A curing or heat treatment may be performed after depositing the dielectric layer 215 to harden the dielectric material contained therein.

Figure 9C:
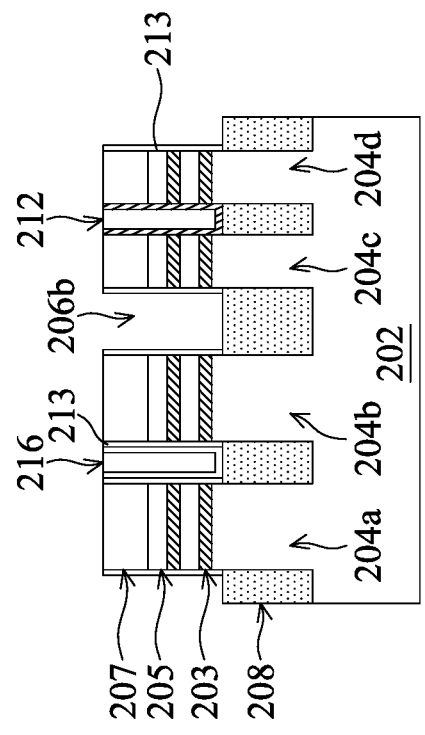
Figure 9A:
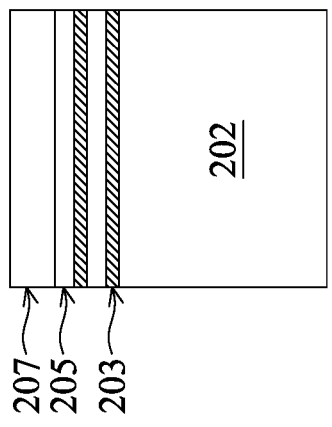
Figure 9B:
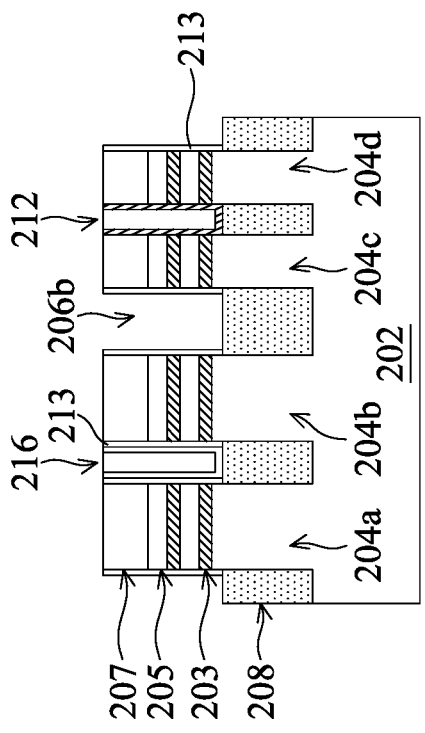
Figure 10A:
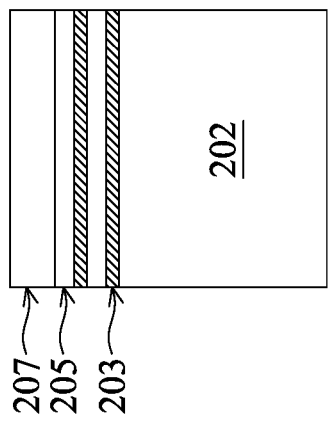
Figure 10C:
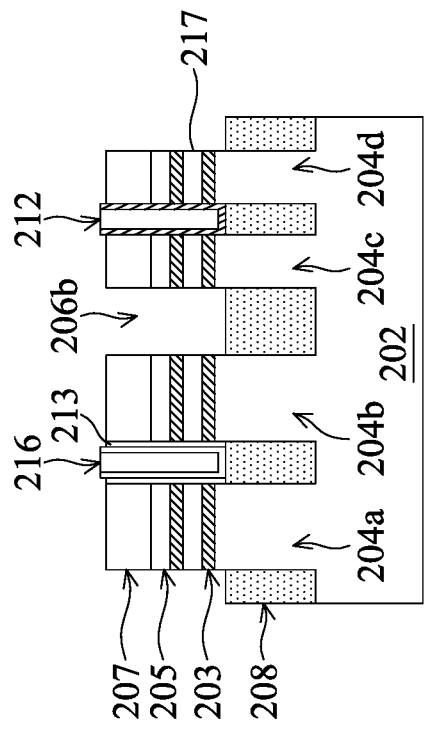
Figure 10B:
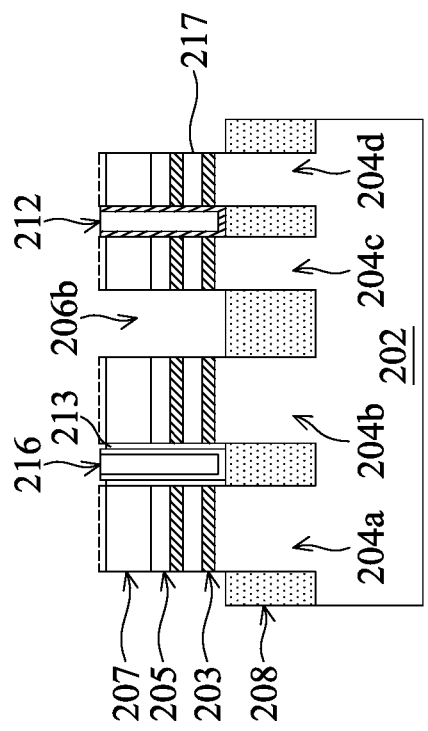
Figure 11A:
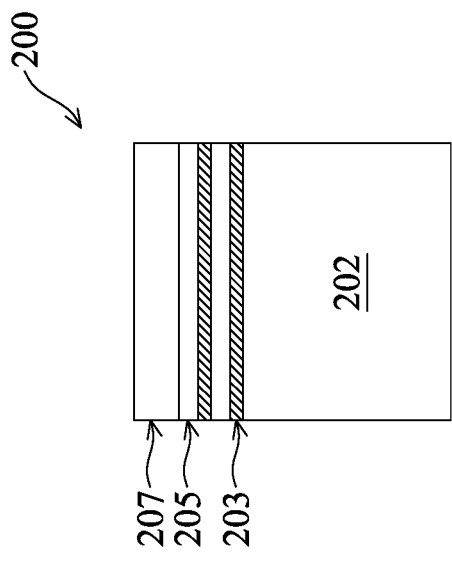
Figure 11B:
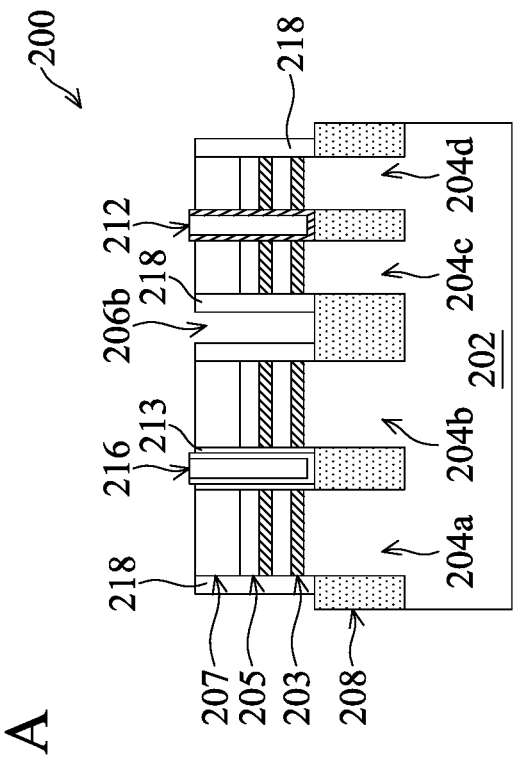
Figure 11C:
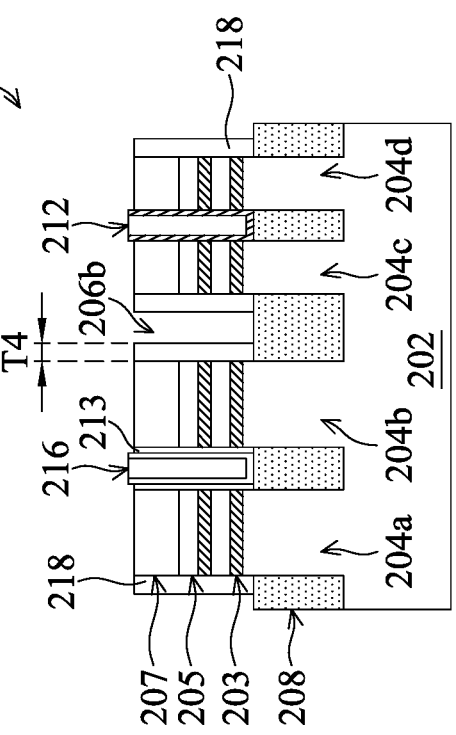
Figure 12A:
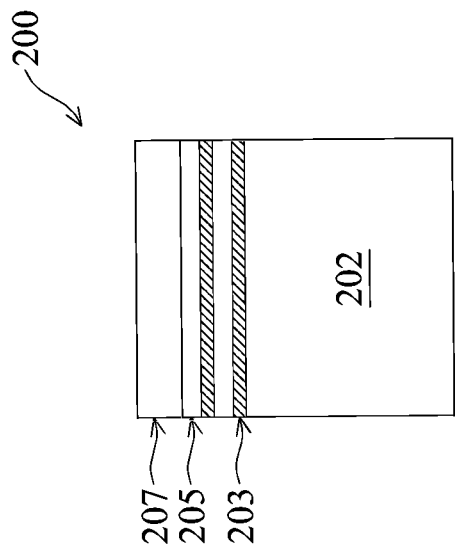
Figure 12C:
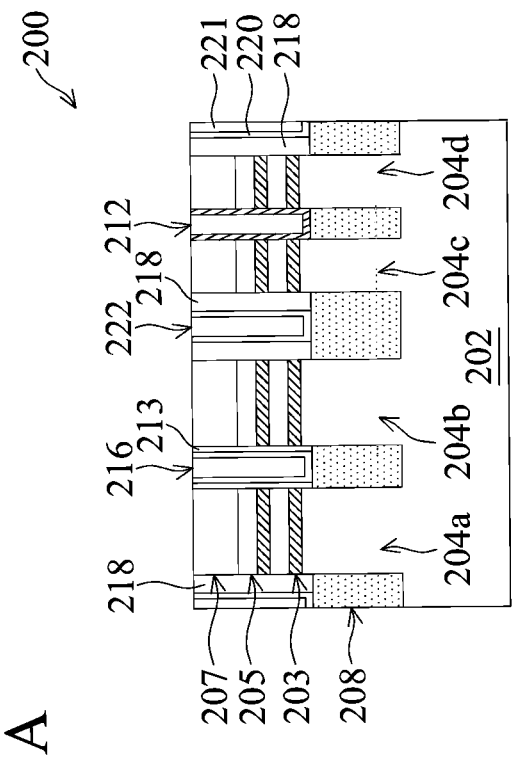
Figure 12B:
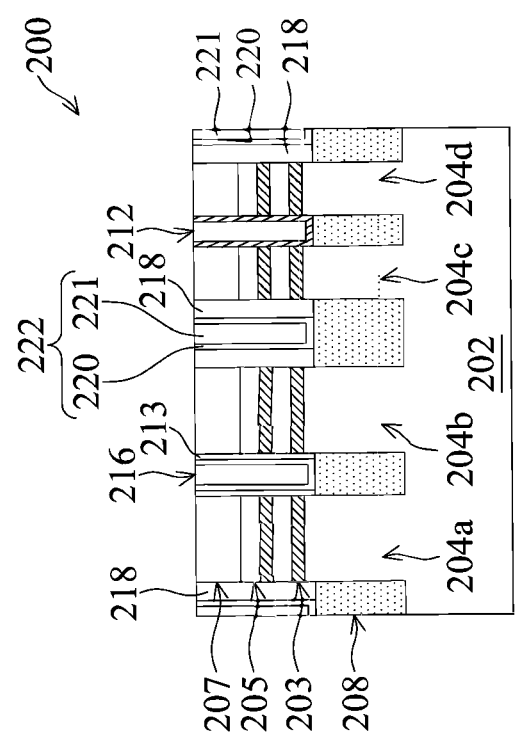
Figure 13A:
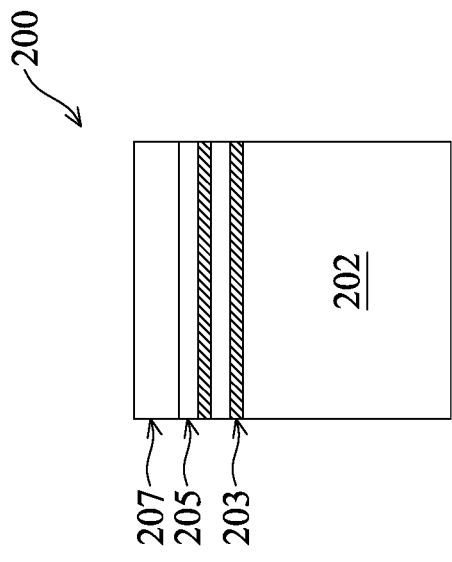
Figure 13C:
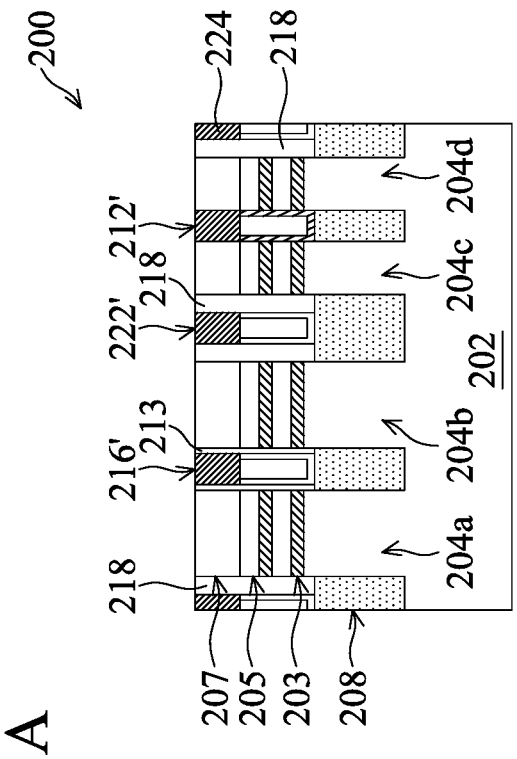
Figure 13B:
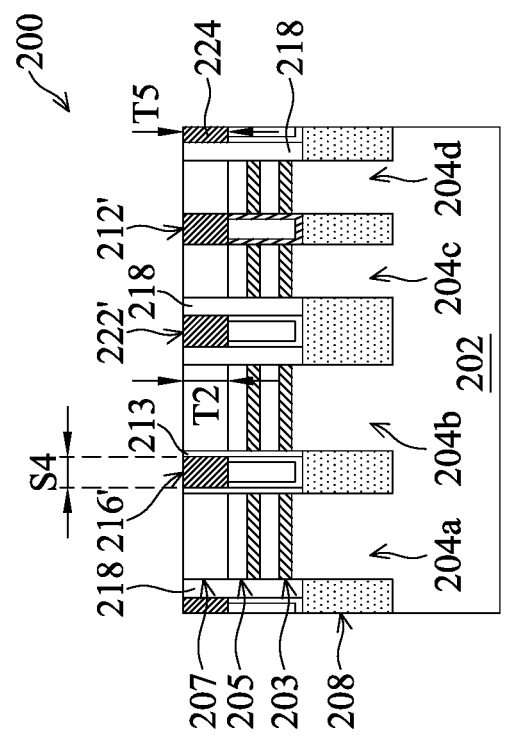
Figure 13D:
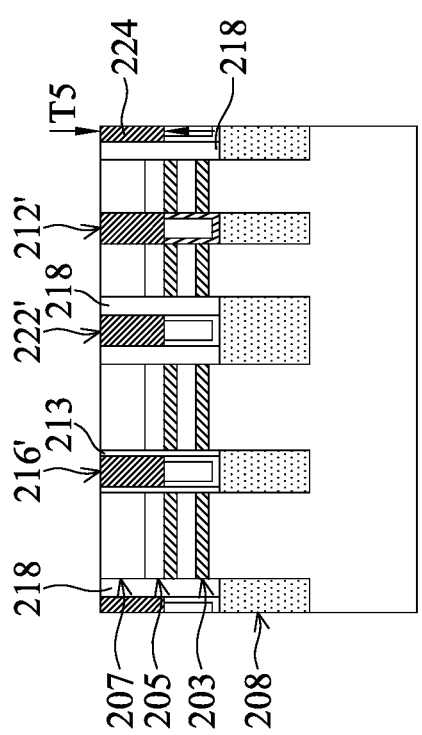
Figure 14A:
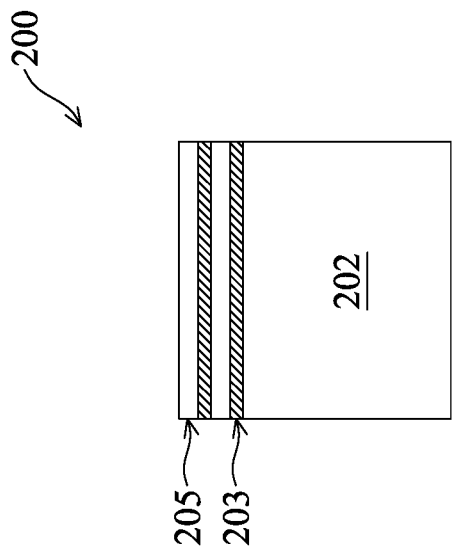
Figure 14C:
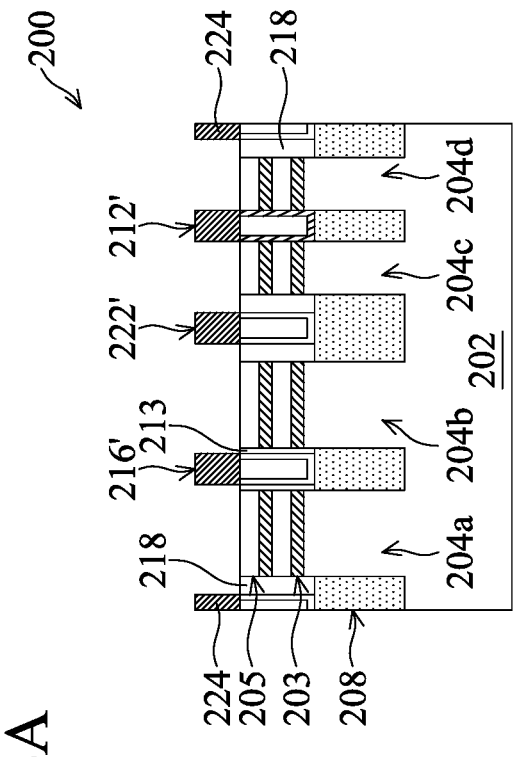
Figure 14B:
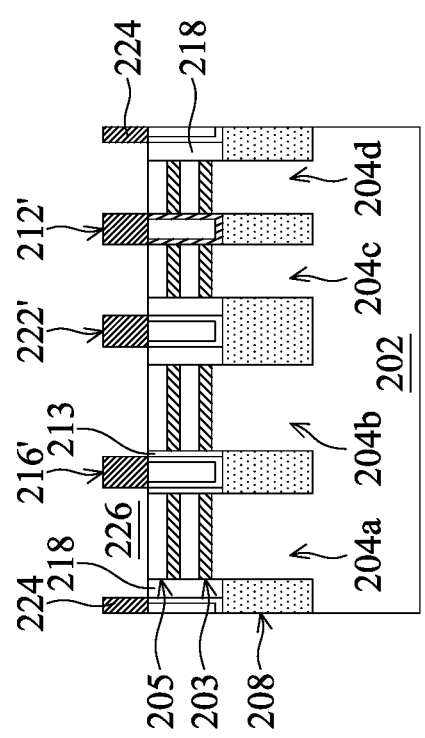

Thereafter, referring to FIGS. 9A-9C, forming the dielectric fin 216 further includes etching back at least portions of the dielectric layers 214 and 215, similar to the process depicted in FIGS. 6A-6C. The etching process may be a dry etching process, a wet etching process, an RIE process, other suitable processes, or combinations thereof, and may utilize any etchant(s) suitable for removing the dielectric materials included in the dielectric layers 214 and 215. In the present embodiments, the etching process selectively removes portions of the dielectric layers 214 and 215 to re-expose the trenches having relatively larger widths (e.g., the trench 206b), while portions of the dielectric layers 214 and 215 substantially remain in the trench or trenches having relatively smaller widths (e.g., the trench 206a) to form the dielectric fin 216. In the depicted embodiments, the dielectric fin 216 is defined by a width that is consistent with the width S1. In the present embodiments, due to the width S3 of the dielectric fin 212 being less than the width S1, the dielectric fin 212 remains substantially intact during the selective etching back of the dielectric layers 214 and 215.

Referring to FIGS. 1A and 10A-10C, method 100 at operation 112 removes portions of the SiGe cladding layers 213 from the exposed trenches (i.e., those not filled with the dielectric fins 212 and 216, such as the trench 206b) in an etching process. In some embodiments, as depicted by the dashed outline, removing the portions of the SiGe cladding layers 213 from the exposed trenches inadvertently removes top portions of the SiGe layer 207 and the SiGe cladding layers 213, such that the dielectric fins 212 and 216 protrude from the semiconductor fins 204a-204d. Nevertheless, it is noted that the SiGe layer 207 and the SiGe cladding layers 213 remain substantially intact during the etching process implemented at operation 112. In some embodiments, the etching process is a dry etching process that may implement any suitable etchant, such as a fluorine-containing etchant (e.g., HF, $F_2$, $NF_3$, other fluorine-containing etchants, or combinations thereof). Of course, other etching processes and/or etchants may also be applicable for removing the portions of the SiGe cladding layers 213.

Figure 7A:
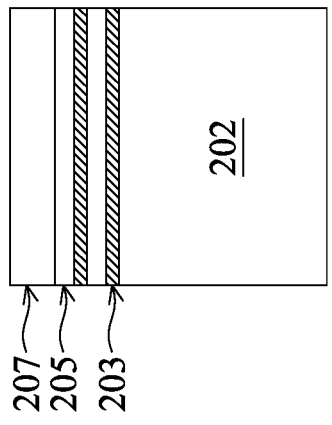
Figure 7C:
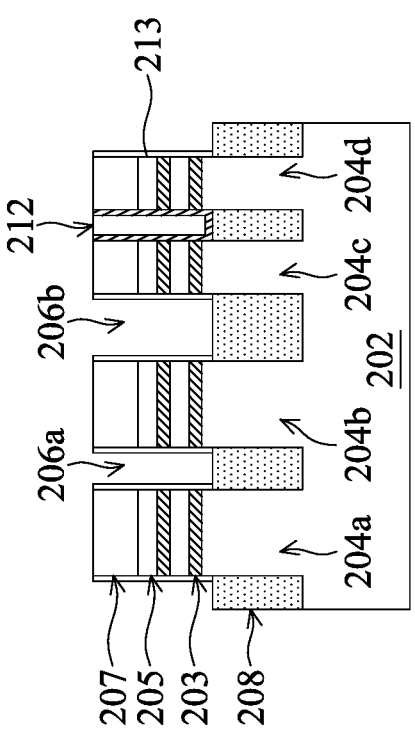
Figure 7B:
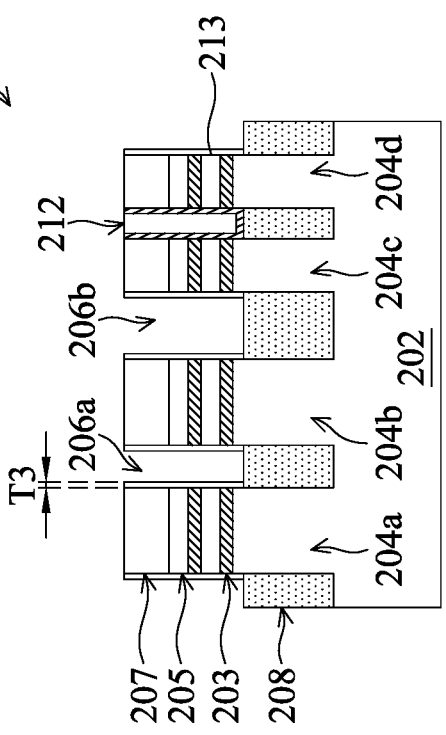
Figure 8A:
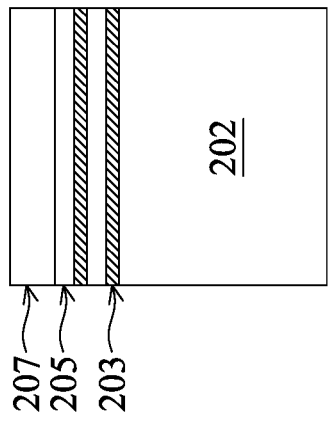
Figure 8C:
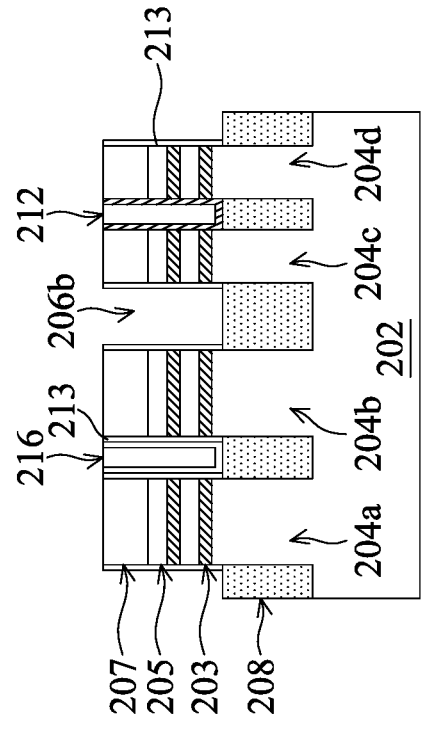
Figure 8B:
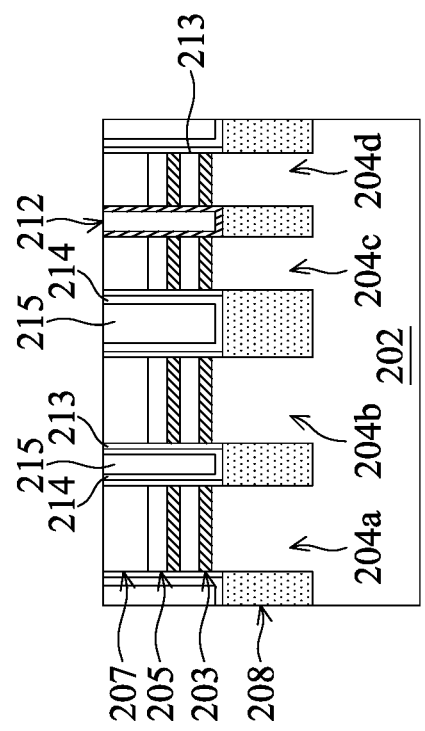

In some embodiments, subsequent to applying the etching process, removing the portions of the SiGe cladding layers 213 further includes applying a cleaning process similar to that discussed with respect to FIGS. 7A-7C, thereby forming an oxide layer 217 along sidewalls of the exposed trenches. In some embodiments, the oxide layer 217 promotes the bonding between the subsequently-formed SiGe cladding layers 218 and the sidewalls of the exposed trenches.

Referring to FIGS. 1A and 11A-11C, method 100 at operation 114 forms SiGe cladding layers 218 along the sidewalls of the exposed trenches (e.g., the trench 206b). In the present embodiments, because the width S2 of the trench 206b is greater than the width S1 of the trench 206a, the trench 206b allows the SiGe claddings layers 218 to be formed to a greater thickness T4 than the thickness T3 of the SiGe cladding layers 213. Considering that the width W2 of the semiconductor fin 204b is greater than the width W1 of the semiconductor fin 204a, a thicker SiGe cladding layer formed in the wider trenches allows greater exposure of the sidewalls of the semiconductor fin 204b to the etchant of the sheet formation process, thereby ensuring more complete removal of the SiGe layers 203.

As with the thickness T3 of the SiGe cladding layers 213 discussed above, the thickness T4 determines a spacing between the sidewall of the semiconductor fin 204b and a subsequently-formed dielectric fin (e.g., a dielectric fin 222) and the dimension of a subsequently-formed gate isolation feature. Furthermore, the thickness T4 is also configured to be large enough to accommodate the formation of the metal gate stack after removing the SiGe cladding layers 218. In some embodiments, the thickness T4 may be about 5 nm to about 14 nm. In this regard, if the thickness T4 is less than about 5 nm, the sidewall of the semiconductor fin 204b may not be sufficiently exposed during the sheet formation process, thereby limiting the removal of the SiGe layers 203 from the semiconductor fin 204b. In addition, the formation of the metal gate stack may be hindered due to a lack of space along the sidewall of the semiconductor fin 204b. On the other hand, if the thickness T4 is greater than about 14 nm, the gate isolation feature formed over the dielectric fin may not be large enough to provide insulation between adjacent metal gate stacks. In some embodiments, a ratio of the thickness T4 to the thickness T3 is about 1.7 to about 4.7.

Furthermore, because both the SiGe cladding layers 213 and 218 are to be removed together with the SiGe layers 203 (i.e., the non-channel layers) during the sheet formation process, the amount of Ge in the SiGe cladding layers 218 is configured such that the overall etching selectivity between the SiGe layers 203, the SiGe cladding layers 213, and the SiGe cladding layers 218 is minimized. In other words, the amount of Ge present in the SiGe cladding layers 218 may be tuned based on the thickness T3, the amount of Ge in the SiGe cladding layers 213, and the thickness T4 to ensure that the SiGe cladding layers 213 and 218 are removed at substantially the same rate. In this regard, given that the thickness T4 is configured to be greater than the thickness T3, the amount of Ge in the SiGe cladding layers 218 is less than the amount of Ge in the SiGe cladding layers 213. In some embodiments, the amount of Ge in the SiGe cladding layers 218 is about 70% to about 90% the amount of Ge in the SiGe cladding layers 213, which is about 25% to about 35% as discussed in detail above. Accordingly, in some examples, the amount of Ge in the SiGe cladding layers 218 may be about 17.5% to about 31.5%. It is noted that the present embodiments do not limit the amount of Ge in the SiGe cladding layers 218 to any specific values, so long as it allows the etching selectivity between the SiGe cladding layers 218 to be kept at a minimum at a given thickness T4.

In the present embodiments, method 100 forms the SiGe cladding layers 218 in a series of processes similar to those of forming the SiGe cladding layers 213. For example, forming the SiGe cladding layers 218 includes conformally depositing a SiGe layer in the exposed trenches and over top surfaces of the semiconductor fins 204a-204d and subsequently etching back portions of the SiGe layer to form the SiGe cladding layers 218 along sidewalls of the exposed trenches. In some embodiments, conformally depositing the SiGe layer includes performing a suitable process, such as ALD, CVD, other processes, or combinations thereof, followed by a CMP process to planarize the SiGe layer. In the present embodiments, etching back the SiGe layer to form the SiGe cladding layers 218 includes performing an anisotropic etching process (e.g., a dry etching process) to selectively remove portions of the SiGe layer over the isolation structures 208 and leave behind the SiGe cladding layers 218 along the sidewalls of the exposed trenches.

Referring now to FIGS. 1A and 12A-12C, method 100 at operation 116 forms the dielectric fin 222 over the SiGe cladding layers 218, thereby filling the remaining exposed trenches (e.g., the trench 206b). In the present embodiments, the dielectric fin 222 is a multi-layer structure including a dielectric layer 221 disposed over a dielectric layer 220, where the dielectric layers 220 and 221 have different compositions. In some embodiments, the dielectric layers 220 and 221 each include silicon nitride, silicon carbide, silicon oxynitride, silicon oxycarbide, silicon carbonitride, silicon oxycarbonitride, silicon oxide, other suitable materials, or combinations thereof. In some embodiments, the dielectric layer 221 has a multi-layer structure. In this regard, the dielectric layer 221 may include an inner layer disposed over an outer layer, where the outer layer includes a dielectric material having a higher dielectric constant than the inner layer. For example, the dielectric layer 221 may include an inner layer having silicon oxide disposed over an outer layer having one or more of silicon nitride, silicon carbide, silicon oxynitride, silicon oxycarbide, silicon carbonitride, and silicon oxycarbonitride. In further embodiments, the dielectric layer 221 includes a dielectric material having a dielectric constant less than that of dielectric material included in the dielectric layer 220. In this regard, an overall volume of the dielectric layer 221 is greater than that of the dielectric layer 220 to reduce the overall parasitic capacitance of the dielectric fin 212. In one such example, the dielectric layer 221 may include silicon oxide and the dielectric layer 220 may include silicon nitride.

In the present embodiments, the composition of the dielectric layer 220 is configured to be different from that of the dielectric layer 210, such that portions of the dielectric layer 210 can be selectively etched with respect to the dielectric layer 220. The present embodiments do not limit the composition of the dielectric layer 220 with respect to the dielectric layer 214, i.e., they may be the same or different. Furthermore, the dielectric layer 221 may be configured with a composition that is similar to or different from that the dielectric layers 211 and or 215. The dielectric layers 220 and 221 may each be formed to any suitable thickness over the SiGe cladding layers 218 to ensure that the remaining exposed trenches are filled.

In the present embodiments, method 100 forms the dielectric fin 222 in a series of processes similar to those implemented for forming the dielectric fin 212. For example, forming the dielectric fin 222 includes depositing the dielectric layer 220 over the SiGe cladding layers 218 in each of the remaining exposed trenches (e.g., the trench 206b), depositing the dielectric layer 221 over the dielectric layer 220 to fill the remaining exposed trenches, and planarizing the dielectric layers 220 and 221 by a CMP process to expose the semiconductor fins 204a-204d. In some embodiments, the dielectric layer 220 is conformally deposited in the trenches by a suitable method, such as ALD, CVD, other suitable methods, or combinations thereof. In some embodiments, the dielectric layer 221 is deposited by a suitable method, such as CVD, FCVD, ALD, SOG, other suitable methods, or combinations thereof. A curing or heat treatment may be performed after depositing the dielectric layer 221 to harden the dielectric material contained therein. As such, the dielectric fin 22 is defined by the width S2, which is greater than the widths S1 and S3. In the present embodiments, forming the dielectric fin 222 fills the remaining exposed trenches with the dielectric layers 220 and 221, such that the top surfaces of the semiconductor fins 204a-204d are substantially planar with those of the dielectric fins 212, 216, and 222.

Thereafter, referring to FIGS. 1B and 13A-13D, method 100 at operation 118 forms a dielectric feature (or a dielectric helmet) 224 over each of the dielectric fins 212, 216, and 222, such that the dielectric feature 224 is disposed between adjacent semiconductor fins 204a-204d. In the present embodiments, sidewalls of the dielectric feature 224 are defined by and in direct contact with the SiGe cladding layers 213, the SiGe cladding layers 218, or the sidewalls of the semiconductor fins 204a-204b. Stated differently, one of the dielectric features 224 formed over the dielectric fin 212 vertically extends the dielectric fin 216 along the sidewalls of the semiconductor fins 204c and 204d to form a dielectric fin 212', another one of the dielectric features 224 formed over the dielectric fin 216 vertically extends the dielectric fin 216 along the SiGe cladding layers 213 to form a dielectric fin 216', and yet another one of the dielectric features 224 formed over the dielectric fin 222 vertically extends the dielectric fin 222 along the SiGe cladding layers 218 to form a dielectric fin 222'. As discussed above, the thickness T3 of the SiGe cladding layers 213 determines, inter alia, a width S4 of the dielectric feature 224, where the width S4 is a difference of the width S1 and the thickness T3. Therefore, in some embodiments, a ratio of the thickness T3 to the width S4 is controlled to be about 0.1 to about 0.4 to ensure that the dielectric features 224 have a sufficient width to function as gate isolation features without significantly sacrificing the parasitic capacitance brought about by the dielectric feature 224 being too thick.

In some embodiments, the dielectric feature 224 includes a high-k (i.e., having a dielectric constant greater than that of silicon oxide, which is about 3.9) dielectric material, such as hafnium oxide ($HfO_2$), zirconium oxide ($ZrO_2$), hafnium aluminum oxide (HfAlOx), hafnium silicon oxide (HfSiOx), aluminum oxide ($Al_2O_3$), other suitable high-k dielectric materials, or combinations thereof. Alternatively or additionally, the dielectric feature 224 may include silicon nitride, silicon carbide, silicon oxynitride, silicon oxycarbide, silicon carbonitride, silicon oxycarbonitride, silicon oxide, other suitable materials, or combinations thereof. In the present embodiments, the dielectric feature 224 has a composition different from that of the dielectric fins 212, 216, and 222. In some embodiments, the dielectric feature 224 includes one or more dielectric material having a dielectric constant greater than that of the surrounding dielectric components, such as the dielectric fins 212, 216, and 222.

In some embodiments, forming the dielectric feature 224 includes selectively removing top portions of the dielectric fins 212, 216, and 222 without removing, or substantially removing, the SiGe layer 207, the SiGe cladding layers 213, and the SiGe cladding layers 218 in one or more etching process, depositing a dielectric material over the etched dielectric fins 212, 216, and 222, and planarizing the dielectric material in a CMP process to form the dielectric features 224. In some embodiments, the etching process at operation 118 includes a dry etching process, a wet etching process, an RIE process, other suitable processes, or combinations thereof. In some embodiments, a thickness T5 of the dielectric feature 224 is defined by the amount of the dielectric fins 212, 216, and 222 removed by the etching process, which may be controlled by a suitable parameter, such as the duration of etching. In some embodiments, referring to FIG. 13B, the thickness T5 is substantially the same as the thickness T2 of the SiGe layer 207. In some embodiments, referring to FIG. 13D, the thickness T5 is greater than the thickness T2, i.e., the dielectric feature 224 extends to below a top surface of the topmost Si layer 205 of the ML.

Referring to FIGS. 1B and 14A-14C, method 100 at operation 120 removes the SiGe layer 207, top portions of the SiGe cladding layers 213, and top portions of the SiGe cladding layers 218 from the device 200, thereby exposing the dielectric feature 224 in a trench 226. In the present embodiments, method 100 implements an etching process to remove the SiGe layer 207, portions of the SiGe cladding layers 213, and portions of the SiGe cladding layers 218 without removing, or substantially removing, the dielectric feature 224 or the Si layers 205. In other words, the etching process at operation 120 removes the SiGe-based materials at a substantially greater rate than the dielectric-based material and the Si-based material. The etching process may include a dry etching process, a wet etching process, an RIE process, or combinations thereof. In some embodiments, the etching process is a wet etching process that implements a suitable etchant, such as hydrogen peroxide ($H_2O_2$), a hydroxide (e.g., ammonium hydroxide ($NH_4OH$), tetramethylammonium hydroxide (TMAH), etc.), acetic acid ($CH_3COOH$), other suitable etchants, or combinations thereof. In some embodiments, the etching process is a dry etching process that implements a suitable etchant, such as a fluorine-containing etchant (e.g., HF, $F_2$, $NF_3$, other fluorine-containing etchants, or combinations thereof).

Now referring to FIGS. 1B and 15A-15C, method 100 at operation 122 forms a dummy gate stack (i.e., a placeholder gate) 230 over the dielectric fins 212', 216', and 222', as well as over channel regions of the semiconductor fins 204a-204d. In the present embodiments, the dummy gate stack 230, which includes polysilicon, is replaced with a metal gate stack after forming other components of the device 200. The dummy gate stack 230 may be formed by a series of deposition and patterning processes. For example, the dummy gate stack 230 may be formed by depositing a polysilicon layer over the device 200, and subsequently performing an anisotropic etching process (e.g., a dry etching process) to leave portions of the polysilicon over the dielectric fins 212', 216', and 222' and the semiconductor fins 204a-204d. In the present embodiments, the dummy gate stack 230 is formed over an interfacial layer 231, which may include silicon oxide and formed by a suitable method, such as thermal oxidation, chemical oxidation, other suitable methods, or combinations thereof. In the depicted embodiments, a hard mask layer 232 and a hard mask layer 233 are formed over the dummy gate stack 230 to protect the dummy gate stack 230 from being etched during subsequently operations. The hard mask layers 232 and 233 may differ in composition and may each include any suitable dielectric material, such as silicon nitride, silicon carbide, silicon oxynitride, silicon oxycarbide, silicon carbonitride, silicon oxycarbonitride, silicon oxide, a high-k dielectric material, a low-k dielectric material, other suitable materials, or combinations thereof. Each of the hard mask layers 232 and 233 may be formed by a suitable deposition process, such as CVD, ALD, PVD, other suitable processes, or combinations thereof. The hard mask layers 232 and 233 are later removed before removing the dummy gate stack 230 to form the metal gate stack.

Figure 15C:
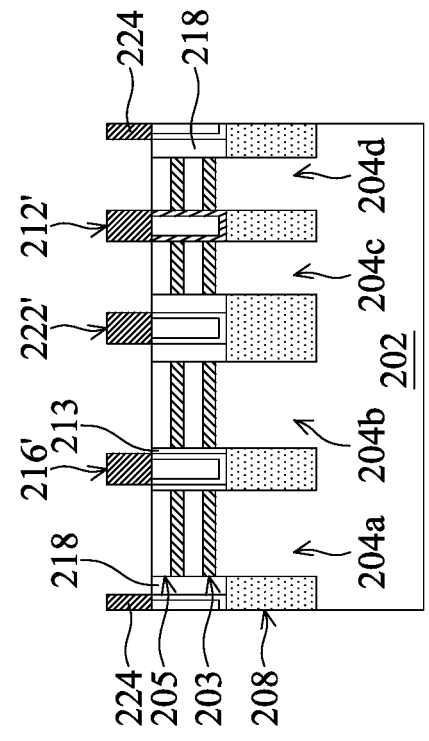
Figure 15A:
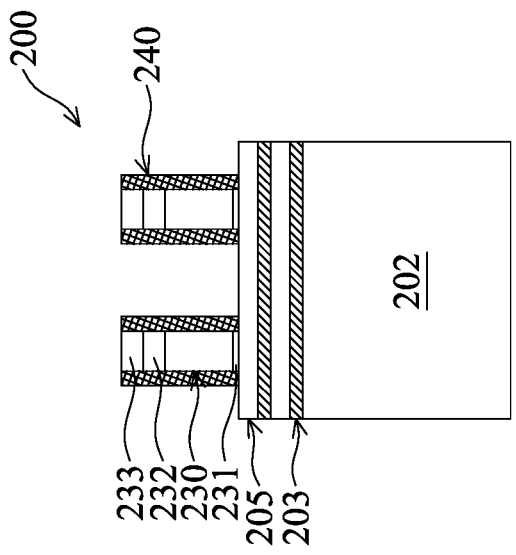
Figure 15B:
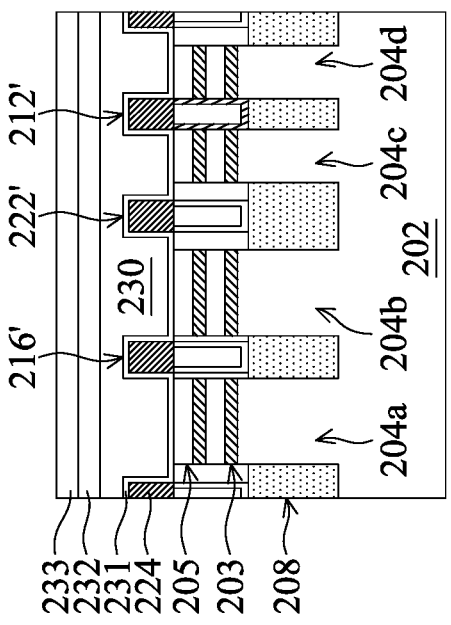
Figure 17A:
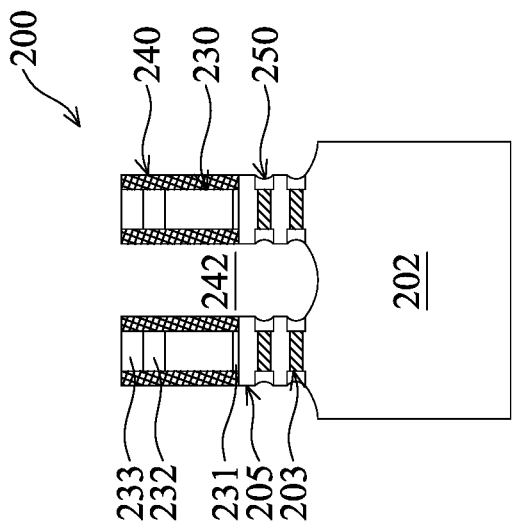
Figure 17C:
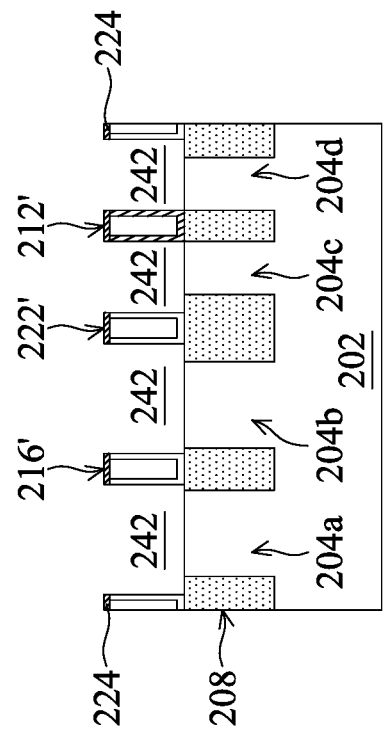
Figure 17B:
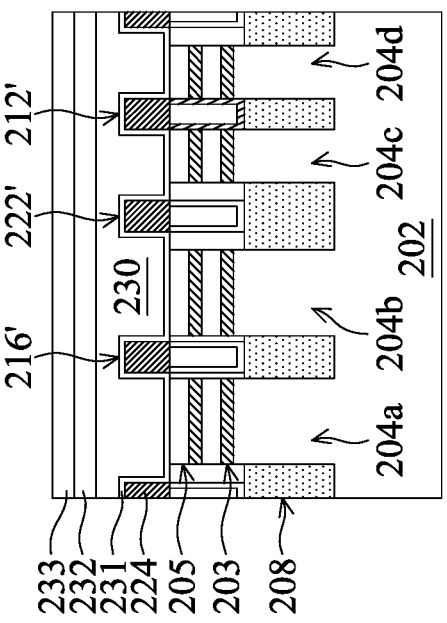

Subsequently, referring to FIG. 15A, method 100 forms top spacers 240 on sidewalls of the dummy gate stack 230. The top spacers 240 may be a single-layer structure or a multi-layer structure and may include silicon nitride, silicon carbide, silicon oxynitride, silicon oxycarbide, silicon carbonitride, silicon oxycarbonitride, silicon oxide, a high-k dielectric material, a low-k dielectric material, other suitable materials, or combinations thereof. Each spacer layer of the top spacers 240 may be formed by first depositing a dielectric layer over the dummy gate stack 230 and subsequently removing portions of the dielectric layer in an anisotropic etching process (e.g., a dry etching process), leaving portions of the dielectric layer on the sidewalls of the dummy gate stack 230 as the top spacers 240.

Referring to FIGS. 1B and 16A-16C, method 100 at operation 124 removes portions of the ML in the S/D regions of the semiconductor fins 204a-204d by a suitable etching process, thereby forming S/D recesses 242. In the present embodiments, method 100 at operation 124 implements an etchant configured to selectively remove the SiGe layers 203, the Si layers 205, the SiGe cladding layers 213, and the SiGe cladding layers 218 with respect to the dielectric fins 212', 216', and 222'. In some examples, method 100 may implement a dry etching process using a suitable etchant, such as a chlorine-containing etchant (e.g., $Cl_2$, $SiCl_4$, $BCl_3$, other chlorine-containing gas, or combinations thereof), a bromine-containing etchant (e.g., HBr), other suitable etchants, or combinations thereof. In some embodiments, a depth of the S/D recesses 242 is controlled by adjusting duration, temperature, pressure, source power, bias voltage, bias power, etchant flow rate, other suitable parameters, or combinations thereof of the etching process 302. In the depicted embodiments, the etching process is controlled such that the S/D recesses 242 extends to below the bottommost SiGe layer 203 of the ML. In some embodiments, after forming the S/D recesses 242, the dielectric features 224 are partially recessed at operation 124. The remaining portions of the dielectric features 224 may serve as a protective layer for the dielectric fins 212, 216, and 222 during subsequently processes, such as cleaning the S/D recesses 242 and/or forming inner spacers. In the present embodiments, because the SiGe cladding layers 213 and 218 are also removed, portions of the isolation structures 208 are exposed in the S/D recesses 242. A cleaning process may subsequently be performed to remove any etching residues in the S/D recesses 242 with hydrofluoric acid (HF) and/or other suitable solvents.

Subsequently referring to FIGS. 1B and 17A-17C, method 100 forms inner spacers 250 on sidewalls of the SiGe layers 203 exposed in the S/D recesses 242. In the present embodiments, forming the inner spacers 250 includes performing a series of etching and deposition process. For example, method 100 first selectively removes portions of the SiGe layers 203 without removing, or substantially removing, the Si layer 205, to form recesses (not depicted). In some embodiments, the etching process includes a dry etching process, a wet etching process, or a combination thereof, and is controlled by adjusting the duration of the etching to obtain recesses of desired depths. Subsequently, method 100 deposits a spacer layer along the sidewalls of the ML to fill the recesses and subsequently etches back portions of the spacer layer formed over the Si layers 205 to form the inner spacers 250. The inner spacers 250 may include silicon nitride, silicon carbide, silicon oxynitride, silicon oxycarbide, silicon carbonitride, silicon oxycarbonitride, silicon oxide, a high-k dielectric material, a low-k dielectric material, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), air, other suitable dielectric material, or combination thereof. The inner spacers 250 may each be configured as a single-layer structure or a multi-layer structure including a combination of the dielectric materials provided herein. In some embodiments, the inner spacers 250 have a different composition from that of the top spacers 240. In some embodiments, the inner spacers 250 and the top spacers 240 have substantially the same composition. Method 100 may form the spacer layer by any suitable deposition process, such as ALD, CVD, other suitable methods, or combinations thereof.

Now referring to FIGS. 18A-18D, method 100 at operation 126 forms epitaxial S/D features 252a and 252b in the S/D recesses 242. The epitaxial S/D features 252a and 252b may each be an n-type epitaxial S/D feature configured to form an n-type FET or a p-type epitaxial S/D feature configured to form a p-type FET. The n-type epitaxial S/D feature may include one or more epitaxial layers of silicon (epi Si) or silicon carbon (epi SiC) doped with an n-type dopant such as arsenic, phosphorus, other n-type dopants, or combinations thereof, and the p-type epitaxial S/D feature may include one or more epitaxial layers of silicon germanium (epi SiGe) doped with a p-type dopant such as boron, $BF_2$, germanium, indium, other p-type dopants, or combinations thereof. In the present embodiments, the epitaxial S/D features 252a and 252b have the same composition but differ in structure. For example, a sidewall of the epitaxial S/D feature 252b is defined by the dielectric fin 212, i.e., no air gap is disposed between the sidewall and the dielectric fin 212, while a sidewall of the epitaxial S/D feature 252a forms an air gap with the isolation structures 208 and one of the dielectric fins 216 and 222.

In the present embodiments, one or more epitaxy growth processes are performed to grow an epitaxial material in each S/D recess 242. For example, method 100 may implement an epitaxy growth process as discussed above with respect to forming the Si layers 205 and the SiGe layers 203 of the ML. In some embodiments, the epitaxial material is doped in-situ by adding a dopant to a source material during the epitaxy growth process. In some embodiments, the epitaxial material is doped by an ion implantation process after performing a deposition process. In some embodiments, an annealing process is subsequently performed to activate the dopants in the epitaxial S/D features 252a and 252b.

Figure 18A:
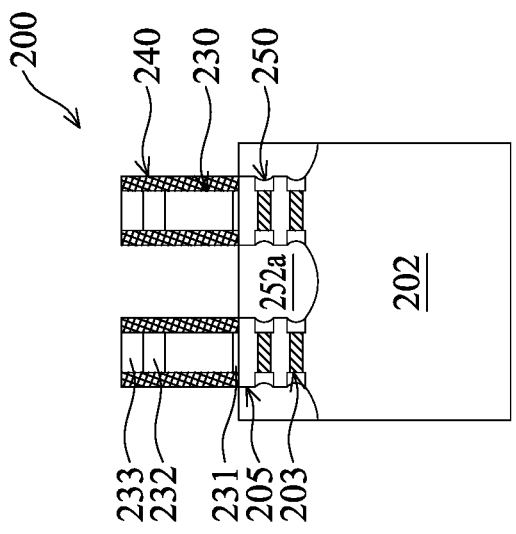
Figure 18C:
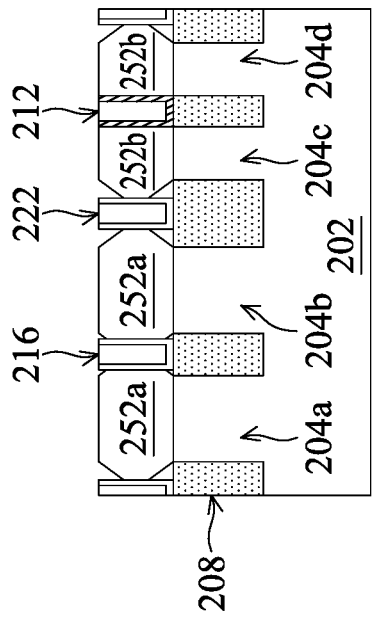
Figure 18B:
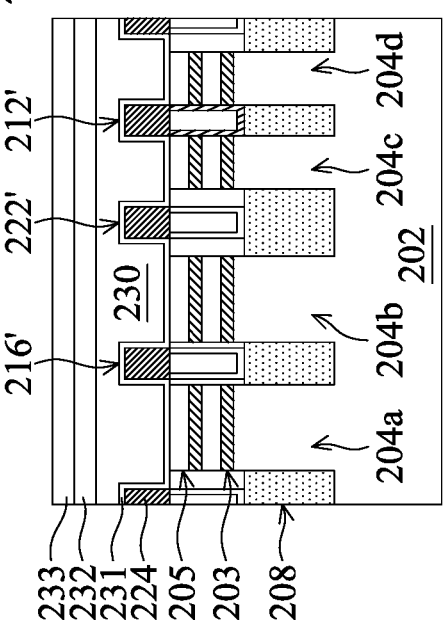
Figure 18D:
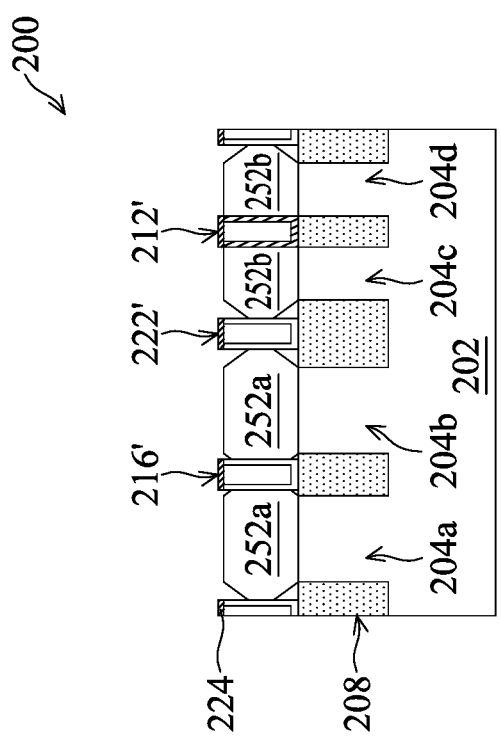

In some embodiments, referring to FIG. 18C, method 100 at operation 126 selectively removes the dielectric feature 224 from portions of the dielectric fins 212', 216', and 222' adjacent to the epitaxial S/D features 252a and 252b. Method 100 may remove the dielectric feature 224 in one or more etching process, such as a dry etching process. In some embodiments, referring to FIG. 18D, the recessed dielectric features 224 remain as the top portions of the dielectric fins 212', 216', and 222', which protrude from top surfaces of the epitaxial S/D features 252a and 252b. Embodiments depicted in FIGS. 18C and 18D are equally applicable in the present disclosure. For purposes of simplicity, however, the following operations of method 100 are discussed using the embodiment depicted in FIG. 18C as an example.

Subsequently, referring to FIGS. 19A-19C, method 100 forms an etch-stop layer (ESL) 260 over the epitaxial S/D features 252a and 252b and an interlayer dielectric (ILD) 262 over the ESL 260. The ESL 260 may include silicon nitride, silicon carbide, silicon oxynitride, silicon oxycarbide, silicon carbonitride, silicon oxycarbonitride, silicon oxide, a high-k dielectric material, aluminum nitride, a high-k dielectric material, other suitable materials, or combinations thereof, and may be formed by CVD, ALD, PVD, other suitable methods, or combinations thereof. The ILD layer 262 may include silicon oxide, a low-k dielectric material, TEOS, doped silicon oxide (e.g., BPSG, FSG, PSG, BSG, etc.), other suitable dielectric materials, or combinations thereof. In the depicted embodiments, the ILD layer 262 is a multi-layer structure having a sublayer 262b disposed over a sublayer 262a. The sublayers of the ILD layer 262 may include different compositions, and may each be formed by CVD, FCVD, ALD, other suitable methods, or combinations thereof. One or more CMP process may be performed to planarize the ILD layer 262.

Thereafter, referring to FIGS. 1B and 1C, method 100 proceeds to forming a metal gate stack in a series of operations along Pathway A as depicted in FIGS. 20A-28D or along Pathway B as depicted in FIGS. 29A-38F. In the present embodiments, both pathways are applicable and are interchangeable depending on specific design considerations. For example, method 100 may proceed from operation 126 to operation 128 to pattern the dielectric features 224. Alternatively, method 100 may proceed from operation 126 to operation 130 to remove the dummy gate stack 230 to form a gate trench. For purposes of clarity, Pathways A and B are discussed separately below.

Collectively referring to FIGS. 1B and 20A-22D, method 100 at operation 128 (along Pathway A) selectively removes some of the dielectric features 224, such that the remaining dielectric features 224 are configured as gate isolation features for separating adjacent metal gate stacks. Referring to FIGS. 20A-20D, method 100 proceeds to selectively recessing portions of the dummy gate stack 230 to expose top portions of the dielectric features 224 (with portions of the interfacial layer 231 disposed over the exposed dielectric features 224). In the present embodiments, method 100 implements an etching process, such as a dry etching process or a wet etching process, to selectively remove portions of the dummy gate stack 230 without removing, or substantially removing, the dielectric features 224. Accordingly, the dielectric features 224 protrudes from the recessed dummy gate stack 230.

Referring to FIGS. 21A-21D, method 100 then forms a patterned masking element 264 over the device 200, such that some of the dielectric features 224 are under the patterned masking element 264, while others remain exposed. In the depicted embodiments, the patterned masking element 264 protects the dielectric fins 212' and 216' and exposes the dielectric fin 222'. The patterned masking element 164 may be similar to that discussed above with respect to forming the semiconductor fins 204a-204d.

Subsequently, referring to FIGS. 22A-22D, the exposed dielectric features 224 are removed with respect to the recessed dummy gate stack 230. In the depicted embodiments, referring to FIGS. 22B and 22D, the dielectric fin 222 (without the dielectric feature 224 thereover) is exposed, while the dielectric features 224 remain over the dielectric fins 212 and 216. In other words, portions of the recessed dummy gate stack 230 are separated by openings resulted from the selective removal of the exposed dielectric features 224. In the present embodiments, method 100 implements an etching process, such as a dry etching process, a wet etching process, an RIE process, or combinations thereof to remove the exposed portions of the dielectric feature 224 without removing, or substantially removing, the dummy gate stack 230 and the ILD layer 262. As provided herein, the portions of the dielectric feature 224 that remain in the device 200 (i.e., as portions of the dielectric fins 212' and 216') subsequently become gate isolation features configured to separate adjacent metal gate stacks. Thereafter, the patterned masking element 264 is removed from the device 200 by any suitable method, such as resist stripping and/or plasma ashing.

Referring to FIGS. 1B and 23A-23C, method 100 at operation 130 removes the recessed dummy gate stack 230 to form a gate trench 266 between the top spacers 240. The recessed dummy gate stack 230 may be removed by any suitable etching process, such as a wet etching process, which does not remove, or substantially remove, the remaining dielectric features 224. In other words, the remaining dielectric features 224 protrude from the top surface of the semiconductor fins 204a-204d and the dielectric fin 222. In the present embodiments, method 100 at operation 130 also removes the interfacial layer 231 from the device 200.

Figure 24D:
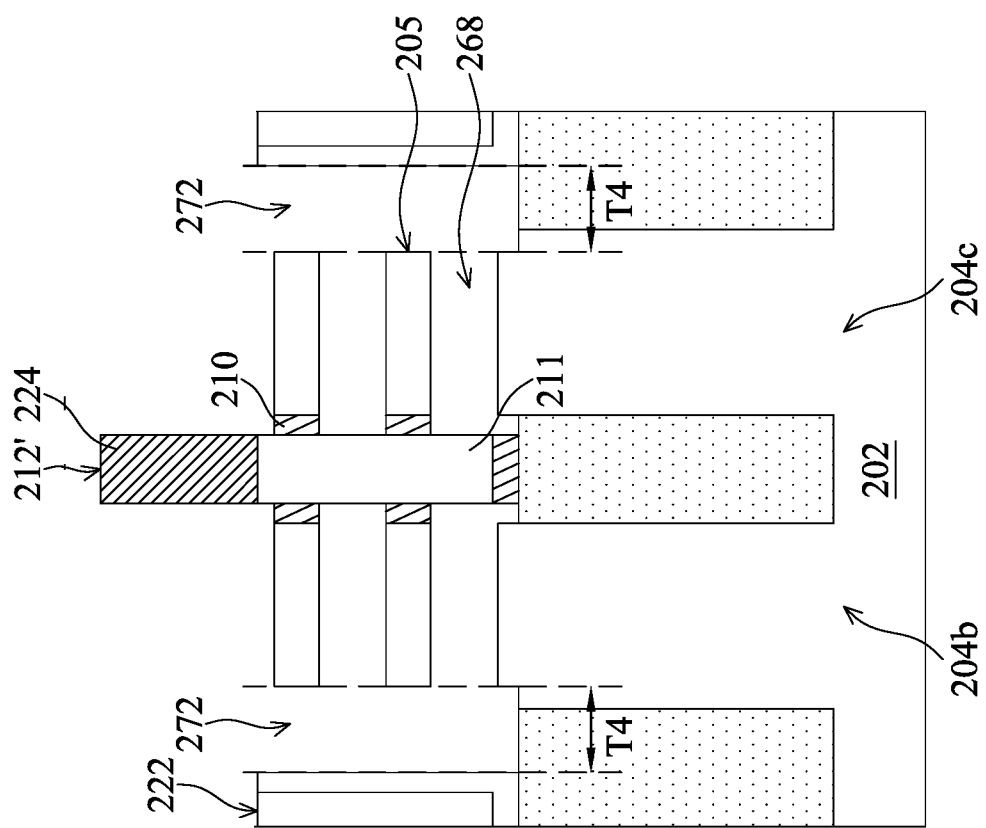

Referring to FIGS. 1B and 24A-24D, method 100 at operation 132 forms openings 268 between the Si layers 205, openings 270 along the sidewalls of the dielectric fin 216, and openings 272 along the sidewalls of the dielectric fin 222. In other words, method 100 at operation 132 removes the SiGe-based layers, including the SiGe layers 203, the SiGe cladding layers 213, and the SiGe cladding layers 218, without removing or substantially removing the Si layers 205 and the dielectric features 224 in a selective etching process. FIG. 24D provides an enlarged view of a portion of the device 200 enclosed in the dashed outline of FIG. 24B to better illustrate details of the present embodiments.

As discussed above, the amount of Ge and the thickness of the each of the SiGe cladding layers 213 and 218 are configured together to ensure that they exhibit similar or substantially the same etching rate as the SiGe layers 203. In the present embodiments, the etching process at operation 132 includes a dry etching process, a wet etching process, an RIE process, or combinations thereof, where an etching selectivity between Si (in the Si layers 205) and SiGe is substantial, such that the Si layers 205 remain substantially intact.

Accordingly, in the present embodiments, the stacks of the Si layers 205 are separated from their adjacent dielectric fins by openings 270 or 272. Because the SiGe cladding layers 213 and 218 are defined by thicknesses T3 and T4, respectively, the widths of the openings 270 and 272 are accordingly defined by the same dimensions. In this regard, the separation between the dielectric fin 216 and an adjacent stack of Si layers 205 is narrower than the separation between the dielectric fin 222 and an adjacent stack of Si layers 205.

In further embodiments, as depicted herein, the etching process at operation 132 selectively removes portions of the dielectric layer 210 in contact with the SiGe layers 203 without removing, or substantially removing, the dielectric layer 211, such that portions of the dielectric layer 211 are exposed in the openings 268 between the remaining Si layers 205. Furthermore, due to the absence of any SiGe cladding layer, the dielectric fin 212 remains physically connected with the adjacent stack of Si layers 205. Specifically, portions of the dielectric layer 211 are connected to the Si layers 205 by the remaining portions of the dielectric layer 210, resulting in a fork-like structure with the Si layers 205 tethered to the remaining portions of the dielectric fin 212.

As discussed above, the semiconductor fins 204a and 204b are defined by the widths W1 and W2, respectively, which are greater than the widths W3 and W4 of the semiconductor fins 204c and 204d, respectively. In some instances, the greater widths may require longer etching duration to allow adequate etchant loading between the Si layers 205. This may be difficult to achieve if the dielectric fins (e.g., the dielectric fins 216 and 222) are physically connected with both sidewalls of the semiconductor fins. In the present embodiments, the openings 270 and 272 resulting from the removal of the SiGe cladding layers provide access for the etchant applied at operation 132 to reach center portions of the SiGe layers 203 from at least one sidewall during the sheet formation process, thereby increasing the amount of etchant loading provided between the Si layers 205 to ensure the complete removal of the SiGe layers 203. In contrast, the sheet formation process in the narrower semiconductor fins 204c and 204d may not require more than one sidewall to be fully separated from an adjacent dielectric fin. In this regard, the fork-like structure is sufficient to allow complete removal of the SiGe layers 203 from the semiconductor fins 204c and 204d during the sheet formation process.

Figure 25A:
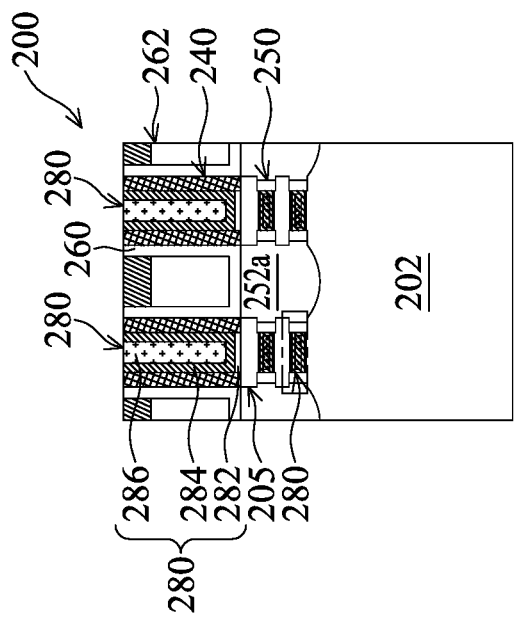
Figure 25C:
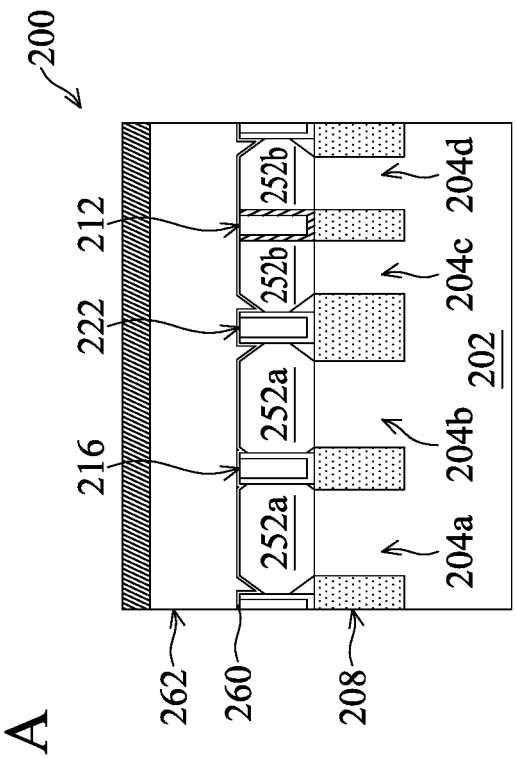
Figure 25B:
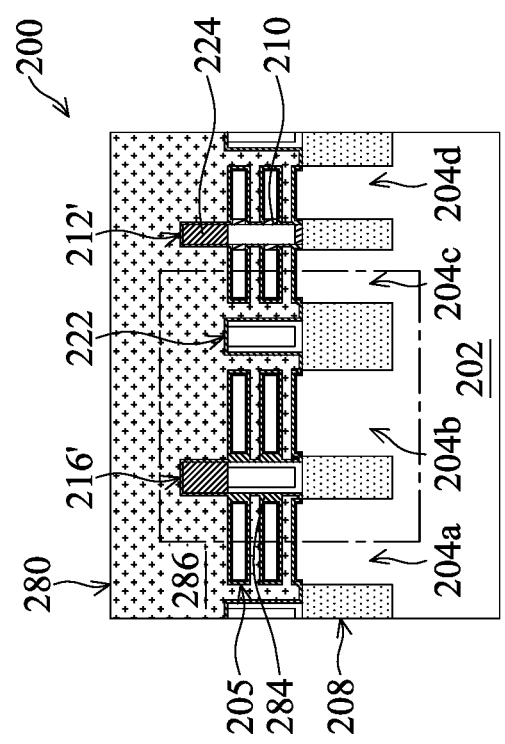
Figure 25E:
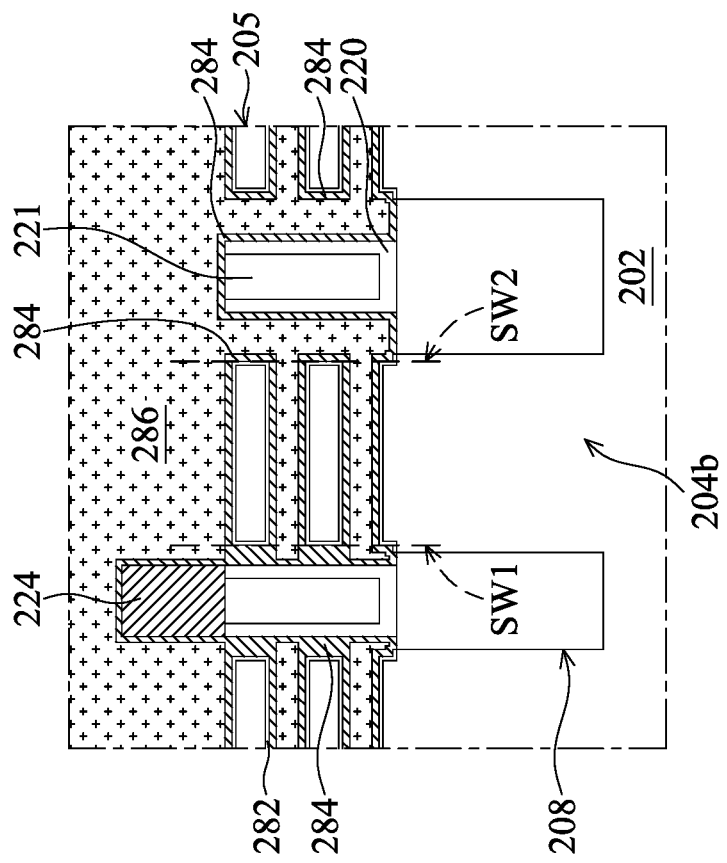
Figure 25D:
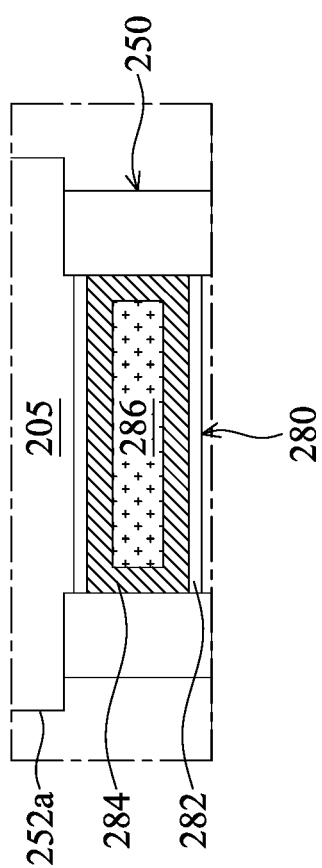

Now referring to FIGS. 1C and 25A-25E, method 100 at operation 134 forms a metal gate stack 280 to fill the gate trench 266 and the openings 268, 270, and 272. In the present embodiments, a top surface of the metal gate stack 280 is above a top surface of the dielectric features 224 (i.e., the dielectric fins 212' and 216'), such that the dielectric features 224 are completely embedded in the metal gate stack 280. FIGS. 25D and 25E each provide an enlarged view of a portion of the metal gate stack 280 enclosed in the dashed outline of FIGS. 25A and 25B, respectively, to better illustrate details of the present embodiments.

In the present embodiments, the metal gate stack 280 includes at least an interfacial layer 282 over the Si layers 205, a gate dielectric layer 284 over the interfacial layer 282, and a metal gate electrode 286 over the gate dielectric layer 284. In some embodiments, the interfacial layer 282 includes an oxide material, such as silicon oxide. The gate dielectric layer 284 may include any suitable dielectric material, such as a high-k dielectric material (e.g., hafnium oxide, lanthanum oxide ($La_2O_3$), zirconium oxide, hafnium aluminum oxide, hafnium silicon oxide, aluminum oxide, other suitable high-k dielectric materials, or combinations thereof), other suitable materials, or combinations thereof. The metal gate electrode 286 includes at least a conductive fill layer (not depicted separately) over a work-function metal layer (not depicted separately). The wok-function metal layer may be a single-layer structure or a multi-layer structure including at least a p-type work-function metal layer, an n-type work-function metal layer, or a combination thereof. Example work function metals include TiN, TaN, WN, $ZrSi_2$, $MoSi_2$, $TaSi_2$, $NiSi_2$, Ti, TaAl, TaAlC, TiAlN, TaC, TaCN, TaSiN, Mn, Zr, other suitable work function metals, or combinations thereof. The conductive fill layer may include Cu, W, Al, Co, Ru, other suitable materials, or combinations thereof. The metal gate stack 280 may further include other layers (not depicted), such as a capping layer, a barrier layer, other suitable layers, or combinations thereof. Various layers of the metal gate stack 280 may be formed by any suitable method, such as chemical oxidation, thermal oxidation, ALD, CVD, PVD, plating, other suitable methods, or combinations thereof.

In the present embodiments, due to the difference between the thicknesses T3 and T4, materials formed in the openings 270 differ from those formed in the openings 272 in composition. For example, referring to FIG. 25E, after forming the interfacial layer 282 and the gate dielectric layer 284, the openings 270 (width defined by the thickness T3) are completely filled and are thus free, or substantially free, of the metal gate electrode 286 that is subsequently deposited. In contrast, the openings 272 (width defined by the widthicknessth T4) are sufficiently wide to be filled with the interfacial layer 282, the gate dielectric layer 284, and the metal gate electrode 286. As such, an entirety of the metal gate stack 280, including the metal gate electrode 286, is disposed along only one of the sidewalls, SW2, of the stack of Si layers 205 in the semiconductor fin 204b, while the other one of the sidewalls, SW1, of the stack of Si layers 205 is free of the metal gate electrode 286.

Subsequently, referring to FIGS. 1C, 26A-26C method 100 at operation 140 selectively recesses the metal gate stack 280 to form a trench 290 that exposes the dielectric features 224. In the present embodiments, method 100 selectively removes a top portion of the metal gate stack 280 without removing, or substantially removing, the dielectric features 224. The etching process at operation 136 may include any suitable method, such as a dry etching process, a wet etching process, RIE, other suitable methods, or combinations thereof, utilizing one or more etchant configured to selectively etch components of the metal gate stack 280.

In the present embodiments, the etching process at operation 136 is controlled such that a top surface of the recessed metal gate stack 280 is below a top surface of the dielectric features 224. In other words, the dielectric features 224 protrude from the top surface of the recessed metal gate stack 280, thereby separating the metal gate stack 280 into multiple portions. For this reason, the dielectric features 224 are alternatively referred to as gate isolation features 224. In the present embodiments, the amount of the metal gate stack 280 removed during the etching process is controlled by tuning one or more parameters, such as etching duration, of the etching process, where a longer etching duration increases a depth of the trench 290. In some examples, the remaining portions of the metal gate stack 280 over the topmost Si layer 205 may be about 4 nm to about 14 nm in height. If the height of the remaining portions of the metal gate stack 280 is less than about 4 nm, the overall threshold voltage ($V_t$) to gate resistance ($R_g$) may suffer inadvertently. On the other hand, if such height exceeds about 14 nm, the parasitic capacitance may increase, which is undesirable for the performance of the device 200.

Figure 27A:
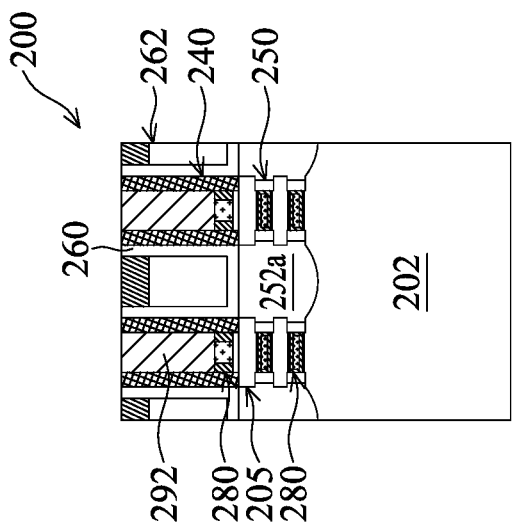
Figure 27C:
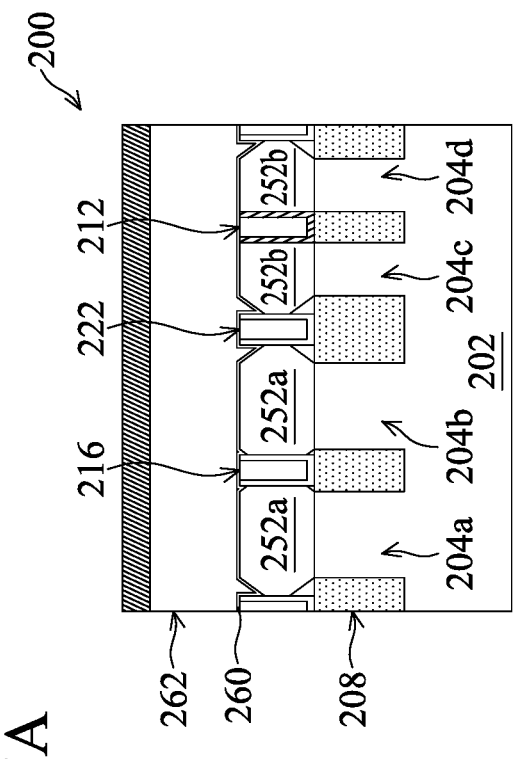

In some embodiments, as depicted in FIGS. 27A-28D, method 100 at operation 142 subsequently proceeds to forming a dielectric layer 292 over the exposed portions of the dielectric feature 224 in the trench 290. Referring to FIGS. 27A-27C, method 100 at operation 140 deposits the dielectric layer 292 over the device 200 to fill the trench 290. In the present embodiments, the dielectric layer 292 is configured to provide self-alignment capability and etching selectivity during subsequent fabrication processes including, for example, patterning the ILD layer 262 to form S/D contact openings over the epitaxial S/D features 252a and 252b. Accordingly, in the present embodiments, the dielectric layer 292 has a composition different from that of the ILD layer 262. In some embodiments, the dielectric layer 292 includes silicon nitride, silicon carbide, silicon oxynitride, silicon oxycarbide, silicon carbonitride, silicon oxycarbonitride, other suitable materials, or combinations thereof. In some embodiments, the dielectric layer 292 has the same composition as the dielectric features 224. The dielectric layer 292 may be deposited by any suitable method, such as CVD, ALD, PVD, other suitable methods, or combinations thereof. Subsequently, method 100 removes portions of the dielectric layer 292 formed over the ILD layer 262 in one or more CMP process, thereby planarizing the top surface of the device 200.

Thereafter, method 100 at operation 170 may perform additional processing steps to the device 200. For example, method 100 may form S/D contacts (not depicted) over one or more of the epitaxial S/D features 252a and 252b. Each S/D contact may include any suitable conductive material, such as Co, W, Ru, Cu, Al, Ti, Ni, Au, Pt, Pd, other suitable conductive materials, or combinations thereof. Method 100 may form an S/D contact opening in the ILD layer 262 via a series of patterning and etching processes and subsequently deposit a conductive material in the S/D contact opening using any suitable method, such as CVD, ALD, PVD, plating, other suitable processes, or combinations thereof. In some embodiments, a silicide layer (not depicted) is formed between the epitaxial S/D features 252a and 252b and their respective S/D contacts. The silicide layer may include nickel silicide, cobalt silicide, tungsten silicide, tantalum silicide, titanium silicide, platinum silicide, erbium silicide, palladium silicide, other suitable silicide, or combinations thereof. The silicide layer may be formed over the device 200 by a deposition process such as CVD, ALD, PVD, or combinations thereof. Subsequently, though not depicted, method 100 may form additional features over the device 200, such as an ESL disposed over the ILD layer 262, an ILD layer disposed over the ESL, a gate contact in the ILD layer to contact the metal gate stack 280, vertical interconnect features (e.g., vias), horizontal interconnect features (e.g., conductive lines), additional intermetal dielectric layers (e.g., ESLs and ILD layers), other suitable features, or combinations thereof.

Figure 27B:
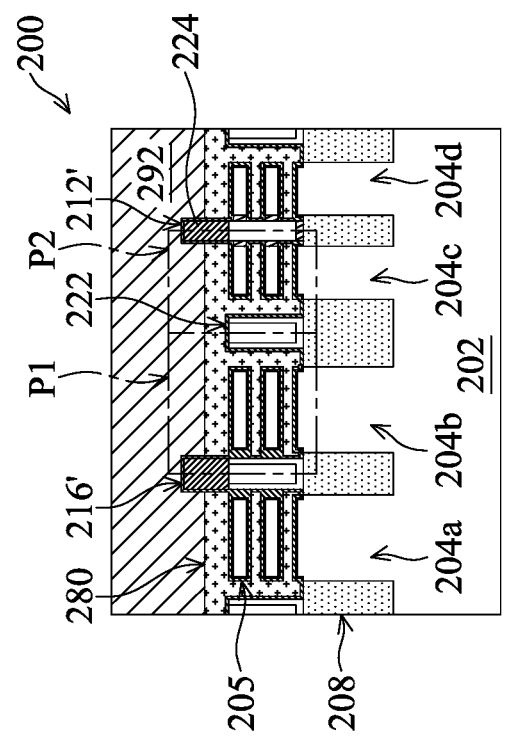

FIGS. 28A-28D depict various aspects of the present embodiments as shown in FIG. 27B in greater detail. Specifically, FIGS. 28A and 28C each depict a portion P1 indicated in FIG. 27B, and FIGS. 28B and 28D each depict a portion P2 indicated in FIG. 27B. As discussed above with respect to FIG. 25E, after forming the interfacial layer 282 on surfaces of the Si layers 205, the gate dielectric layer 284 is deposited over the interfacial layer 282 as well as along sidewall of the dielectric fin 216', which includes the dielectric feature 224, such that the gate dielectric layer 284 fills the openings 270. In other words, the gate dielectric layer 284 laterally extends the sidewall SW1 with the dielectric fin 216'. On the other hand, because the openings 272 are larger than the openings 270, depositing the gate dielectric layer 284 does not completely fill the openings 272 along the sidewall SW2, and the metal gate electrode 286 is subsequently formed over the gate dielectric layer 284 to fill the openings 272. In other words, the metal gate electrode 286 separates the sidewall SW2 from the dielectric fin 222. For at least this reason, the ratio of the thickness T4 to the thickness T3 as discussed in detail above considers the difference in the material layers formed along the sidewalls SW1 and SW2.

Figure 28B:
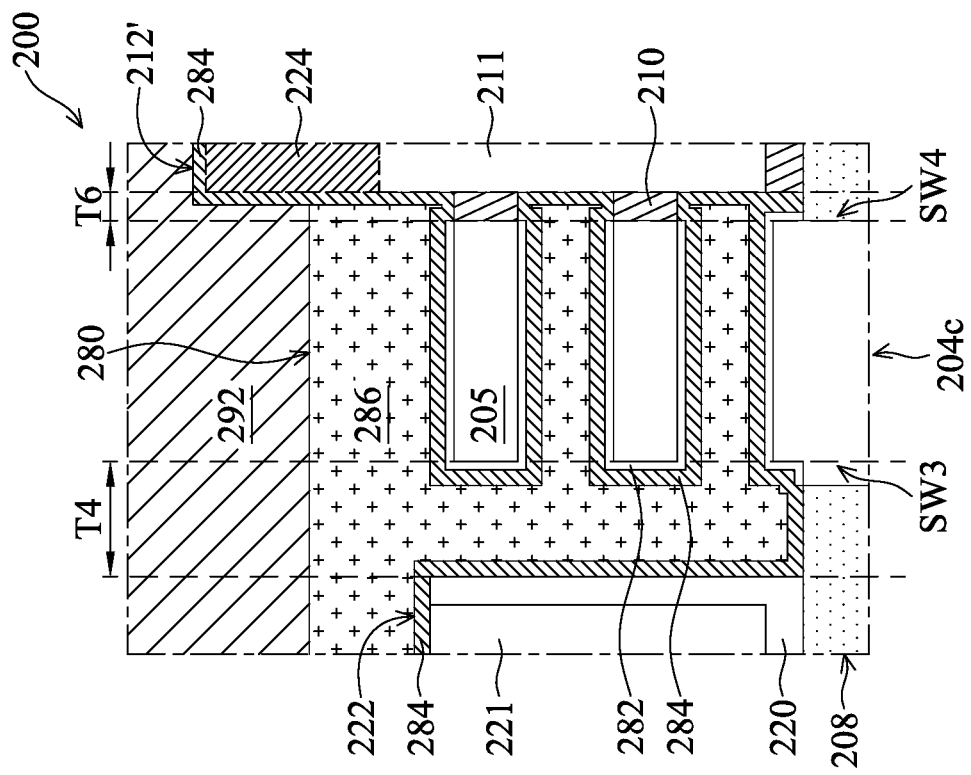

Furthermore, referring to FIG. 28B, portions of the metal gate stack 280 are formed along one of the sidewalls, SW3, of the stack of Si layers 205 in the semiconductor fin 204c but not along the other one of the sidewalls, SW4. In other words, the sidewall SW3 is separated from the dielectric fin 222 by the metal gate stack 280, while the sidewall SW4 is physically connected with the dielectric fin 212' (or portions of the dielectric layer 210). Stated differently and referring to FIGS. 27B, 28A, and 28B collectively, the metal gate stack 280 is formed along both sidewalls of the dielectric fin 222. In the present embodiments, the separation distance between the stack of Si layers 205 and the dielectric layer 211 is defined by a thickness T6 of the dielectric layer 210, which may be about 1 nm to about 5 nm as discussed in detail above. While the present disclosure does not limit a ratio of the thickness T6 to the thickness T3 to any specific value, the present embodiments provides that the thickness T3 is greater than the thickness T6. As discussed above, the portions of the dielectric layer 210 laterally extend the Si layers 205 to allow better control of the metal gate stack 280 over the channel layers. In some examples, the thickness T6 may be about 1 nm to about 5 nm and the thickness T3 may be about 3 nm to about 7 nm.

Figure 28A:
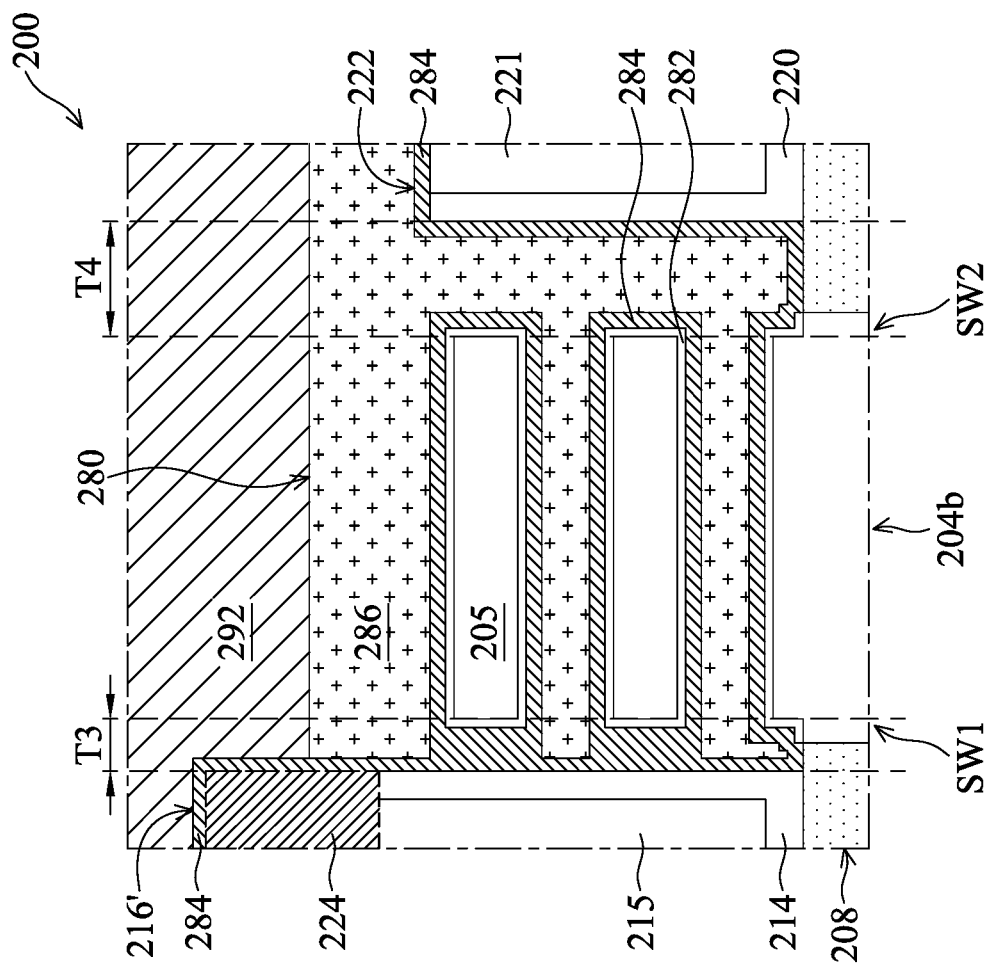
Figure 28C:
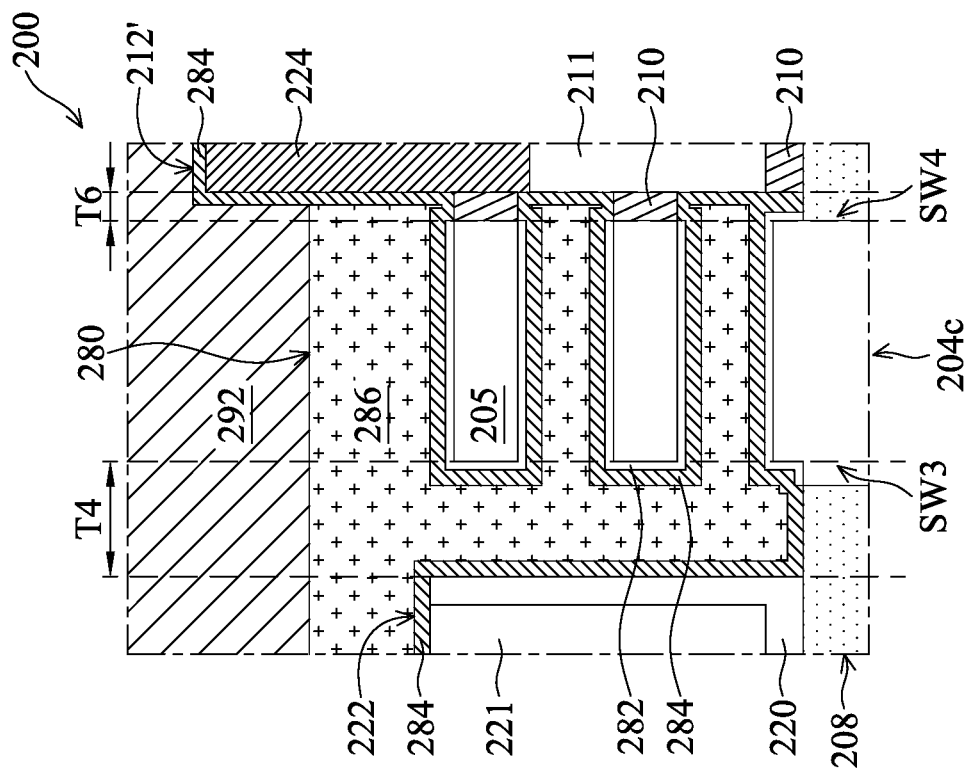
Figure 28D:
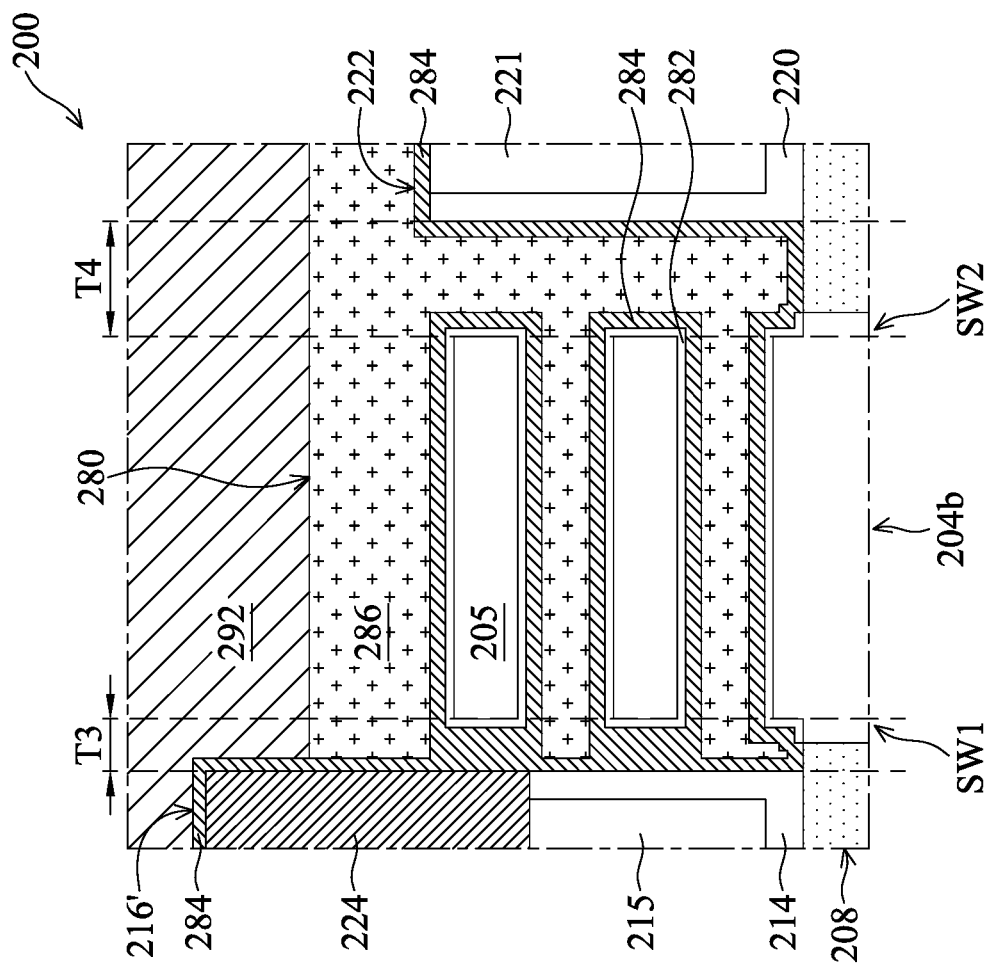
Figure 29C:
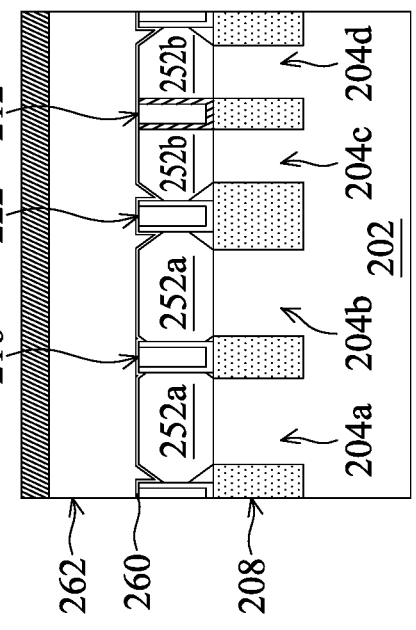
Figure 29A:
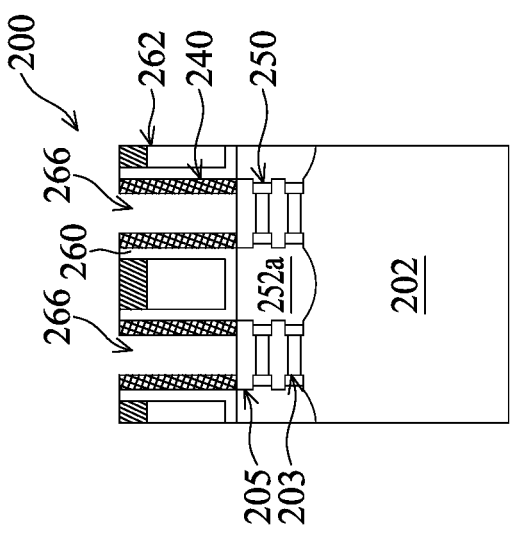
Figure 29B:
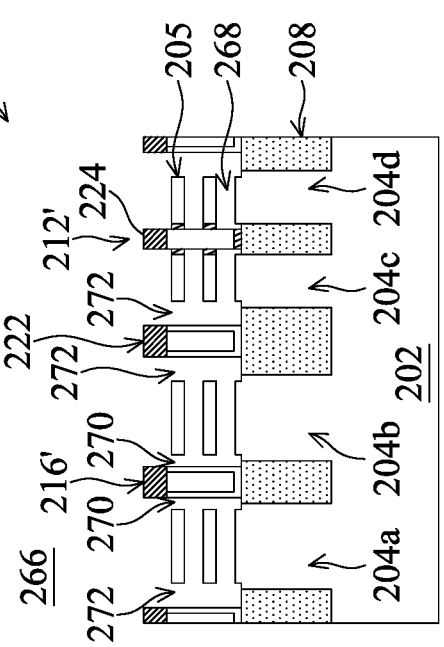

In some embodiments, such as those depicted in FIGS. 28A and 28B, the bottom surface of each dielectric feature 224 is at (i.e., co-planar with) or above the top surface of the topmost Si layer 205 (as depicted by the dashed outline). In some embodiments, referring to FIGS. 28C and 28D, the dielectric feature 224 extends to below the top surface of the topmost Si layer 205, which is consistent with the embodiment depicted in FIG. 13D. It is noted that, except for the configuration of the dielectric features 224, embodiments depicted in FIGS. 28C and 28D are identical to those depicted in FIGS. 28A and 28B, respectively.

Alternative to proceeding along Pathway A, referring to FIG. 1B, method 100 may proceed directly from operation 126 to operation 130 along Pathway B, thereby omitting the patterning of the dielectric features 224 before forming the metal gate stack 280. It is noted those operations of Pathway B having the same reference numerals as operations of Pathway A will only be discussed briefly below.

Referring FIGS. 1B and 29A-29C, method 100 at operation 130 removes the dummy gate stack 230 to form the gate trench 266. In the depicted embodiments, the dielectric features 224 are not patterned before removing the dummy gate stack 230. In other words, the gate trench 266 exposes all of the dielectric features 224 in the device 200. Still referring to FIGS. 1B and 29A-29C, method 100 at operation 132 then removes the SiGe layers 203, the SiGe cladding layers 213, and the SiGe cladding layers 218 in the sheet formation process to form the openings 268, the openings 270, and the openings 272, respectively, as discussed in detail above.

Figure 30A:
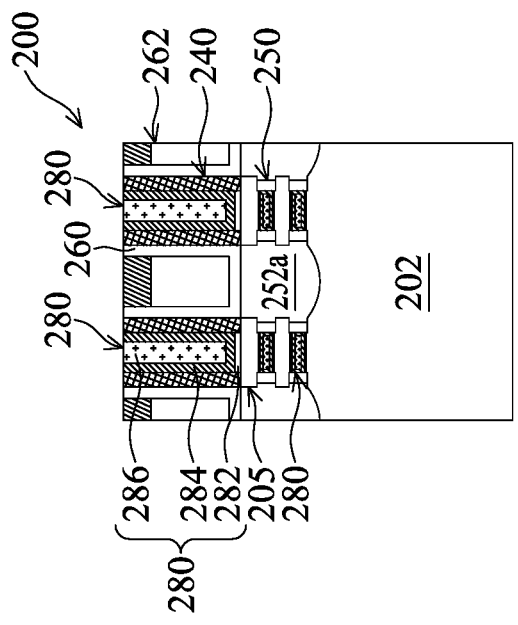
Figure 30C:
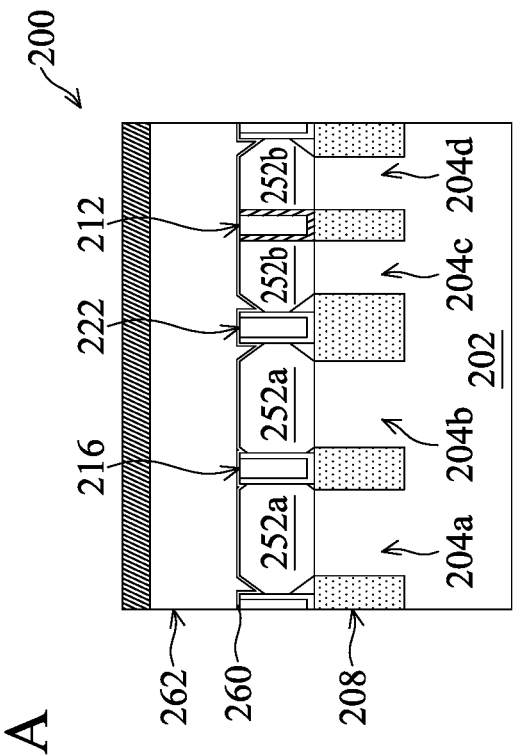
Figure 30B:
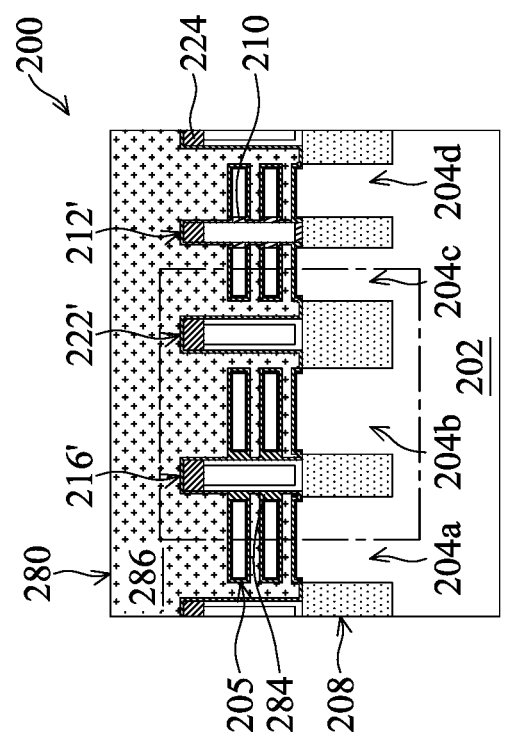
Figure 30D:
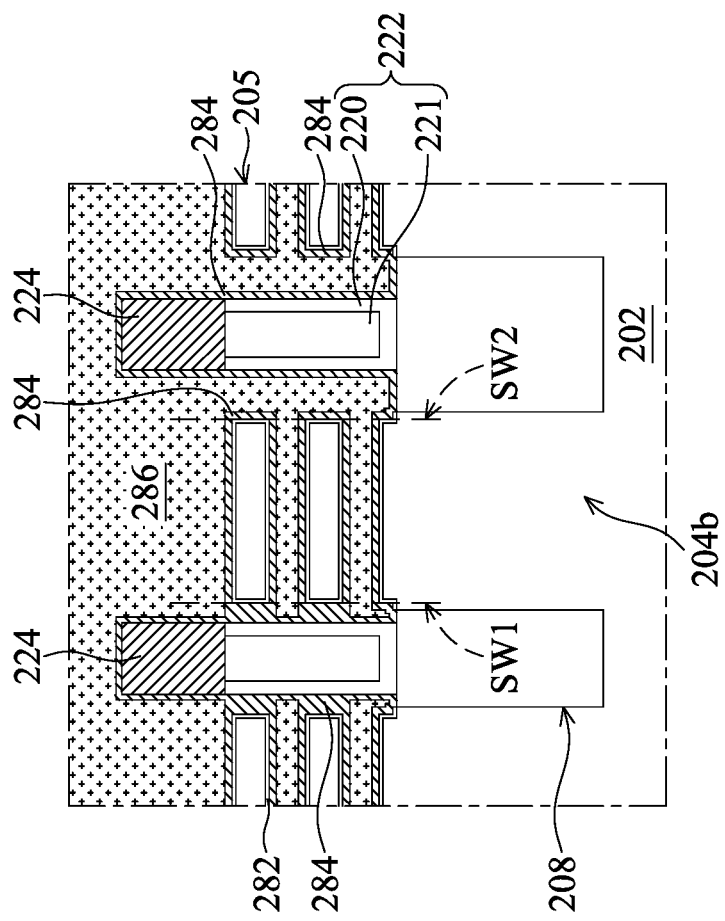

Subsequently, referring to FIGS. 1C and 30A-30D, where FIG. 30D provides an enlarged view of a portion of the device 200 enclosed in the dashed outline of FIG. 30B, method 100 at operation 134 forms the metal gate stack 280 to fill the gate trench 266 and the openings 268, 270, and 272. Composition and structure of the metal gate stack 280 have been discussed in detail above. Referring to FIG. 30B and to FIG. 30D, without first patterning the dielectric features 224, one of the dielectric features 224 remains over the dielectric fin 222, which is distinct from the embodiments depicted in FIGS. 24A-24D.

Figure 26A:
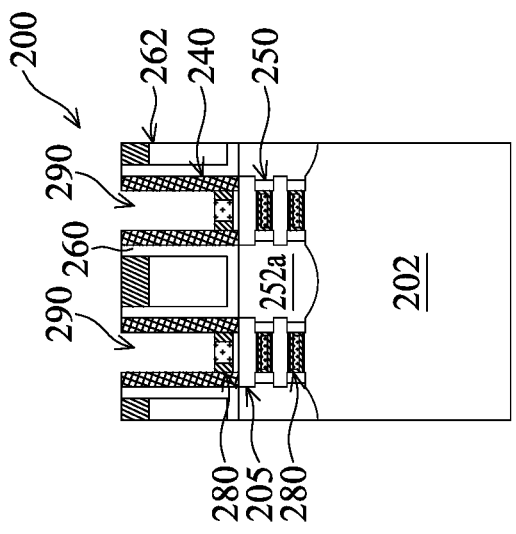
Figure 26C:
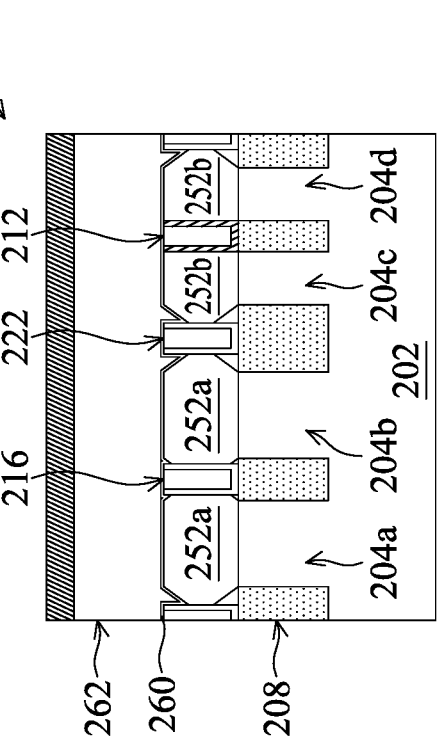
Figure 26B:
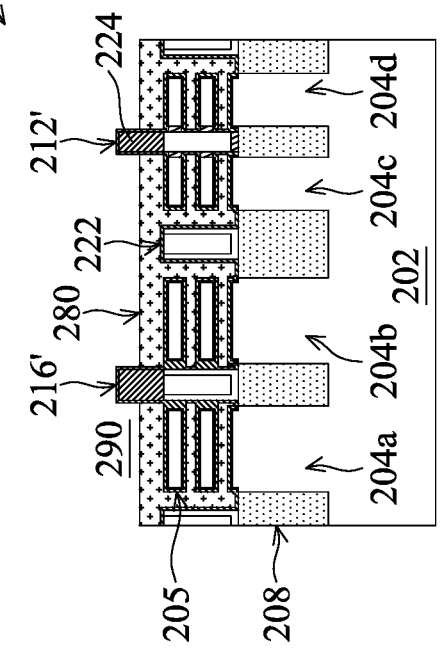

Referring to FIGS. 1C and 31A-31C, method 100 at operation 150 removes a top portion of the metal gate stack 280 to form the trench 290 and removes at least top portions of the dielectric features 224 exposed in the trench 290. In some embodiments, the top portions of the metal gate stack 280 and the dielectric features 224 are removed in a single etching process, such as a wet etching process. In some embodiments, a first etching process similar to that discussed in detail above with respect to FIGS. 26A-26C is performed to selectively remove the top portion of the metal gate stack 280 with respect to the dielectric features 224, then a second etching process is performed to selectively remove the exposed dielectric features 224 with respect to the metal gate stack 280, where the first and the second etching processes implement different etchants. In some embodiments, etching the metal gate stack 280 is controlled by adjusting the duration of the etching process to ensure that a portion of the metal gate stack 280 remains over the topmost Si layer 205.

Figure 31A:
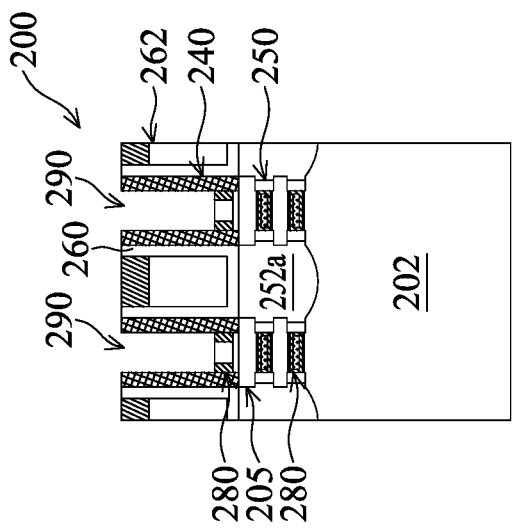
Figure 31C:
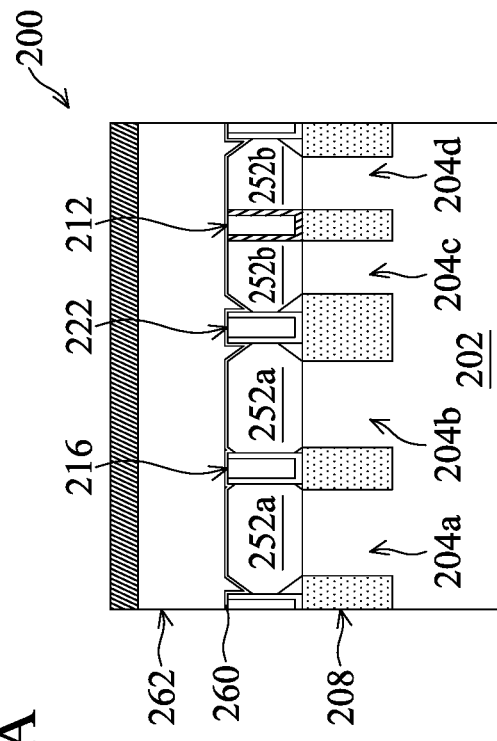
Figure 31B:
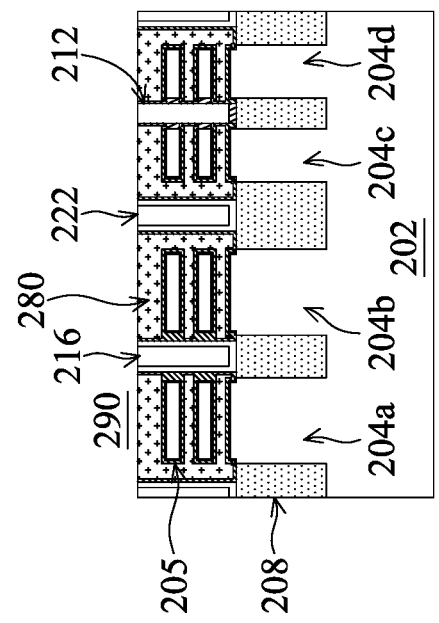

In some embodiments, referring to FIG. 31B, the dielectric feature 224 is completely removed from the device 200, such that the top surfaces of the dielectric fins 212, 216, and 222 are substantially co-planar with the recessed metal gate stack 280. In other words, the dielectric fins 212, 216, and 222 separate the recessed metal gate stack 280 into multiple portions. This is in contrast to the embodiments depicted in FIGS. 26A-26C, where the remaining dielectric features 224 protrude from the top surface of the recessed metal gate stack 280, thereby separating the metal gate stack 280 into multiple portions.

Figure 31D:
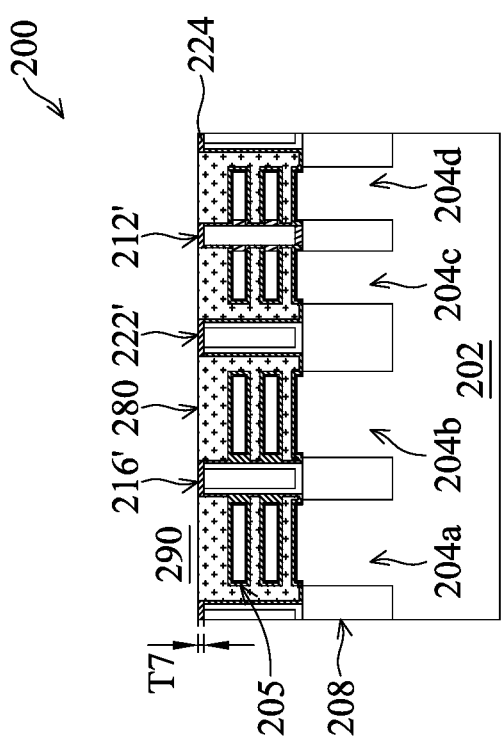

In some embodiments, referring to FIG. 31D, method 100 partially removes the dielectric feature 224 exposed in the trench 290, leaving behind portions of the dielectric feature 224 defined by a thickness T7 over each of the dielectric fins 212, 216, and 222. In some examples, it may be desirable to minimize the thickness T7 to ensure that the parasitic capacitance attributing to the remaining dielectric feature 224 remains low. In the present embodiments, the top surfaces of the remaining portions of the dielectric feature 224 are substantially co-planar with the recessed metal gate stack 280, which is distinct from the embodiments depicted in FIGS. 26A-26C. In some examples, the remaining portions of the metal gate stack 280 over the topmost Si layer 205 may be about 4 nm to about 14 nm in height for reasons discussed in detail above.

Figure 32A:
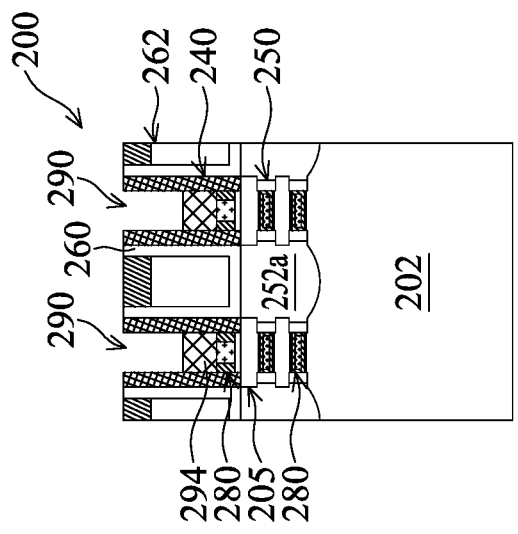
Figure 32C:
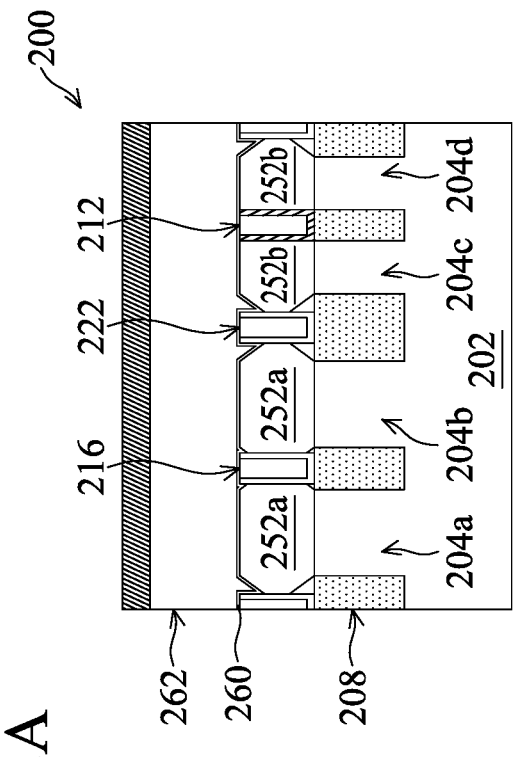
Figure 32B:
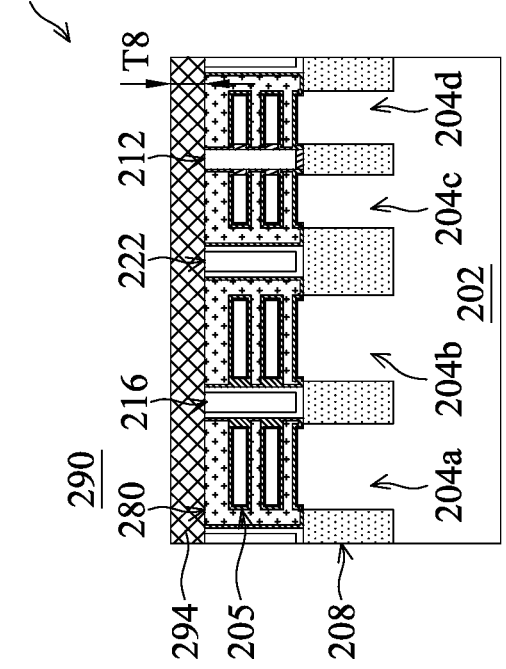
Figure 33A:
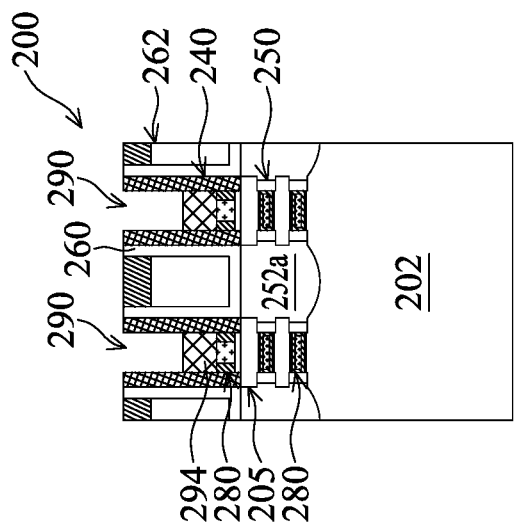
Figure 33C:
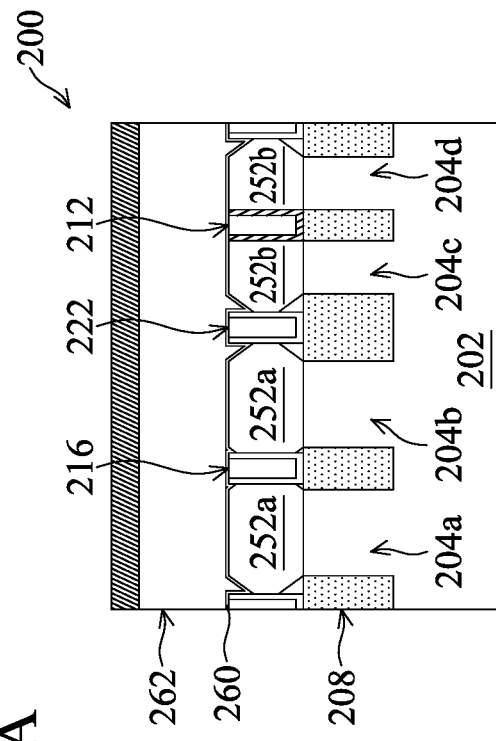
Figure 33B:
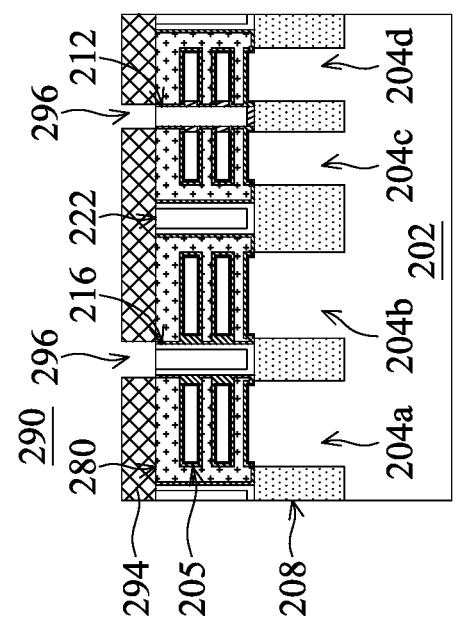
Figure 34C:
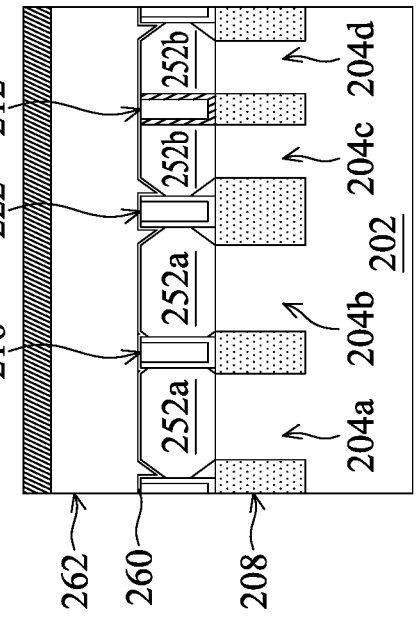
Figure 34A:
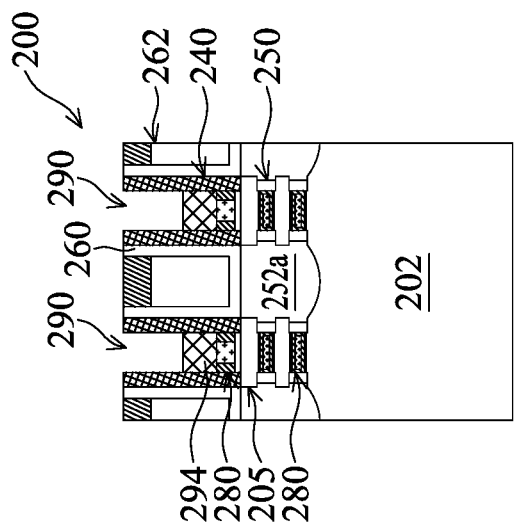
Figure 34B:
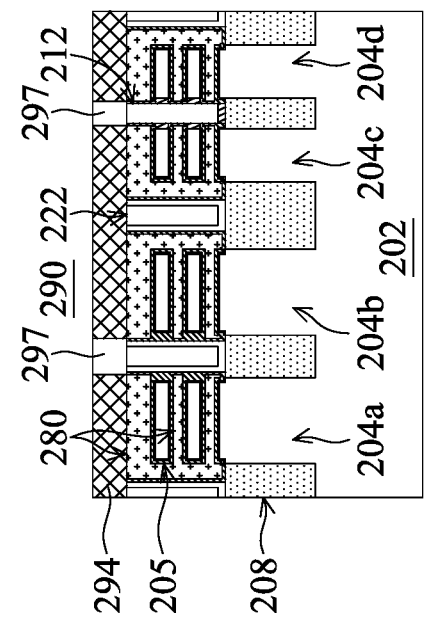
Figure 35C:
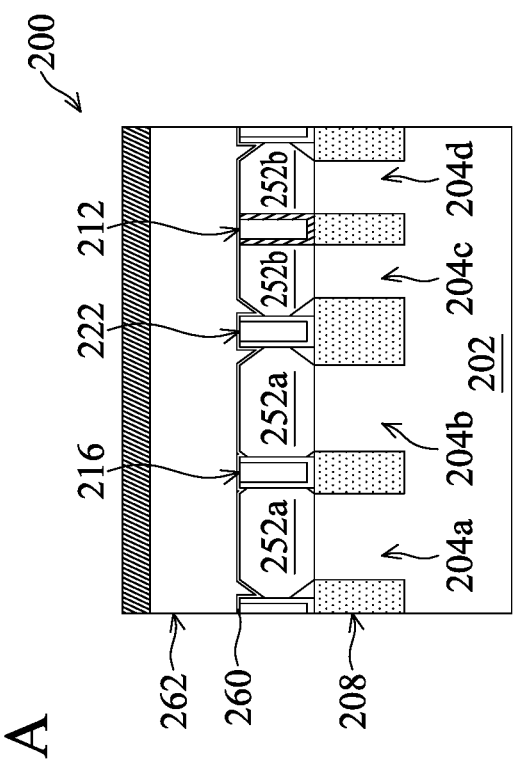
Figure 35A:
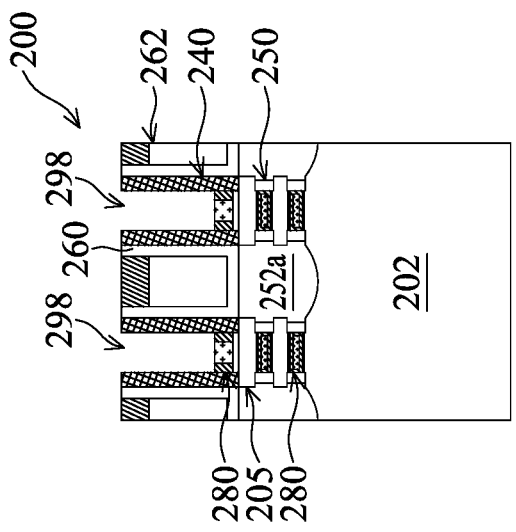
Figure 35B:
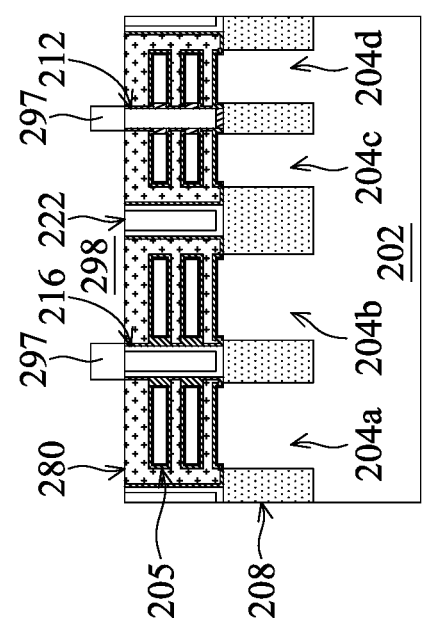
Figure 36A:
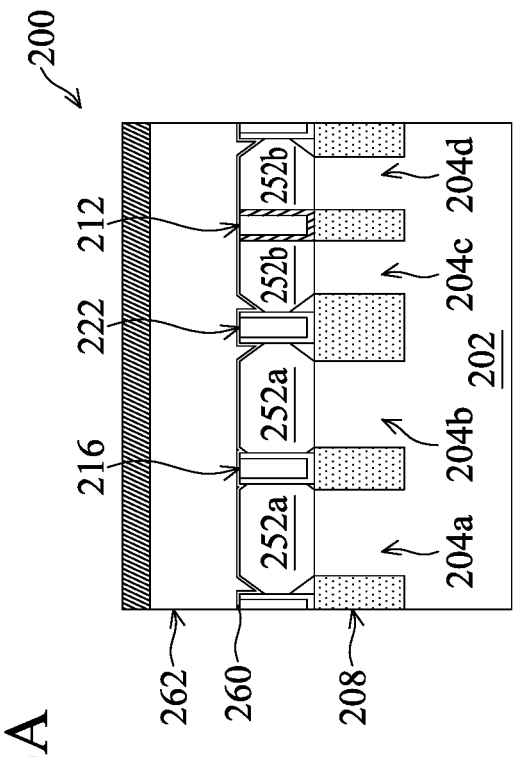
Figure 36B:
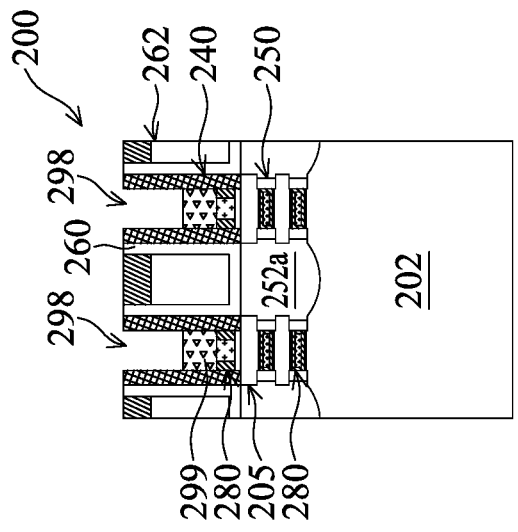
Figure 36C:
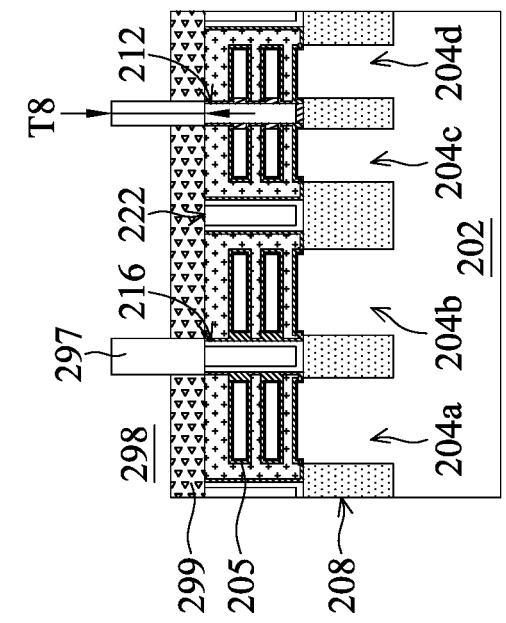

Now referring to FIGS. 1C and 32A-33C, method 100 at operation 152 forms and patterns a sacrificial layer 294 over the recessed metal gate stack 280 in the trench 290. Referring to FIGS. 32A-32C, method 100 deposits the sacrificial layer 294 in the trench 290, where the sacrificial layer 294 includes a material different from that of the metal gate stack 280, such that it exhibits substantial etching selectivity with respect to the metal gate stack 280. The sacrificial layer 294 may include any suitable material, such as amorphous silicon, and may be formed by any suitable method, such as CVD, ALD, PVD, plating, other suitable methods, or combinations thereof. In some embodiments, as depicted herein, the sacrificial layer 294 is deposited to partially fill the trench 290. In some embodiments, a thickness T8 of the sacrificial layer 294 is determined based on a height of one or more gate isolation features subsequently formed in the sacrificial layer 294 and over one or more of the dielectric fins 212, 216, and 222.

Referring to FIGS. 1C and 33A-33C, method 100 patterns the sacrificial layer 294 to form openings 296 that correspond to locations where the gate isolation features are to be formed. Patterning the sacrificial layer 294 may be implemented in a process similar to that discussed above with respect to patterning the dielectric features 224. For example, patterning the sacrificial layer 294 may include forming a patterned masking element (not depicted) including openings over the sacrificial layer 294, etching the sacrificial layer 294 using the patterned masking element as an etch mask, and subsequently removing the patterned masking element from the device 200 by resist stripping and/or plasma ashing.

Referring to FIGS. 1C and 34A-34C, method 100 at operation 154 forms dielectric features 297 in the openings 296. In some embodiments, the dielectric features 297 may include silicon nitride, silicon carbide, silicon oxynitride, silicon oxycarbide, silicon carbonitride, silicon oxycarbonitride, silicon oxide, other suitable materials, or combinations thereof. In some embodiments, the dielectric feature 297 includes a high-k dielectric material, such as hafnium oxide (HfO$_2$), zirconium oxide (ZrO$_2$), hafnium aluminum oxide (HfAlOx), hafnium silicon oxide (HfSiOx), aluminum oxide (Al$_2$O$_3$), other suitable high-k dielectric materials, or combinations thereof. In some embodiments, the dielectric feature 297 has the same composition as the dielectric features 224. In some embodiments, the dielectric features 297 have the same composition as the dielectric layer 292. In further embodiments, the dielectric features 297 and the sacrificial layer 294 exhibit sufficient etching selectivity, such that the sacrificial layer 294 can be selectively removed without removing, or substantially removing, the dielectric features 297.

Forming the dielectric features 297 may include first depositing a dielectric material over the patterned sacrificial layer 294, thereby filling the openings 296, and then performing one or more CMP process to remove portions of the dielectric material formed over the sacrificial layer 294, resulting in the dielectric features 297. Accordingly, a top surface of the dielectric feature 297 is substantially co-planar with a top surface of the sacrificial layer 294. In the present embodiments, sidewalls of the dielectric feature 297 are defined by the sacrificial layer 294. As will be discussed below, after replacing the sacrificial layer 294 with a conductive layer (e.g., conductive layer 299) to connect portions of the metal gate stack 280, the dielectric features 297 are configured to separate such conductive layer and thus may be alternatively referred to as gate isolation features 297.

Referring to FIGS. 1C and 35A-35C, method 100 at operation 156 subsequently removes the sacrificial layer 294 in a selective etching process, such that the dielectric features 297 and the top surface of the metal gate stack 280 are exposed in a trench 298. In some embodiments, the selective etching process includes a dry etching process, a wet etching process, or a combination thereof that removes the sacrificial layer 294 without removing, or substantially removing, the dielectric features 297.

Referring to FIGS. 1C and 36A-36C, method 100 at operation 158 then forms a conductive layer 299 in the trench 298 to directly contact the top surface of the metal gate stack 280 as well as any exposed dielectric fin (e.g., the dielectric fin 222). In the present embodiments, the forming the conductive layer 299 results in the dielectric features 297, defined by a height consistent with the thickness T8 of the sacrificial layer 294, to protrude from a top surface of the conductive layer 299. In other words, forming the conductive layer 299 does not completely fill the trench 298. As discussed above, recessing the metal gate stack 280 at operation 150 results in the metal gate stack 280 to be cut (or separated) into multiple portions by the dielectric fins 212 (or 212'), 216 (216'), and 222 (or 222'). In many instances, however, portions of the metal gate stack 280 are desired to be longer (along the Y direction) than others. In other words, the metal gate stack 280 does not need to be cut wherever a dielectric fin is present. In this regard, by forming the conductive layer 299 between the dielectric features 297, portions of the metal gate stack 280 not needing to be cut are connected. In other words, the conductive layer 299 functions to horizontally connect and vertically extend portions of the metal gate stack 280 between the dielectric features 297.

In some embodiments, the conductive layer 299 includes a metal capable of being deposited in a bottom-up manner, i.e., the metal preferentially grows on itself rather than from surrounding surfaces having a different composition, such as dielectric sidewalls. In some embodiments, the conductive layer 299 includes W. In some embodiments, the conductive layer 299 has the same composition as that of the conductive fill layer of the metal gate electrode 286. Of course, the present embodiments are not limited to any specific choice of material and other metals exhibiting the bottom-up growth behavior may also be utilized for forming the conductive layer 299.

Now referring to FIGS. 1C and 37A-37C, method 100 at operation 160 forms the dielectric layer 292 over the conductive layer 299. Composition of and method of forming the dielectric layer 292 has been discussed in detail above. In some embodiments, the dielectric layer 292 has the same composition as the dielectric features 297. In the present embodiments, forming the dielectric layer 292 fills the trench 298. In other words, a top surface of the dielectric layer 292 is substantially co-planar with the top surfaces of the dielectric features 297. Accordingly, the dielectric features 297 vertically extend the dielectric fins 216 and 212 to separate the metal gate stack 280 and the conductive layer 299 into multiple portions.

Thereafter, still referring to FIG. 1C, method 100 at operation 170 may form additional components over the device 200 as discussed above, such as forming S/D contacts, dielectric layers (e.g., ESLs and ILDs), vertical interconnect features, horizontal interconnect features, other suitable interconnect features, or combinations thereof.

Figure 37A:
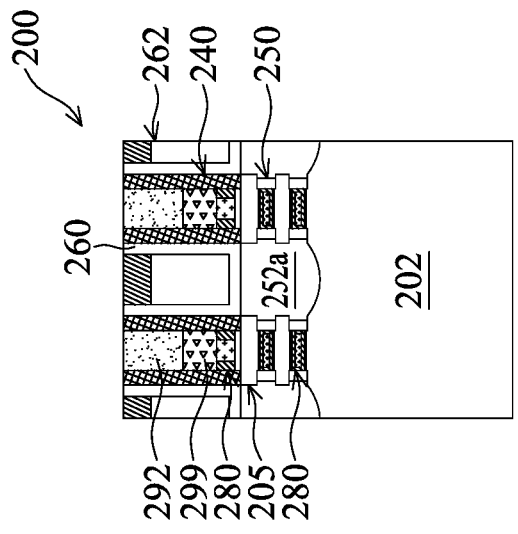
Figure 37C:
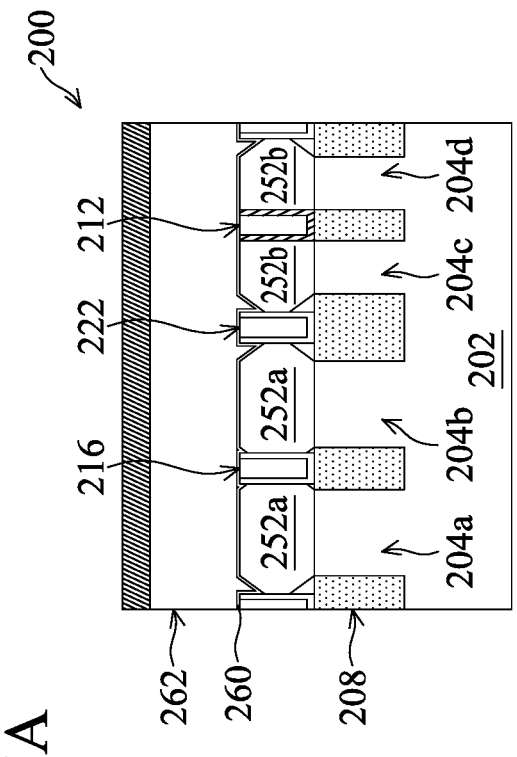
Figure 37B:
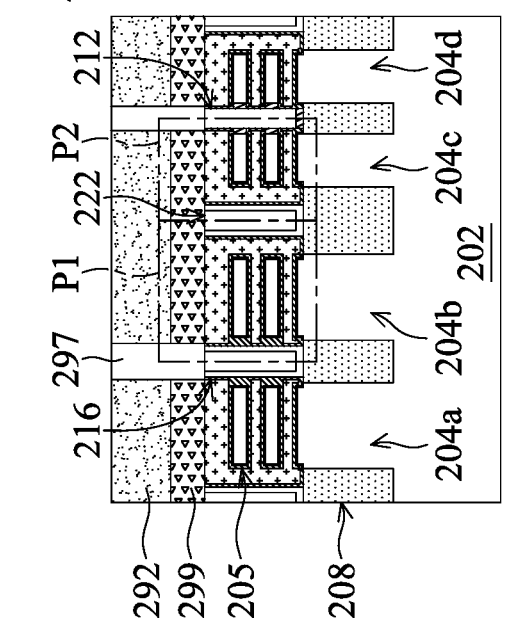
Figure 38B:
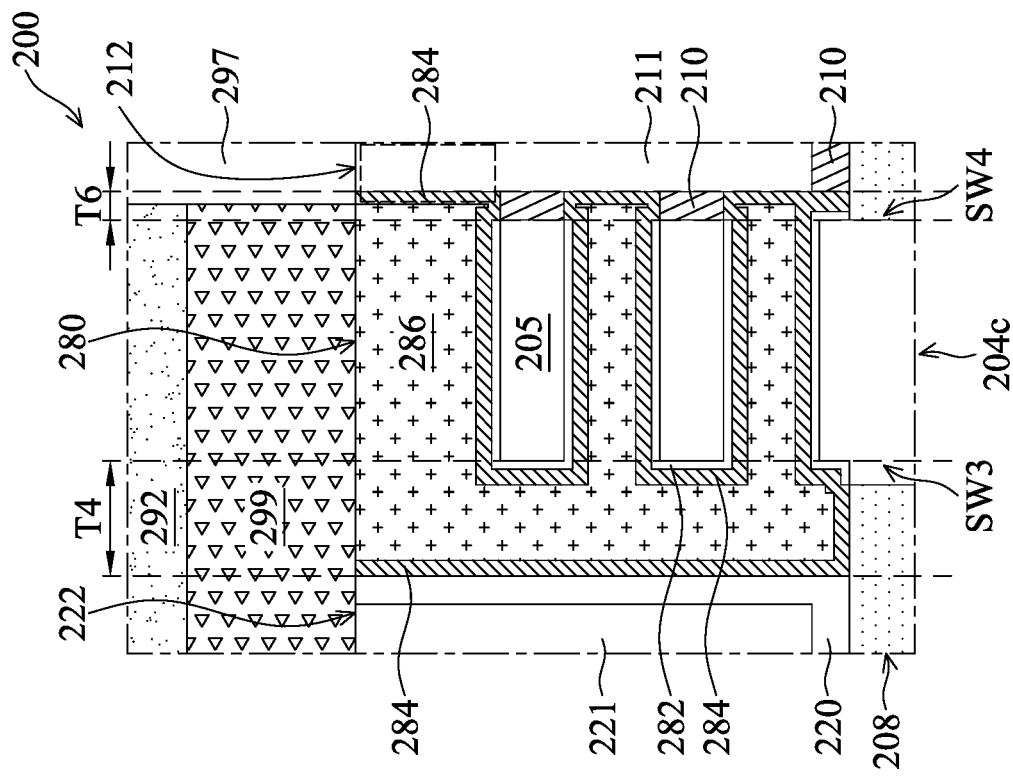
Figure 38A:
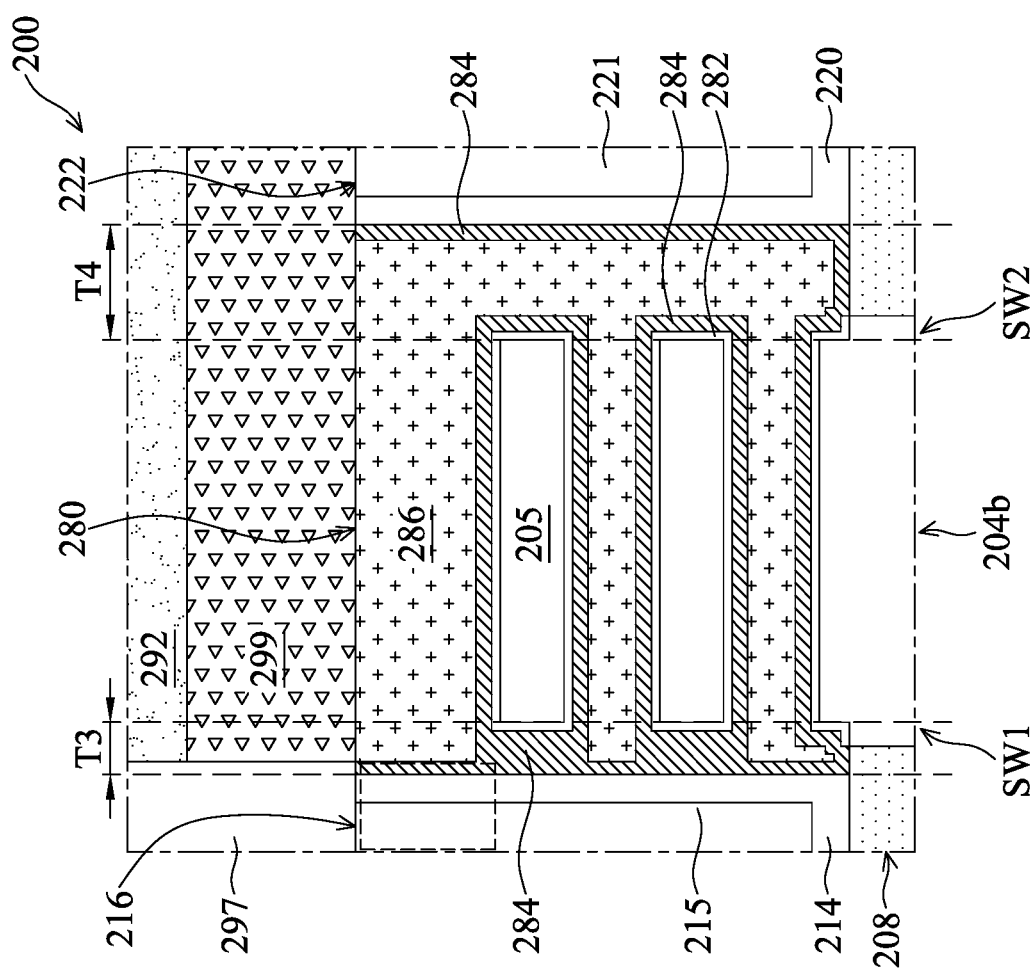
Figure 38D:
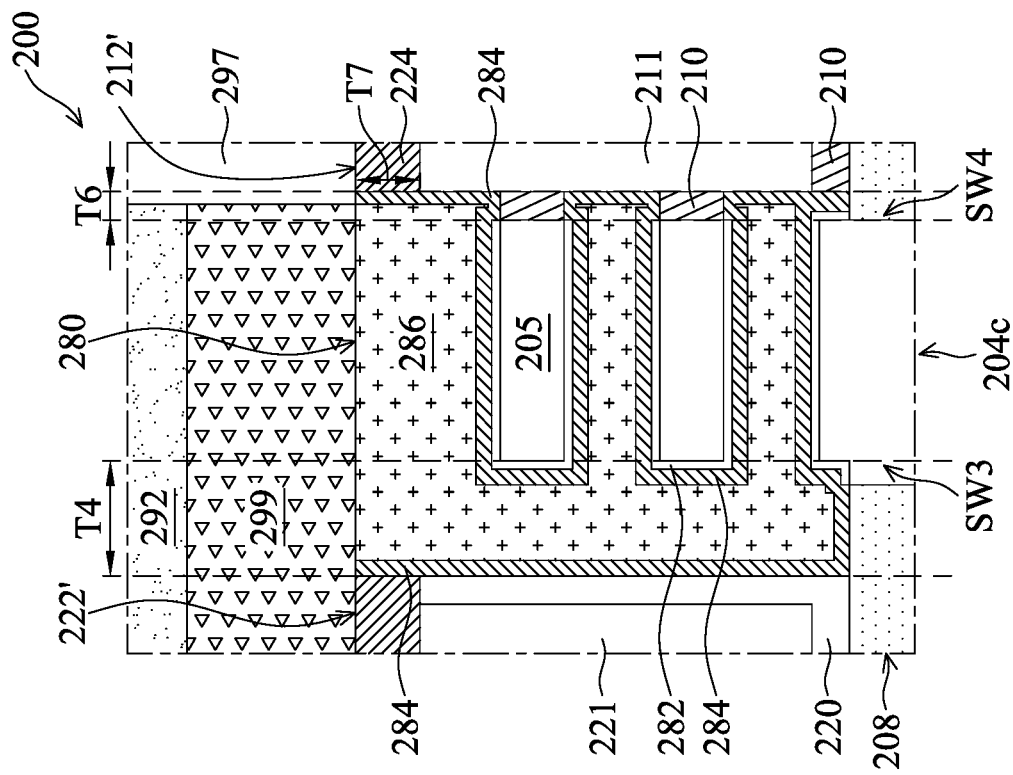
Figure 38C:
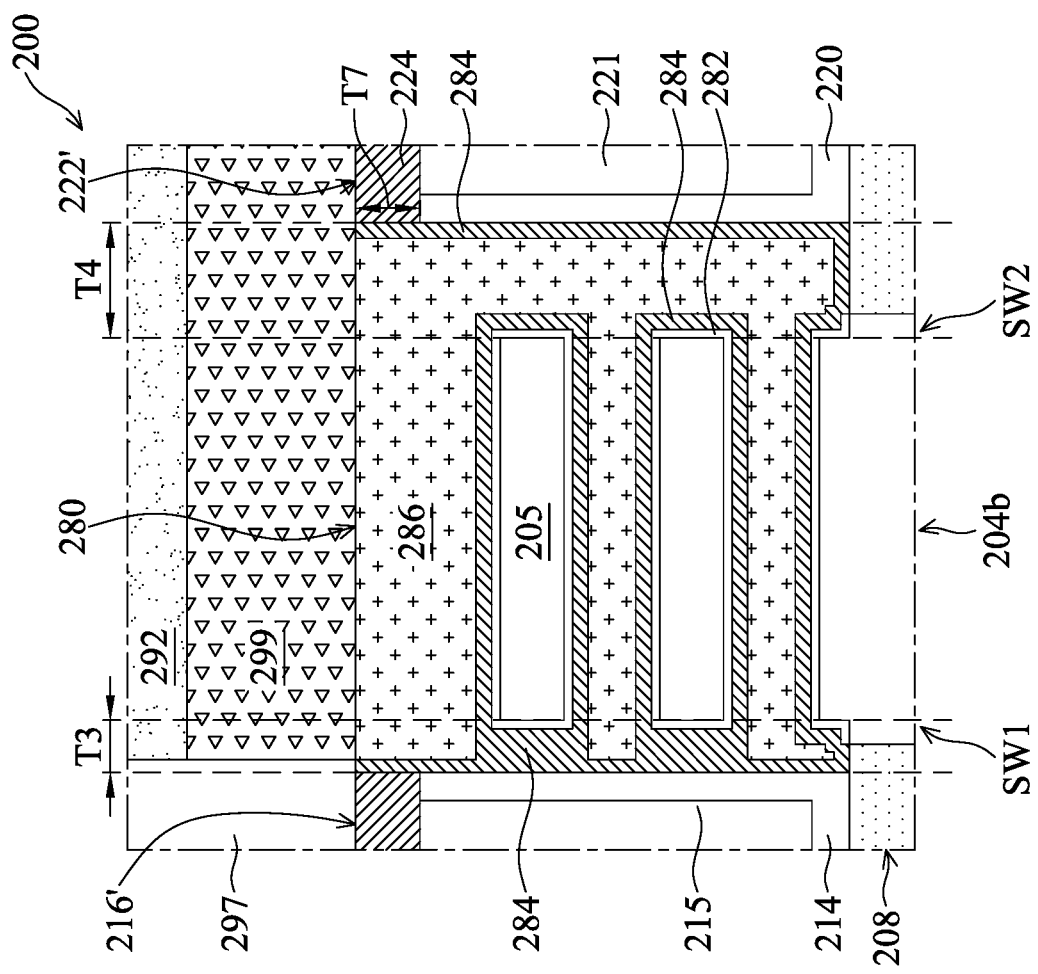

FIGS. 38A-38F depict various aspects of the present embodiments as shown in FIG. 37B in greater detail. Specifically, FIGS. 38A, 38C, and 38E each depict a portion P1 indicated in FIG. 37B, and FIGS. 38B, 38D, and 38F each depict a portion P2 indicated in FIG. 37B. Embodiments depicted in FIGS. 38A and 38B are similar to those depicted in FIGS. 28A and 28B, respectively, with the exception of the presence of the dielectric features 297 and the conductive layer 299. In the present embodiments, the conductive layer 299 directly contacts portions of the metal gate stack 280 disposed between the dielectric features 297, thereby re-connecting those portions of the metal gate stack 280 separated by the dielectric fin 222. In this regard, the conductive layer 299 also directly contacts the top surface of the dielectric fin 222. The dielectric features 297 vertically extend the dielectric fins 212 and 216, such that the extended dielectric fins separate the metal gate stack 280 and the conductive layer 299 into multiple portions.

In some embodiments, referring to FIGS. 38A and 38B and as indicated by the dashed outline, the bottom surface of the dielectric features 297 is at (i.e., co-planar with) or above the top surface of the topmost Si layer 205. In some embodiments, referring to FIGS. 38C and 38D and consistent with the embodiment depicted in FIG. 31D, the dielectric features 297 are formed over remaining portions of the dielectric features 224 defined by the thickness T7, where the bottom surface of the dielectric features 224 is at or above the top surface of the topmost Si layer 205. In some examples, the bottom surface of the remaining portions of the dielectric features 224 may extend to below the top surface of the topmost Si layer 205, as depicted in FIGS. 38E and 38F.

Although not intended to be limiting, one or more embodiments of the present disclosure provide many benefits to a semiconductor device and the formation thereof. For example, the present disclosure provides a method of forming a semiconductor structure including stacks of channel layers (e.g., Si layers) separated by different spacings and metal gate stacks engaged with the stacks of channel layers and separated (or truncated) by isolation features. In the present embodiments, the semiconductor structure includes dielectric fins disposed between adjacent stacks of channel layers. In some embodiments, the semiconductor structure includes one or more isolation features over the dielectric fins that protrude from top surfaces of adjacent metal gate stacks, thereby separating (or isolating) them from each other. In the present embodiments, structures, and methods of forming the same, are provided to allow adjustment in the spacing between a stack of channel layers and a neighboring dielectric fin by incorporating sacrificial cladding layers of different widths. Such tailored spacings may help improve the result of the sheet formation process, especially for those channel layers with relatively larger widths. Furthermore, different spacings between the stacks of channel layers and dielectric fins result in differences in formation of metal gate stacks along the sidewalls of the stacks, which may offer various advantages to the overall performance of the device. Embodiments of the disclosed methods can be readily integrated into existing processes and technologies for manufacturing GAA FETs.

In one aspect, the present disclosure provides a method that includes forming a semiconductor stack over a substrate, the stack having two types of semiconductor layers stacked alternately, patterning the semiconductor stack to form a first fin, a second fin, and a third fin, forming first cladding layers on a first sidewall of the first fin and a first sidewall of the second fin, forming a first isolation structure between the first cladding layers, forming second cladding layers on a second sidewall of the second fin and a first sidewall of the third fin, the second cladding layers being thicker than the first cladding layers, forming a second isolation structure between the second cladding layers, removing the first cladding layers, the second cladding layers, and one of the two types of semiconductor layers in the semiconductor stack to form first openings, second openings, and third openings, respectively, and subsequently forming a metal gate stack to fill the first, the second, and the third openings.

In another aspect, the present disclosure provides a semiconductor structure that includes a stack of semiconductor layers disposed over a semiconductor substrate, a first dielectric fin disposed adjacent to a first sidewall of the stack of semiconductor layers, the first dielectric fin and the first sidewall being separated by a first distance, a second dielectric fin disposed adjacent to a second sidewall of the stack of semiconductor layers, the second dielectric fin and the second sidewall being separated by a second distance that is greater than the first distance, and a metal gate stack disposed over and interleaved with the stack of semiconductor layers.

In yet another aspect, the present disclosure provides a semiconductor structure that includes a stack of semiconductor layers disposed over a substrate, a metal gate structure disposed over and interleaved with the stack of semiconductor layers, the metal gate structure including a gate electrode disposed over a gate dielectric layer, a first isolation structure disposed adjacent to a first sidewall of the stack of semiconductor layers, where the gate dielectric layer fills space between the first isolation structure and the first sidewall of the stack of semiconductor layers, and a second isolation structure disposed adjacent to a second sidewall of the stack of semiconductor layers, where the gate electrode fills the space between the second isolation structure and the second sidewall of the stack of semiconductor layers.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    alternately stacking first semiconductor layers and second semiconductors layers to form a semiconductor stack over a substrate;
    patterning the semiconductor stack to form a first fin, a second fin, and a third fin;
    forming first cladding layers on a first sidewall of the first fin and a first sidewall of the second fin;

forming a first isolation structure between the first cladding layers;
forming second cladding layers on a second sidewall of the second fin and a first sidewall of the third fin, wherein each of the second cladding layers has a greater thickness than each of the first cladding layers;
forming a second isolation structure between the second cladding layers;
removing the first cladding layers, the second cladding layers, and the first semiconductor layers to form first openings, second openings, and third openings, respectively, such that the first and the second openings expose sidewalls of the first semiconductor layers; and
forming a metal gate stack to fill the first, the second, and the third openings.

2. The method of claim 1, wherein the first semiconductor layers, the first cladding layers, and the second cladding layers include SiGe.

3. The method of claim 2, wherein an amount of Ge in the second cladding layers is less than that of the first cladding layers.

4. The method of claim 1, wherein forming the first isolation structure includes forming a first dielectric feature over a first dielectric fin, wherein forming the second isolation structure includes forming a second dielectric feature over a second dielectric fin, and wherein the first and the second dielectric features protrude from top surfaces of the first, the second, and the third fins.

5. The method of claim 4, further comprising recessing the metal gate stack, such that at least one of the first and the second dielectric features protrudes from a top surface of the recessed metal gate stack.

6. The method of claim 1, further comprising:
recessing the metal gate stack to expose the first and the second isolation structures in a trench;
forming a sacrificial layer over the recessed metal gate, wherein the sacrificial layer includes an opening that exposes one of the first and the second isolation structures;
forming a dielectric feature in the opening;
selectively removing the sacrificial layer with respect to the dielectric feature, thereby exposing the recessed metal gate stack;
forming a conductive layer over the dielectric feature to contact the recessed metal gate stack, wherein the dielectric feature protrudes from the conductive layer; and
forming a dielectric layer over the conductive layer and the dielectric feature to fill the trench.

7. The method of claim 1, wherein forming the metal gate stack includes forming a gate dielectric layer and a gate electrode over the gate dielectric layer, wherein forming the gate dielectric layer completely fills the first openings, and wherein forming the gate electrode completely fills the second and the third openings.

8. The method of claim 1, wherein patterning the semiconductor stack includes forming a fourth fin adjacent to the third fin, the method further comprising:
forming a third isolation structure between a second sidewall of the third fin and a first sidewall of the fourth fin, such that the third isolation structure is in direct contact with both the third and the fourth fins.

9. A semiconductor structure, comprising:
a stack of semiconductor layers disposed over a semiconductor substrate;
a first dielectric fin disposed adjacent to a first sidewall of the stack of semiconductor layers, the first dielectric fin and the first sidewall being separated by a first distance;
a second dielectric fin disposed adjacent to a second sidewall of the stack of semiconductor layers, the second dielectric fin and the second sidewall being separated by a second distance, wherein the second distance is greater than the first distance; and
a metal gate stack disposed over and interleaved with the stack of semiconductor layers.

10. The semiconductor structure of claim 9, wherein the metal gate stack includes a gate electrode disposed over a gate dielectric layer, wherein the gate dielectric layer is disposed along the first sidewall to completely fills space between the first dielectric fin and the first sidewall, and wherein the gate electrode is disposed along the second sidewall to completely fill the space between the second dielectric fin and the second sidewall.

11. The semiconductor structure of claim 9, wherein the stack of semiconductor layers is a first stack of semiconductor layers, the semiconductor structure further comprising a second stack of semiconductor layers disposed over the semiconductor substrate and a third dielectric fin disposed adjacent to the second stack of semiconductor layers, wherein a sidewall of the second stack of semiconductor layers is in direct contact with the third dielectric fin, such that the sidewall of the second stack of semiconductor layers is free of the metal gate stack.

12. The semiconductor structure of claim 11, wherein the first stack of semiconductor layers is defined by a first width and the second stack of semiconductor layers is defined by a second width, and wherein the second width is less than the first width.

13. The semiconductor structure of claim 11, wherein a composition of the third dielectric fin differs from that of the first and the second dielectric fins.

14. The semiconductor structure of claim 9, further comprising a dielectric feature disposed over the first dielectric fin, the second dielectric fin, or both, wherein the dielectric feature protrudes from a top surface of the metal gate stack.

15. The semiconductor structure of claim 14, wherein a composition of the dielectric feature is different from that of the first and the second dielectric fins.

16. The semiconductor structure of claim 14, further comprising a conductive layer disposed over the metal gate stack and a dielectric layer disposed over the conductive layer, wherein the dielectric feature protrudes from a top surface of the conductive layer.

17. A semiconductor structure, comprising:
a stack of semiconductor layers disposed over a substrate;
a metal gate structure disposed over and interleaved with the stack of semiconductor layers, wherein the metal gate structure includes a gate electrode disposed over a gate dielectric layer;
a first isolation structure disposed adjacent to a first sidewall of the stack of semiconductor layers, wherein the gate dielectric layer fills space between the first isolation structure and the first sidewall of the stack of semiconductor layers; and
a second isolation structure disposed adjacent to a second sidewall of the stack of semiconductor layers, wherein the gate electrode fills the space between the second isolation structure and the second sidewall of the stack of semiconductor layers.

18. The semiconductor structure of claim 17, wherein the first isolation structure extends vertically to separate the metal gate structure into multiple portions.

19. The semiconductor structure of claim 18, wherein a top surface of the metal gate structure defines a top surface of the second isolation structure, the semiconductor structure further comprising a conductive layer disposed over the top surface of the second isolation structure.

20. The semiconductor structure of claim 18, wherein a top surface of the metal gate structure is separated from a top surface of the second isolation structure.

* * * * *